US012243598B2

(12) United States Patent
Inuzuka et al.

(10) Patent No.: US 12,243,598 B2
(45) Date of Patent: Mar. 4, 2025

(54) SEMICONDUCTOR STORAGE DEVICE AND PROGRAM OPERATION METHOD FOR A SELECT GATE LINE OF THE SEMICONDUCTOR STORAGE DEVICE

(71) Applicant: Kioxia Corporation, Tokyo (JP)

(72) Inventors: Yuki Inuzuka, Yokohama Kanagawa (JP); Katsuaki Isobe, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 184 days.

(21) Appl. No.: 18/176,443

(22) Filed: Feb. 28, 2023

(65) Prior Publication Data
US 2024/0029807 A1    Jan. 25, 2024

(30) Foreign Application Priority Data
Jul. 22, 2022   (JP) .................................. 2022-117284

(51) Int. Cl.
*G11C 16/34*   (2006.01)
*G11C 7/06*    (2006.01)
*G11C 16/04*   (2006.01)
*G11C 16/10*   (2006.01)

(52) U.S. Cl.
CPC .......... *G11C 16/3459* (2013.01); *G11C 7/067* (2013.01); *G11C 16/0433* (2013.01); *G11C 16/102* (2013.01)

(58) Field of Classification Search
CPC . G11C 16/3459; G11C 7/067; G11C 16/0433; G11C 16/102

USPC ..................................................... 365/185.22
See application file for complete search history.

(56) References Cited

U.S. PATENT DOCUMENTS

| 2001/0005015 | A1* | 6/2001 | Futatsuyama | G11C 16/08 365/185.17 |
| 2011/0249503 | A1 | 10/2011 | Yamada et al. | |
| 2013/0336056 | A1 | 12/2013 | Maeda | |
| 2014/0233320 | A1* | 8/2014 | Sakaguchi | G11C 16/10 365/185.21 |
| 2016/0247573 | A1* | 8/2016 | Maejima | G11C 16/32 |

FOREIGN PATENT DOCUMENTS

JP    2014-002810 A    1/2014

* cited by examiner

*Primary Examiner* — Huan Hoang
*Assistant Examiner* — Daniel J King
(74) *Attorney, Agent, or Firm* — Kim & Stewart LLP

(57) ABSTRACT

A semiconductor storage device includes a bit line, a select gate line, a sense amplifier circuit, a first transistor between the bit line and the sense amplifier circuit, and a second transistor between the bit line and a voltage generation circuit. In a first period of a program operation, the first transistor is turned OFF and the second transistor is turned ON, and a voltage of the first bit line is at a first voltage and a voltage of the select gate line is at a second voltage. In a second period of the program operation, the first transistor is turned ON and the second transistor is turned OFF, and a voltage of the first bit line is at a third voltage less than the first voltage and a voltage of the select gate line is at a fourth voltage greater than the second voltage.

20 Claims, 32 Drawing Sheets

FIG. 17
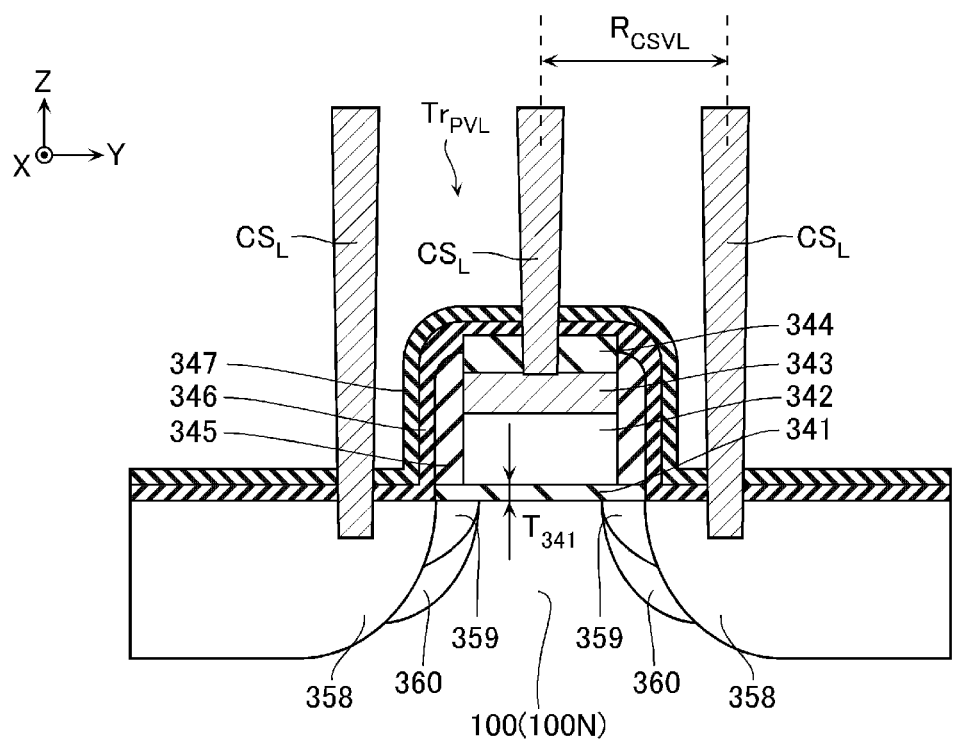
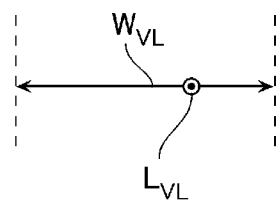

SEMICONDUCTOR STORAGE DEVICE AND PROGRAM OPERATION METHOD FOR A SELECT GATE LINE OF THE SEMICONDUCTOR STORAGE DEVICE

CROSS-REFERENCE TO RELATED APPLICATION

This application is based upon and claims the benefit of priority from Japanese Patent Application No. 2022-117284, filed Jul. 22, 2022, the entire contents of which are incorporated herein by reference.

FIELD

Embodiments described herein relate generally to a semiconductor storage device and a program operation method for a select gate line.

BACKGROUND

A semiconductor storage device having a memory cell array including a plurality of memory cells and a plurality of bit lines connected to the plurality of memory cells, and a plurality of sense amplifier units respectively connected to the plurality of bit lines, is known.

DESCRIPTION OF THE DRAWINGS

FIG. 17 is a schematic cross-sectional view illustrating a configuration of a P-type ultra-low voltage transistor.

DETAILED DESCRIPTION

Figure 1:
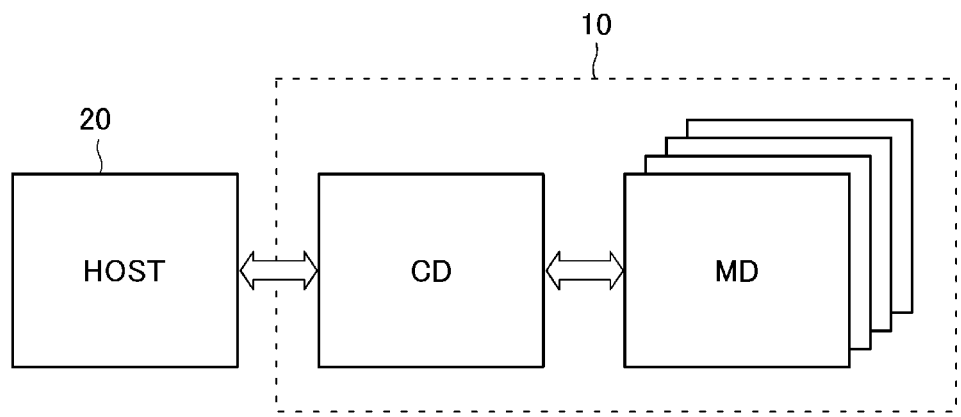
FIG. 1 is a schematic block diagram illustrating a configuration of a memory system.

Embodiments provide a semiconductor storage device that can be highly integrated and a program operation method for a select gate line of the semiconductor storage device.

In general, according to one embodiment, there is provided a semiconductor storage device including a first memory string that includes a first select transistor and a plurality of first memory cell transistors connected in series, a first bit line that is connected to the first memory string, a select gate line that is connected to a gate electrode of the first select transistor, a plurality of word lines that are respectively connected to gate electrodes of the plurality of first memory cell transistors, a first sense amplifier unit that is connected to the first bit line, a control circuit configured to execute a program operation, and a voltage generation circuit configured to generate a voltage. The first sense amplifier unit includes a first sense amplifier circuit, a first transistor having a first end connected to the first bit line and a second end connected to the first sense amplifier circuit, and a second transistor having a first end connected to a node between the first end of the first transistor and the first bit line and a second end connected to the voltage generation circuit. In a first period of the program operation carried out on the select transistors connected to the select gate line, in a state where a voltage for causing the first transistor to be in an OFF state is supplied to a gate electrode of the first transistor and a voltage for causing the second transistor to be in an ON state is supplied to a gate electrode of the second transistor, a voltage of the first bit line is set as a first voltage and a voltage of the select gate line is set as a second voltage. In a second period of the program operation carried out on the select transistors connected to the select gate line, that is after the first period, in a state where a voltage for causing the first transistor to be in an ON state is supplied to the gate electrode of the first transistor and a voltage for causing the second transistor to be in an OFF state is supplied to the gate electrode of the second transistor, a voltage of the first bit line is set as a third voltage that is less than the first voltage and a voltage of the select gate line is set as a fourth voltage that is greater than the second voltage.

Next, semiconductor storage devices according to embodiments will be described in detail with reference to the drawings. The following embodiments are merely examples, and are not intended to limit the scope of the present disclosure.

In this specification, the term "semiconductor storage device" may mean a memory die (or memory chip), or may mean a memory system including a controller die such as a memory card or an SSD. Further, the term "semiconductor storage device" may also mean a configuration including a host computer, such as a smart phone, a tablet terminal, or a personal computer.

Also, in this specification, when it is described that a first configuration is "electrically connected" to a second configuration, the first configuration may be directly connected to the second configuration, or the first configuration may be connected to the second configuration via a wiring, a semiconductor member, a transistor, or the like. For example, when three transistors are connected in series, a first transistor is "electrically connected" to a third transistor even though a second transistor is in an OFF state.

Also, in this specification, when it is described that a first configuration is "connected between" a second configuration and a third configuration, this may mean that the first configuration, the second configuration, and the third configuration are connected in series, and the second configuration is connected to the third configuration through the first configuration.

Further, in this specification, when it is described that a circuit or the like "conducts" two wirings or the like, for example, this may mean that the circuit or the like includes a transistor or the like, the transistor or the like is provided in a current path between the two wirings, and the transistor or the like goes into an ON state.

First Embodiment

Memory System 10

FIG. 1 is a schematic block diagram illustrating a configuration of a memory system 10.

The memory system 10 reads, writes, and erases user data according to a signal transmitted from a host computer 20. The memory system 10 is, for example, a memory card, an SSD, or another system that can store user data. The memory system 10 includes a plurality of memory dies MD for storing user data and a controller die CD connected to the plurality of memory dies MD and the host computer 20. The controller die CD includes, for example, a processor, a RAM, and the like, and performs processes such as logical address/physical address conversion, bit error detection/correction, garbage collection (compaction), and wear leveling.

Figure 2:
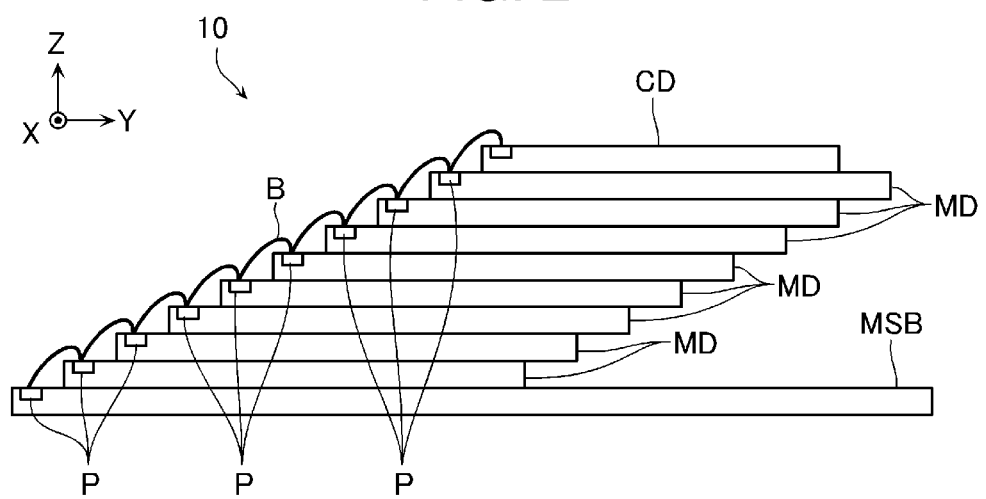
FIG. 2 is a schematic side view illustrating a configuration example of the memory system.
Figure 3:
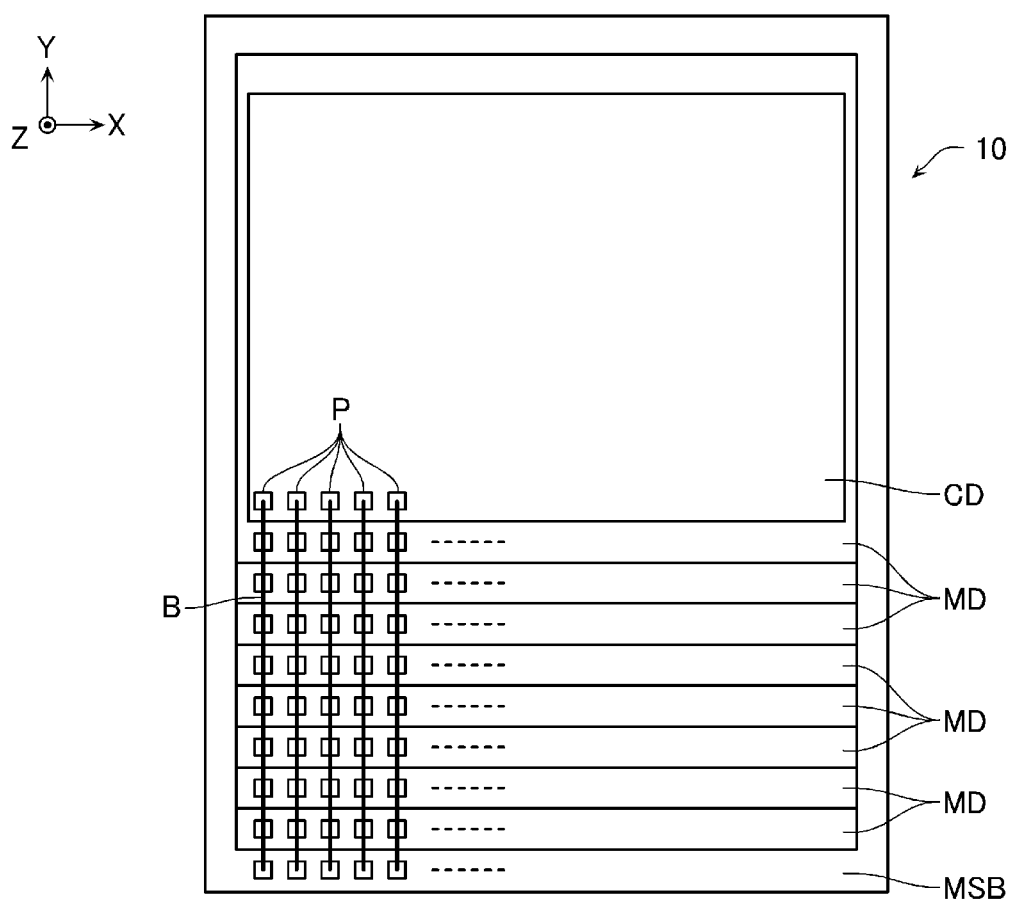
FIG. 3 is a schematic plan view illustrating the configuration example of the memory system.

FIG. 2 is a schematic side view illustrating a configuration example of the memory system 10. FIG. 3 is a schematic plan view illustrating the same configuration example. For convenience of description, a part of the configuration is omitted in FIGS. 2 and 3.

As illustrated in FIG. 2, the memory system 10 according to the present embodiment includes a mounting board MSB, the plurality of memory dies MD stacked on the mounting board MSB, and the controller die CD stacked on the memory dies MD. On an upper surface of the mounting board MSB, pad electrodes P are provided in a region of an end portion in a Y direction, and a partial remaining region is adhered to a lower surface of the memory die MD via an adhesive or the like. On an upper surface of the memory die MD, pad electrodes P are provided in a region of an end portion in the Y direction, and a remaining region is adhered to a lower surface of another memory die MD or the controller die CD via an adhesive or the like. On an upper surface of the controller die CD, Pad electrodes P are provided in a region of an end portion in the Y direction.

As illustrated in FIG. 3, each of the mounting board MSB, the plurality of memory dies MD, and the controller die CD includes a plurality of pad electrodes P located in an X direction. The plurality of pad electrodes P provided on the mounting board MSB, the plurality of memory dies MD, and the controller die CD are connected to each other via bonding wires B.

The configurations illustrated in FIGS. 2 and 3 are merely examples, and specific configurations may be adjusted as appropriate. For example, in the examples illustrated in FIGS. 2 and 3, the controller die CD is stacked on the plurality of memory dies MD, and these structures are connected by the bonding wires B. In such a configuration, the plurality of memory dies MD and the controller die CD are provided in one package. However, the controller die CD may be provided in a separate package from the memory die MD. Also, the plurality of memory dies MD and the controller die CD may be connected to each other not by the bonding wires B but by through vias or the like.

Configuration of Memory Die MD

Figure 4:
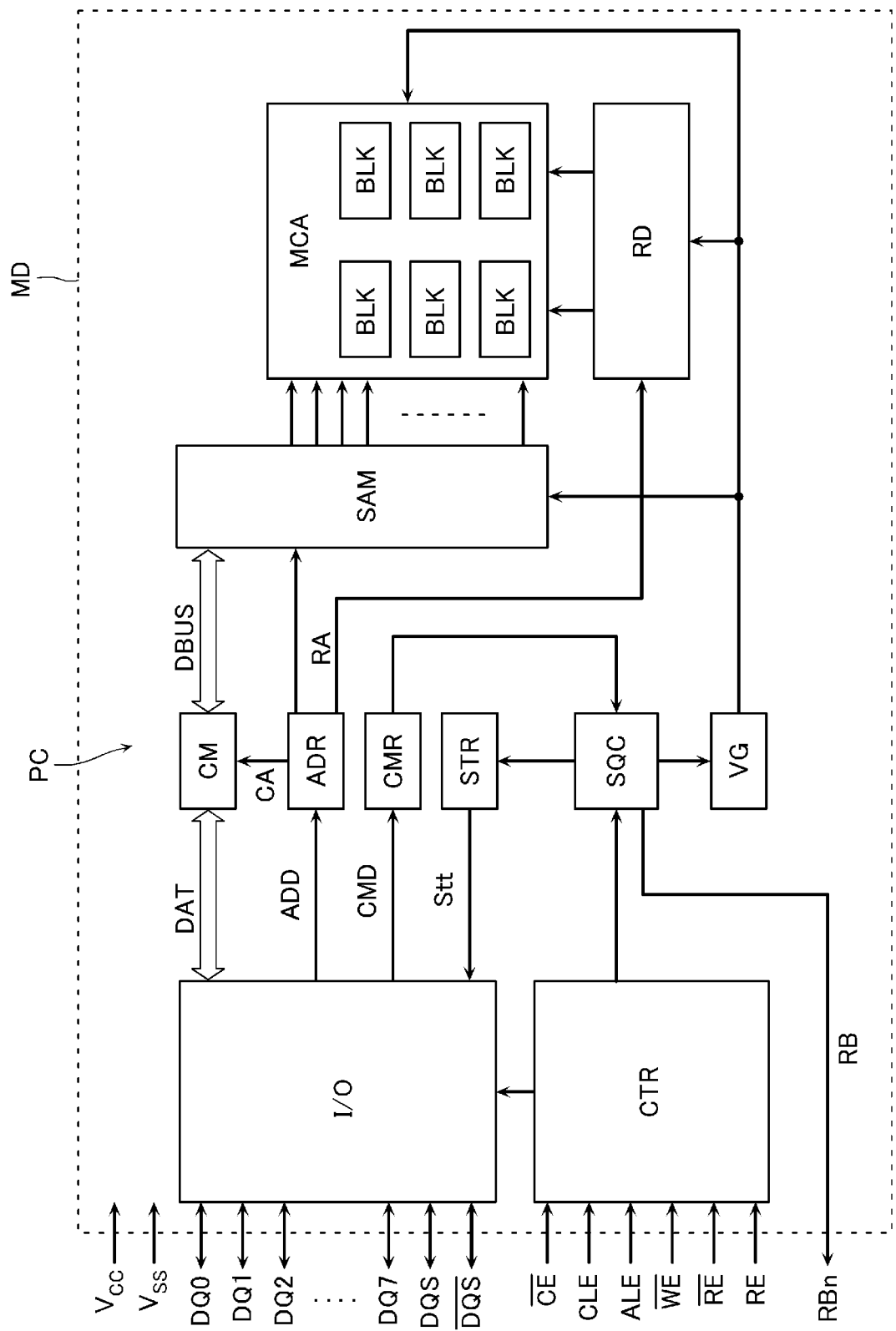
FIG. 4 is a schematic block diagram illustrating a configuration of a memory die.
Figure 5:
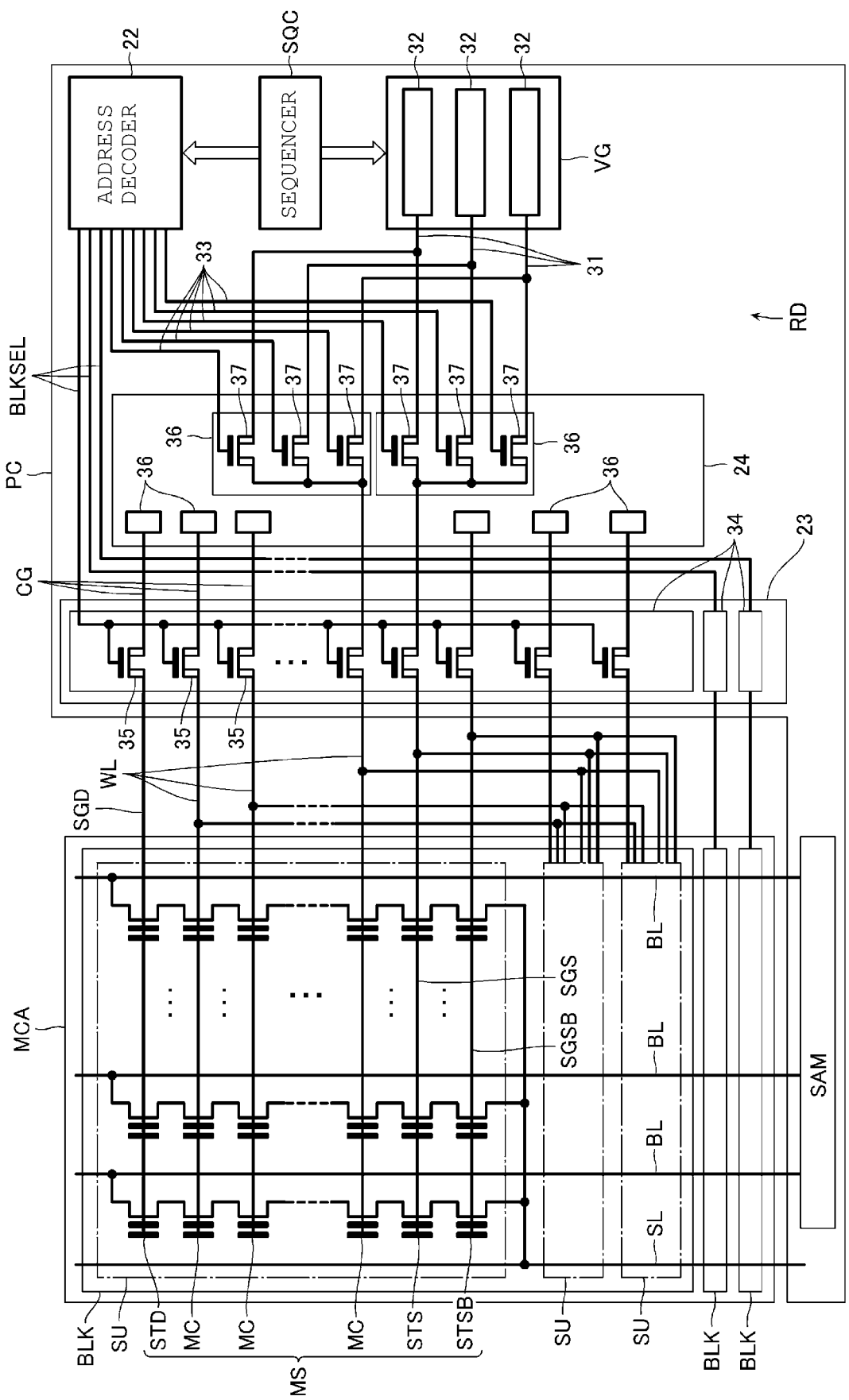
FIG. 5 is a schematic circuit diagram illustrating a configuration of a part of the memory die.
Figure 6:
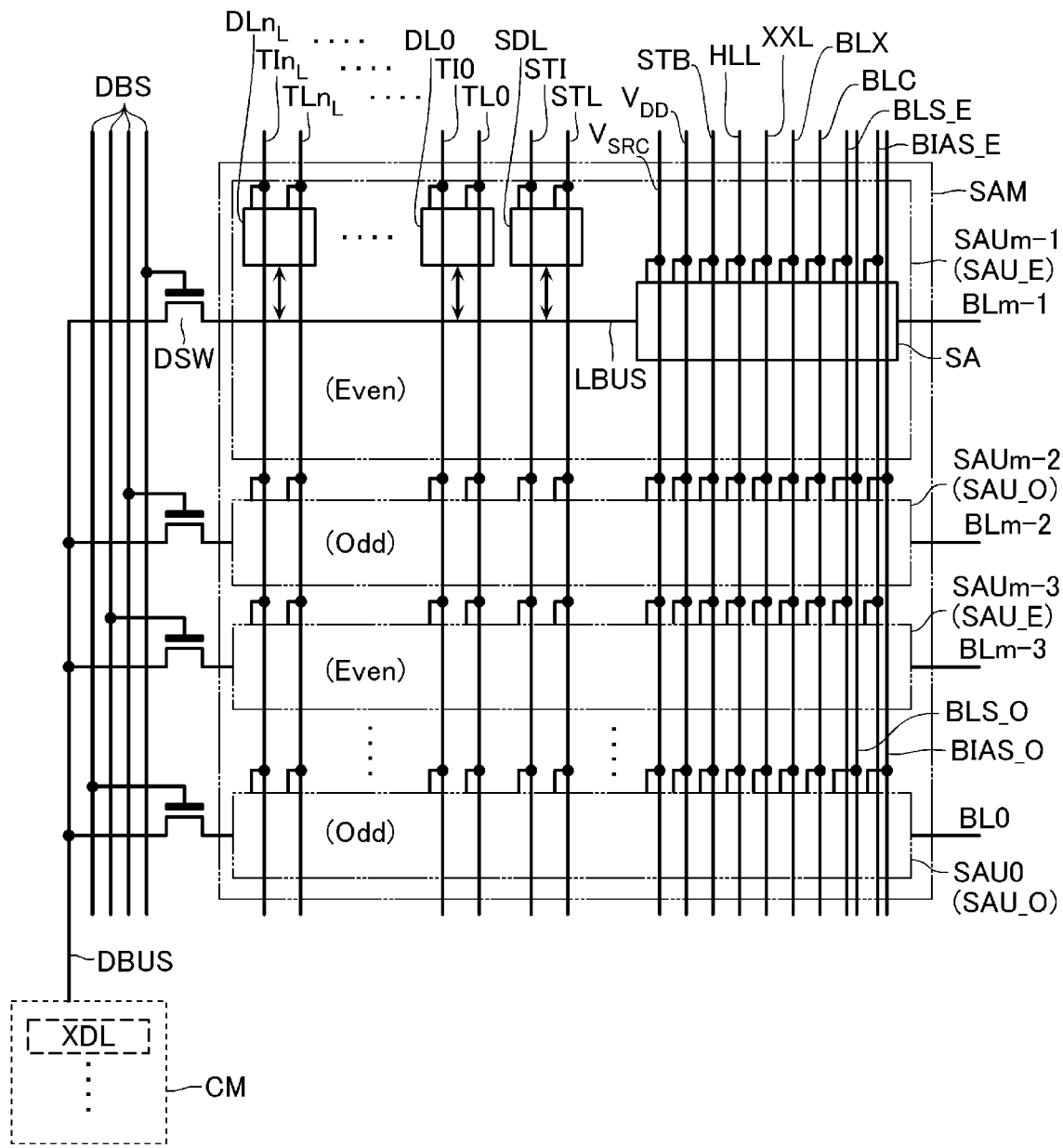
FIG. 6 is a schematic block diagram illustrating a configuration of a sense amplifier module.
Figure 7:
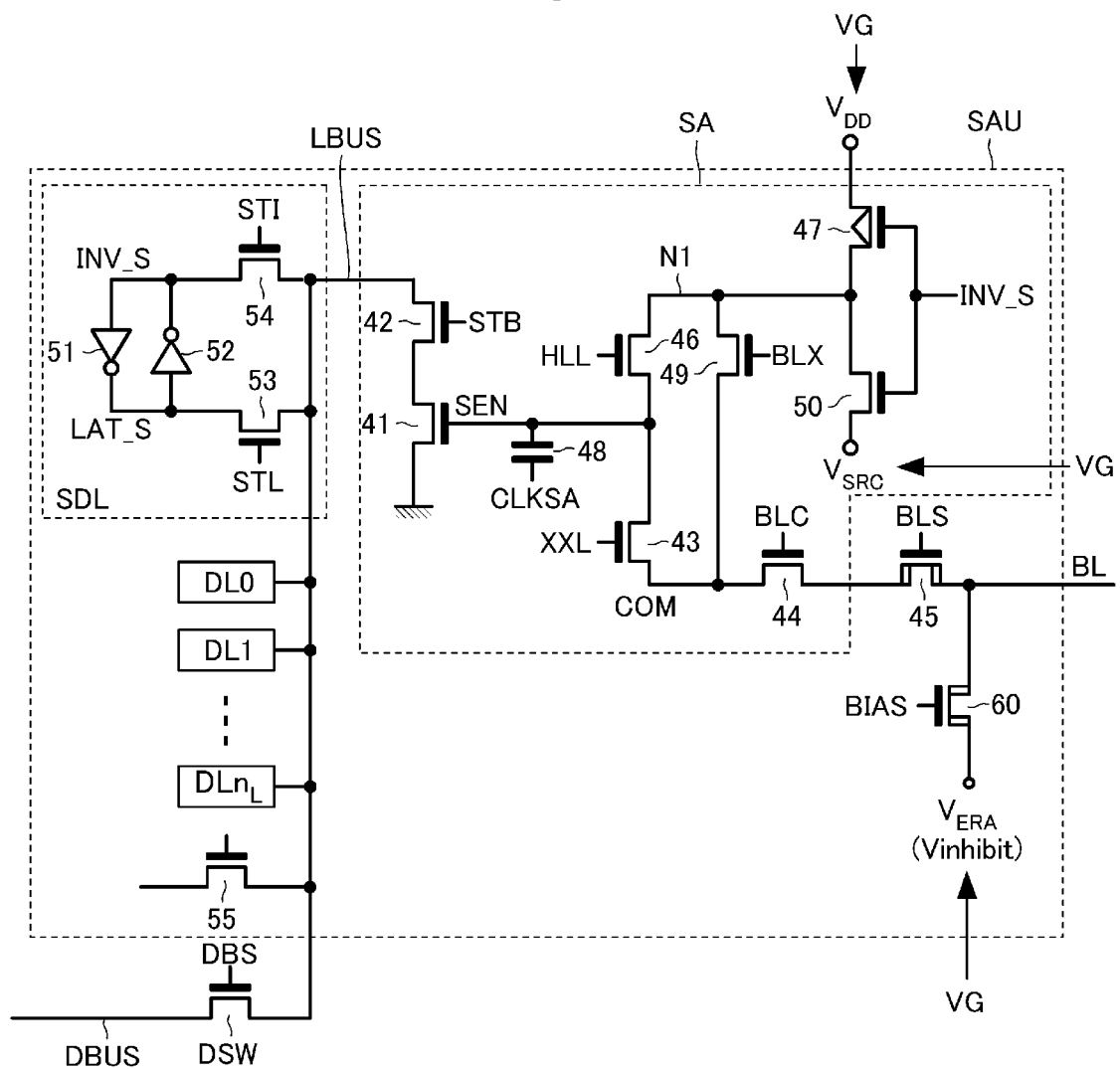
FIG. 7 is a schematic circuit diagram illustrating a configuration of a sense amplifier unit.

FIG. 4 is a schematic block diagram illustrating a configuration of the memory die MD. FIG. 5 is a schematic circuit diagram illustrating a configuration of a part of the memory die MD. FIG. 6 is a schematic block diagram illustrating a configuration of a sense amplifier module SAM. FIG. 7 is a schematic circuit diagram illustrating a configuration of a sense amplifier unit SAU. For convenience of description, some configurations are omitted in FIGS. 4 to 7.

FIG. 4 illustrates a plurality of control terminals and the like. The plurality of control terminals may be represented as control terminals corresponding to high active signals (positive logic signals), as control terminals corresponding to low active signals (negative logic signals), or as control terminals corresponding to both the high active signals and the low active signals. In FIG. 4, reference letters of the control terminals corresponding to the low active signals include overlines. In this specification, reference letters of the control terminals corresponding to the low active signals include a slash ("/"). The description in FIG. 4 is an example, and specific aspects may be adjusted as appropriate. For example, some or all of the high active signals may be made low active signals, and some or all of the low active signals may be made high active signals.

As illustrated in FIG. 4, the memory die MD includes a memory cell array MCA for storing user data and a peripheral circuit PC connected to the memory cell array MCA.

Configuration of Memory Cell Array MCA

The memory cell array MCA includes a plurality of memory blocks BLK, as illustrated in FIG. 5. Each of the plurality of memory blocks BLK includes a plurality of string units SU. Each of the plurality of string units SU includes a plurality of memory strings MS. One end of each of the plurality of memory strings MS is connected to the peripheral circuit PC via a bit line BL. In addition, the other end of each of the plurality of memory strings MS is connected to the peripheral circuit PC via a common source line SL.

The memory string MS includes a drain-side select transistor STD connected in series between the bit line BL and the source line SL, a plurality of memory cells MC (which are memory cell transistors), a source-side select transistor STS, and a source-side select transistor STSB. Hereinafter, the drain-side select transistor STD, the source-side select transistor STS, and the source-side select transistor STSB may be simply referred to as select transistors (STD, STS, and STSB) or select transistors (STD and STS).

The memory cell MC is a field effect transistor including a semiconductor layer, a gate insulating film, and a gate electrode. The semiconductor layer functions as a channel region. The gate insulating film includes a charge storage film. A threshold voltage of the memory cell MC changes according to an amount of charge in the charge storage film. The memory cell MC stores 1-bit or multiple-bit user data. A word line WL is connected to each of gate electrodes of the plurality of memory cells MC corresponding to one memory string MS. Each word line WL is commonly connected to all memory strings MS in one memory block BLK.

The select transistors (STD, STS, and STSB) are field effect transistors each of which includes a semiconductor layer, a gate insulating film, and a gate electrode. The semiconductor layer functions as a channel region. A drain-side select gate line SGD, a source-side select gate line SGS, and a source-side select gate line SGSB are respectively connected to the gate electrodes of the select transistors (STD, STS, and STSB). The drain-side select gate line SGD is provided corresponding to the string unit SU and commonly connected to all memory strings MS in one string unit SU. The source-side select gate line SGS is commonly connected to all memory strings MS in the memory block BLK. The source-side select gate line SGSB is commonly connected to all memory strings MS in the memory block BLK. Hereinafter, the drain-side select gate line SGD, the source-side select gate line SGS, and the source-side select gate line SGSB may be simply referred to as select gate lines (SGD, SGS, and SGSB) or select gate lines (SGD and SGS).

Configuration of Peripheral Circuit PC

The peripheral circuit PC includes, as illustrated in FIG. 4, a row decoder RD, a sense amplifier module SAM, a cache memory CM, a voltage generation circuit VG, and a sequencer SQC. The peripheral circuit PC also includes an address register ADR, a command register CMR, and a status register STR. Further, the peripheral circuit PC includes an input/output control circuit I/O and a logic circuit CTR.

Configuration of Row Decoder RD

The row decoder RD (FIG. 4) includes an address decoder 22 for decoding address data ADD (FIG. 4), as illustrated in FIG. 5, for example. The row decoder RD (FIG. 4) also includes a block select circuit 23 and a voltage select circuit 24 that transfer operating voltages to the memory cell array MCA according to an output signal of the address decoder 22.

The address decoder 22 is connected to a plurality of block select lines BLKSEL and a plurality of voltage select lines 33. The address decoder 22 sequentially references a row address RA of the address register ADR (FIG. 4) according to, for example, a control signal from the sequencer SQC.

The block select circuit 23 has a plurality of block select circuits 34 corresponding to the memory blocks BLK. The block select circuit 34 includes a plurality of block select transistors 35 corresponding to word lines WL and select gate lines (SGD and SGS), respectively.

The block select transistor 35 is, for example, a high breakdown voltage field-effect transistor. Drain electrodes of the block select transistors 35 are respectively electrically connected to corresponding word lines WL or select gate lines (SGD and SGS). Source electrodes of the block select transistors 35 are respectively electrically connected to voltage supply lines 31 via wirings CG and the voltage select circuit 24. Gate electrodes of the block select transistors 35 are commonly connected to the corresponding block select line BLKSEL.

The voltage select circuit 24 includes a plurality of voltage select units 36 corresponding to the word lines WL and the select gate lines (SGD and SGS). Each of the plurality of voltage select units 36 includes a plurality of voltage select transistors 37. The voltage select transistor 37 is, for example, a high breakdown voltage field-effect transistor. Drain terminals of the voltage select transistors 37 are respectively electrically connected to the corresponding word lines WL or the select gate lines (SGD and SGS) via the wirings CG and the block select circuit 23. Source terminals are electrically connected to the corresponding voltage supply lines 31. Gate electrodes are respectively connected to the corresponding voltage select lines 33.

Circuit Configuration of Sense Amplifier Module SAM

The sense amplifier module SAM (FIG. 4) includes a plurality of sense amplifier units SAU0 to SAUm-1 as illustrated in FIG. 6, for example. The plurality of sense amplifier units SAU0 to SAUm-1 correspond to a plurality of bit lines BL0 to BLm-1. m is an integer of 1 or more.

Among the first to mth sense amplifier units SAU0 to SAUm-1, the sense amplifier units corresponding to odd-numbered bit lines BL0, BL2, . . . , BLm-2 may be referred to as odd-numbered sense amplifier units SAU0, SAU2, . . . , SAUm-2. The odd-numbered sense amplifier units SAU0, SAU2, . . . , SAUm-2 may be referred to as an odd-numbered sense amplifier unit SAU_O.

Among the first to mth sense amplifier units SAU0 to SAUm-1, the sense amplifier units corresponding to even-numbered bit lines BL1, BL3, . . . , BLm-3, and BLm-1 may be referred to as even-numbered sense amplifier units SAU1, SAU3, . . . , SAUm-3, and SAUm-1. The even-numbered sense amplifier units SAU1, . . . SAU3, SAUm-3, and SAUm-1 may be referred to as an even-numbered sense amplifier unit SAU_E.

For example, as illustrated in FIG. 7, the sense amplifier units SAU0 to SAUm-1 each include a sense amplifier circuit SA, a high breakdown voltage transistor 45, a high breakdown voltage transistor 60, a wiring LBUS, and latch circuits SDL, DL0 to DLn$_L$ (n$_L$ is a natural number). A charging transistor 55 (FIG. 7) for precharging is connected to the wiring LBUS. The wiring LBUS is connected to a latch circuit XDL in the cache memory CM via a switch transistor DSW and a wiring DBUS.

The sense amplifier circuit SA includes a sense transistor 41 as illustrated in FIG. 7. The sense transistor 41 discharges charge of the wiring LBUS according to current flowing through the bit line BL. A source electrode of the sense transistor 41 is connected to a voltage supply line supplied with a ground voltage Vss. A drain electrode is connected to the wiring LBUS via a switch transistor 42. A gate electrode is connected to the bit line BL via a sense node SEN, a discharging transistor 43, a node COM, a clamp transistor 44, and the high breakdown voltage transistor 45. The sense node SEN is connected to an internal control signal line CLKSA via a capacitor 48.

The high breakdown voltage transistor 60 has a gate electrode connected to a signal line BIAS, a source terminal connected to a voltage supply line to which voltages VERA and Vinhibit are supplied, and a drain terminal connected to the bit line BL.

In an erasing operation, the voltage generation circuit VG generates the voltage $V_{ERA}$ necessary for the erasing operation. The voltage $V_{ERA}$ is supplied to the bit line BL via the voltage supply line and the high breakdown voltage transistor 60. In this case, the high breakdown voltage transistor 45 goes into an OFF state.

Also, in a program operation for the drain-side select gate line SGD, which will be described below, the voltage generation circuit VG generates the voltage Vinhibit necessary for the program operation. The voltage Vinhibit is supplied to the bit line BL via the voltage supply line and the high breakdown voltage transistor 60.

The sense amplifier circuit SA includes a voltage transfer circuit. The voltage transfer circuit selectively brings the node COM and the sense node SEN into conduction with a voltage supply line supplied with a voltage $V_{DD}$ or a voltage supply line supplied with a voltage $V_{SRC}$ according to data latched in the latch circuit SDL. The voltage transfer circuit includes a node N1, a charging transistor 46, a charging transistor 49, and an inverter including a charging transistor 47 and a discharging transistor 50. The charging transistor 46 is connected between the node N1 and the sense node SEN. The charging transistor 49 is connected between the node N1 and the node COM. The charging transistor 47 is connected between the node N1 and the voltage supply line to which the voltage $V_{DD}$ is supplied. The discharging transistor 50 is connected between the node N1 and the voltage supply line to which the voltage $V_{SRC}$ is supplied. Gate electrodes of the charging transistor 47 and the discharging transistor 50 are commonly connected to a node INV_S of the latch circuit SDL. That is, an output terminal of the inverter including the charging transistor 47 and the discharging transistor 50 is connected to the node N1. Also, an input terminal of the inverter is connected to the node INV_S of the latch circuit SDL.

The sense transistor 41, the switch transistor 42, the discharging transistor 43, the clamp transistor 44, the charging transistor 46, the charging transistor 49, and the discharging transistor 50 are, for example, enhancement type NMOS transistors. The high breakdown voltage transistor 45 is, for example, a depression type NMOS transistor. The charging transistor 47 is, for example, a PMOS transistor.

Further, a gate electrode of the switch transistor 42 is connected to a signal line STB. A gate electrode of the discharging transistor 43 is connected to a signal line XXL. A gate electrode of the clamp transistor 44 is connected to a signal line BLC. A gate electrode of the high breakdown voltage transistor 45 is connected to a signal line BLS. A gate electrode of the charging transistor 46 is connected to a signal line HLL. A gate electrode of the charging transistor 49 is connected to a signal line BLX. These signal lines STB, XXL, BLC, BLS, HLL and BLX are connected to the sequencer SQC.

The latch circuit SDL includes nodes LAT_S and INV_S, an inverter 51, an inverter 52, a switch transistor 53, and a switch transistor 54. The inverter 51 has an output terminal connected to the node LAT_S and an input terminal connected to the node INV_S. The inverter 52 has an input terminal connected to the node LAT_S and an output terminal connected to the node INV_S. The switch transistor 53 is provided in a current path between the node LAT_S and the wiring LBUS. The switch transistor 54 is provided in a current path between the node INV_S and the wiring LBUS. The switch transistors 53 and 54 are, for example, NMOS transistors. A gate electrode of the switch transistor 53 is connected to the sequencer SQC via a signal line STL. A gate electrode of the switch transistor 54 is connected to the sequencer SQC via a signal line STI.

The latch circuits DL0 to $DLn_L$ are configured in substantially the same manner as the latch circuit SDL. However, as described above, the node INV_S of the latch circuit SDL is brought into conduction with the gate electrodes of the charging transistor 47 and the discharging transistor 50 in the sense amplifier circuit SA. The latch circuits DL0 to $DLn_L$ differ from the latch circuit SDL in this respect.

The switch transistor DSW is, for example, an NMOS transistor. The switch transistor DSW is connected between the wiring LBUS and the wiring DBUS. A gate electrode of the switch transistor DSW is connected to the sequencer SQC via a signal line DBS.

As illustrated in FIG. 6, the above-described signal lines STB, HLL, XXL, BLX, and BLC are each commonly connected among all sense amplifier units SAU0 to SAUm-1 in the sense amplifier module SAM. The voltage supply line to which the voltage $V_{DD}$ is supplied and the voltage supply line to which the voltage $V_{SRC}$ is supplied are each commonly connected among all the sense amplifier units SAU0 to SAUm-1 in the sense amplifier module SAM. The signal line STI and the signal line STL of the latch circuit SDL are each commonly connected among all the sense amplifier units SAU0 to SAUm-1 in the sense amplifier module SAM. Similarly, signal lines TI0 to $TIn_L$, and TL0 to $TLn_L$ corresponding to the signal lines STI and STL in the latch circuits DL0 to $DLn_L$ are each commonly connected among all the sense amplifier units SAU0 to SAUm-1 in the sense amplifier module SAM.

The signal lines BLS and BIAS described above are divided into signal lines BLS_O and BIAS_O connected to the odd-numbered sense amplifier units SAU0, SAU2, . . . , SAUm-2 and signal lines BLS_E and BIAS_E connected to the even-numbered sense amplifier units SAU1, SAU3, . . . , SAUm-3, SAUm-1. The signal lines BLS_O and BIAS_O are commonly connected among the odd-numbered sense amplifier units SAU0, SAU2, . . . , SAUm-2 in the sense amplifier module SAM. The signal lines BLS_E and BIAS_E are commonly connected among the even-numbered sense amplifier units SAU1, SAU3, SAUm-3 and SAUm-1 in the sense amplifier module SAM.

A plurality of the signal lines DBS described above are provided corresponding to all the sense amplifier units SAU in the sense amplifier module SAM.

Configuration of Voltage Generation Circuit VG

The voltage generation circuit VG (FIG. 4) is connected to a plurality of voltage supply lines 31, for example as illustrated in FIG. 5. The voltage generation circuit VG includes, for example, a step-down circuit such as a regulator and a step-up circuit such as a charge pump circuit 32. The step-down circuit and the step-up circuit are each connected to voltage supply lines supplied with a power supply voltage Vcc and a ground voltage Vss (FIG. 4). These voltage supply lines are connected, for example, to the pad electrodes P described with reference to FIGS. 2 and 3.

The voltage generation circuit VG generates a plurality of operating voltages to be applied to the bit line BL, the source line SL, the word line WL, and the select gate lines (SGD, SGS, and SGSB) during a read operation, a program operation, and an erasing operation for the memory cell array MCA according to, for example, control signals from the sequencer SQC.

Further, the voltage generation circuit VG generates a plurality of operating voltages to be applied to the bit line BL, the source line SL, the word line WL, and the select gate lines (SGD, SGS, and SGSB) during the program operation for the drain-side select gate line SGD according to, for example, the control signal from the sequencer SQC.

The voltage generation circuit VG outputs the generated voltages to the plurality of voltage supply lines 31. The operation voltage output from the voltage supply line 31 is appropriately adjusted according to the control signal from the sequencer SQC.

Configuration of Sequencer SQC

The sequencer SQC (FIG. 4) outputs internal control signals to the row decoder RD, the sense amplifier module SAM, and the voltage generation circuit VG according to command data CMD stored in the command register CMR. The sequencer SQC also outputs status data Stt indicating a state of the memory die MD to the status register STR as appropriate.

The sequencer SQC generates a ready/busy signal RB and outputs the ready/busy signal RB to a terminal RBn. During a period (busy period) in which the terminal RBn is in an "L" state, access to the memory die MD is basically prohibited. Access to the memory die MD is permitted during a period (ready period) in which the terminal RBn is in an "H" state. The terminal RBn is implemented by, for example, the pad electrode P described with reference to FIGS. 2 and 3.

Configuration of Address Register ADR

The address register ADR, as illustrated in FIG. 4, is connected to the input/output control circuit I/O and stores the address data ADD input from the input/output control circuit I/O. The address register ADR has, for example, a plurality of 8-bit register rows. When an internal operation such as a read operation, a program operation, or an erasing operation is executed, the register row stores the address data ADD corresponding to the internal operation being executed.

The address data ADD includes, for example, a column address CA (FIG. 4) and the row address RA (FIG. 4). The row address RA includes, for example, a block address specifying the memory block BLK (FIG. 5), a page address specifying the string unit SU and the word line WL, a plane address specifying the memory cell array MCA (plane), and a chip address specifying the memory die MD.

Configuration of Command Register CMR

The command register CMR is connected to the input/output control circuit I/O and stores the command data CMD input from the input/output control circuit I/O. The command register CMR has at least one set of 8-bit register rows, for example. When the command data CMD is stored in the command register CMR, a control signal is transmitted to the sequencer SQC.

Configuration of Status Register STR

The status register STR is connected to the input/output control circuit I/O and stores the status data Stt to be output to the input/output control circuit I/O. The status register STR has, for example, a plurality of 8-bit register rows. When an internal operation such as a read operation, a program operation, or an erasing operation is executed, the register row stores the status data Stt regarding the internal operation being executed. Also, the register row stores ready/busy information of the memory cell array MCA, for example.

Configuration of Input/Output Control Circuit I/O

The input/output control circuit I/O (FIG. 4) includes data signal input/output terminals DQ0 to DQ7, data strobe signal input/output terminals DQS and /DQS, a shift register, and a buffer circuit.

Each of the data signal input/output terminals DQ0 to DQ7 and data strobe signal input/output terminals DQS and /DQS is implemented by the pad electrode P described with reference to FIGS. 2 and 3, for example. Data DAT input via the data signal input/output terminals DQ0 to DQ7 is input from a buffer circuit to the cache memory CM, the address register ADR, or the command register CMR according to an internal control signal from the logic circuit CTR. The data DAT output via the data signal input/output terminals DQ0 to DQ7 is input to the buffer circuit from the cache memory CM or the status register STR according to the internal control signal from the logic circuit CTR.

Signals (for example, data strobe signals and complementary signals thereof) input via the data strobe signal input/output terminals DQS and /DQS are used for data input via the data signal input/output terminals DQ0 to DQ7. Data input via the data signal input/output terminals DQ0 to DQ7 is taken into a shift register in the input/output control circuit I/O at a timing of a rising edge (switching of the input signal) of the voltage of the data strobe signal input/output terminal DQS and a falling edge (switching of the input signal) of the voltage of the data strobe signal input/output terminal /DQS, and a timing of a falling edge (switching of the input signal) of the voltage of the data strobe signal input/output terminal DQS and a rising edge (switching of the input signal) of the voltage of the data strobe signal input/output terminal /DQS.

Configuration of Logic Circuit CTR

The logic circuit CTR (FIG. 4) includes a plurality of external control terminals /CE, CLE, ALE, /WE, /RE, and RE, and a logic circuit connected to the plurality of external control terminals /CE, CLE, ALE, /WE, /RE, and RE. The logic circuit CTR receives an external control signal from the controller die CD via the external control terminals /CE, CLE, ALE, /WE, /RE, and RE and outputs an internal control signal to the input/output control circuit I/O according to the external control signal.

Further, each of the external control terminals /CE, CLE, ALE, /WE, /RE, and RE is implemented by the pad electrode P described with reference to FIGS. 2 and 3, for example.

Configuration of Memory Die MD

Figure 8:
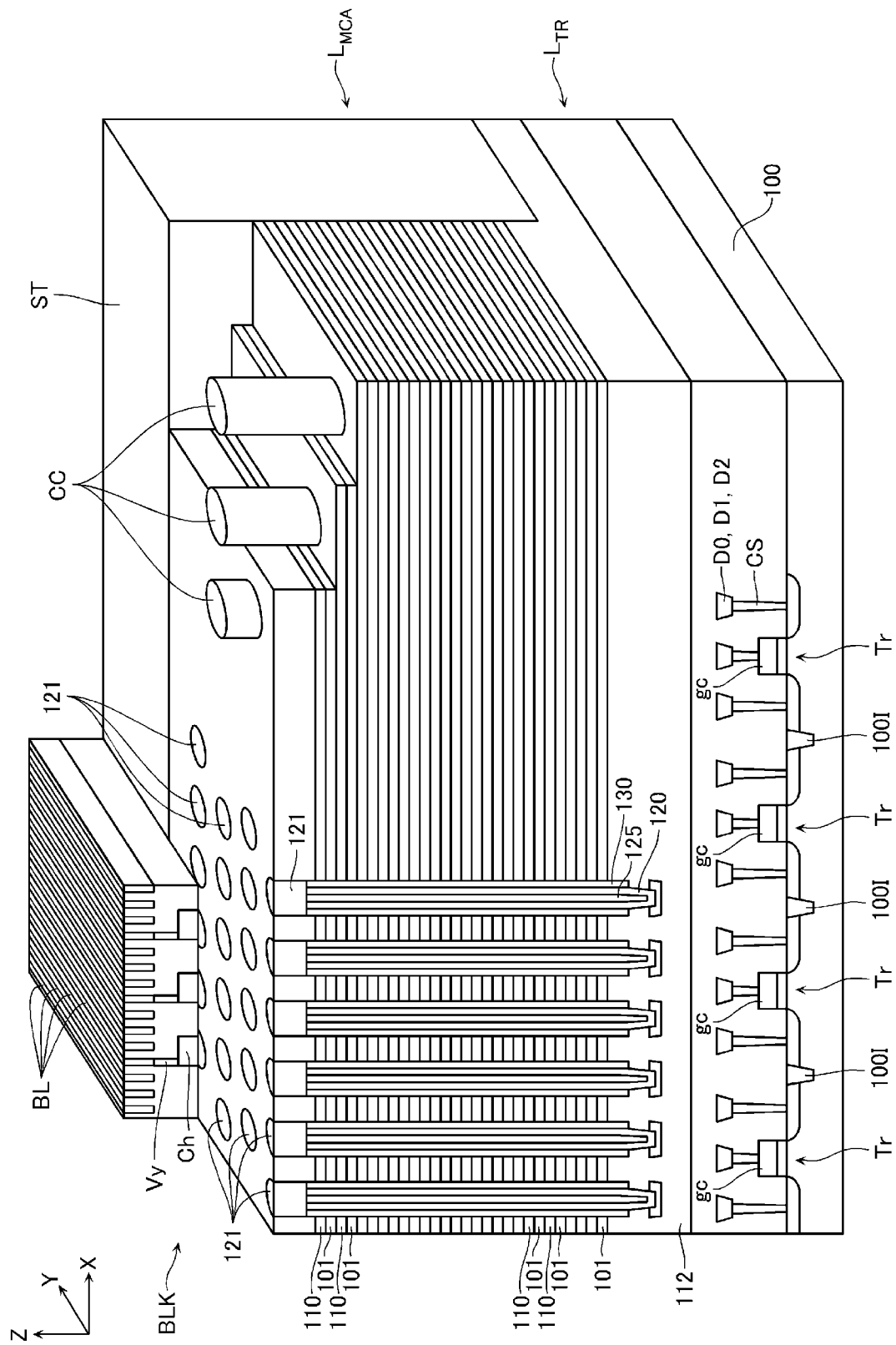
FIG. 8 is a schematic perspective view illustrating a configuration of a part of the memory die.
Figure 9:
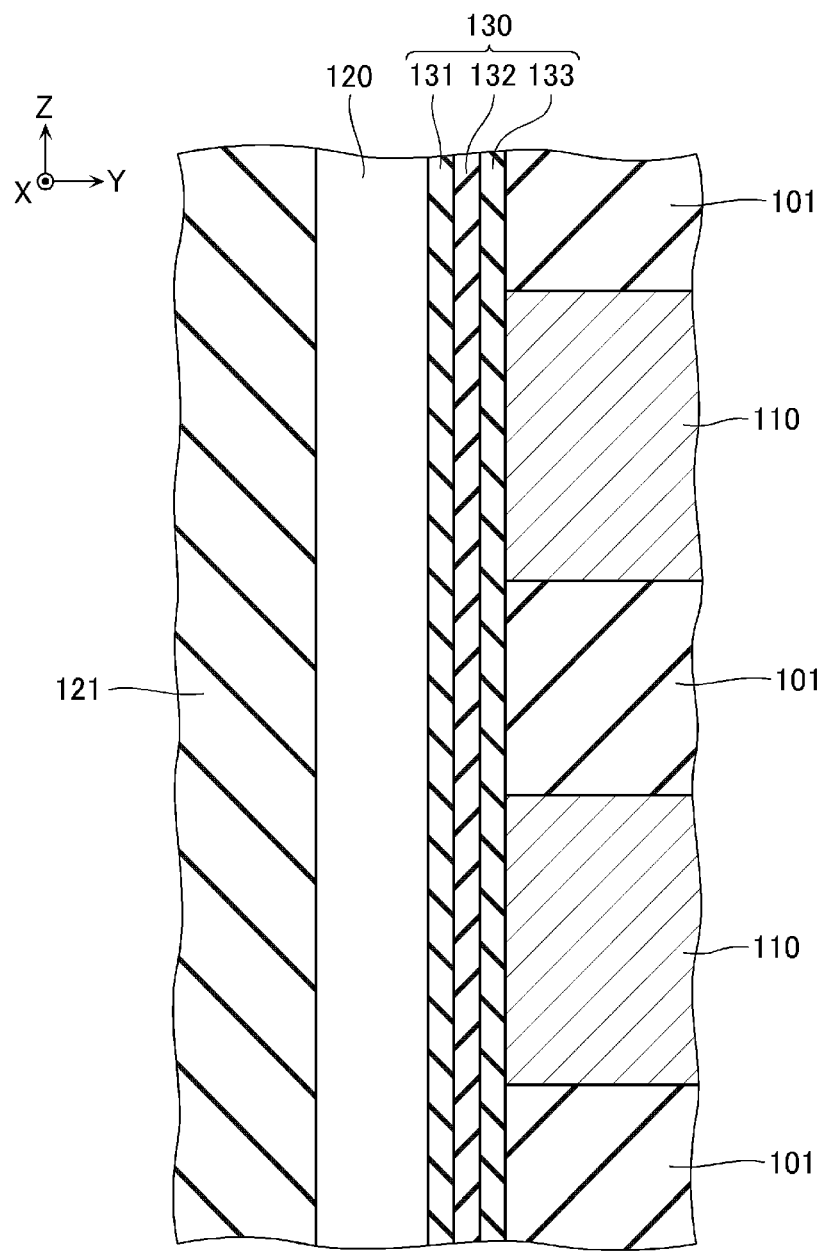
FIG. 9 is a schematic cross-sectional view illustrating a configuration of a part of the memory die.
Figure 10:
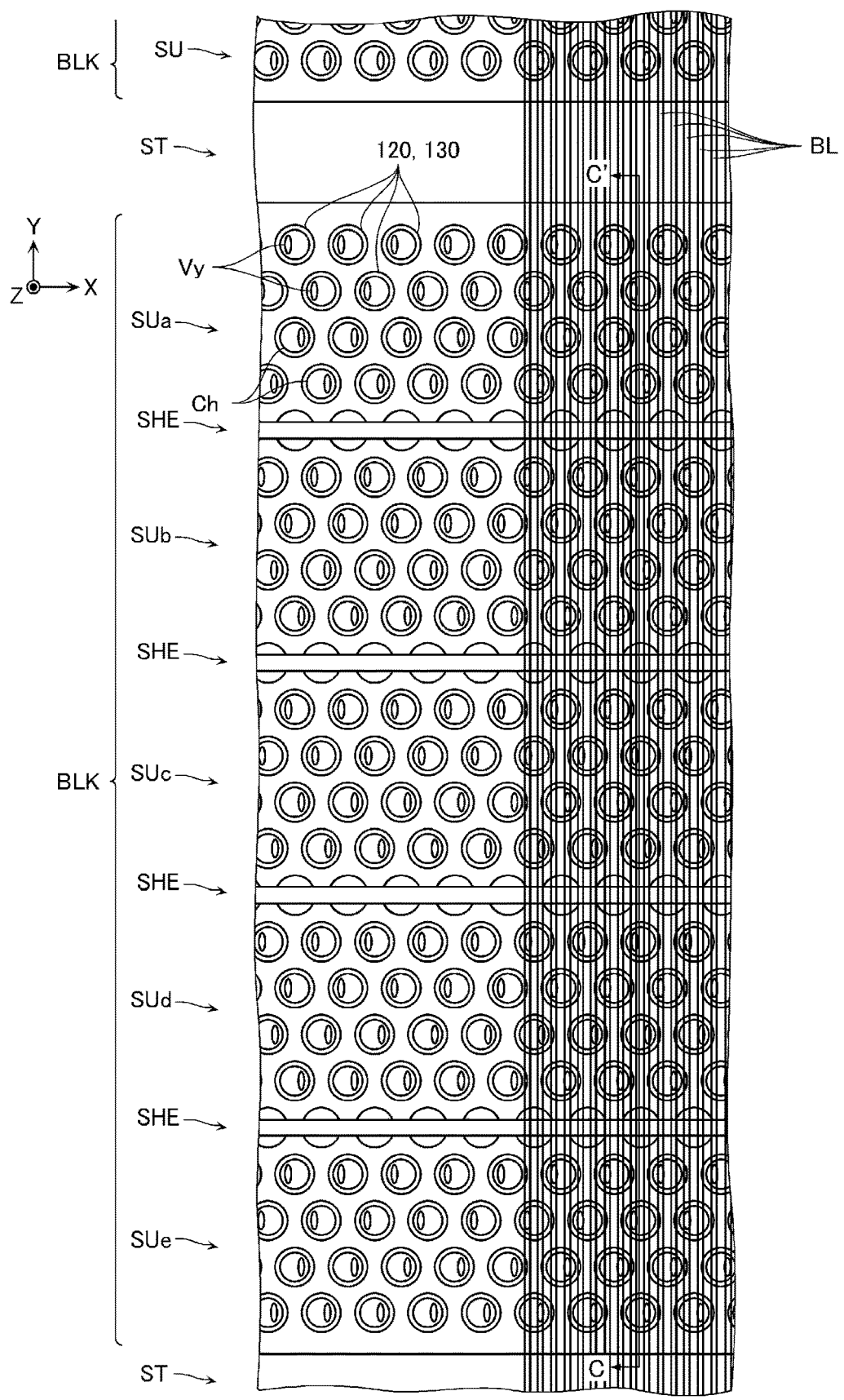
FIG. 10 is a schematic cross-sectional view illustrating a configuration of a part of the memory die.
Figure 11:
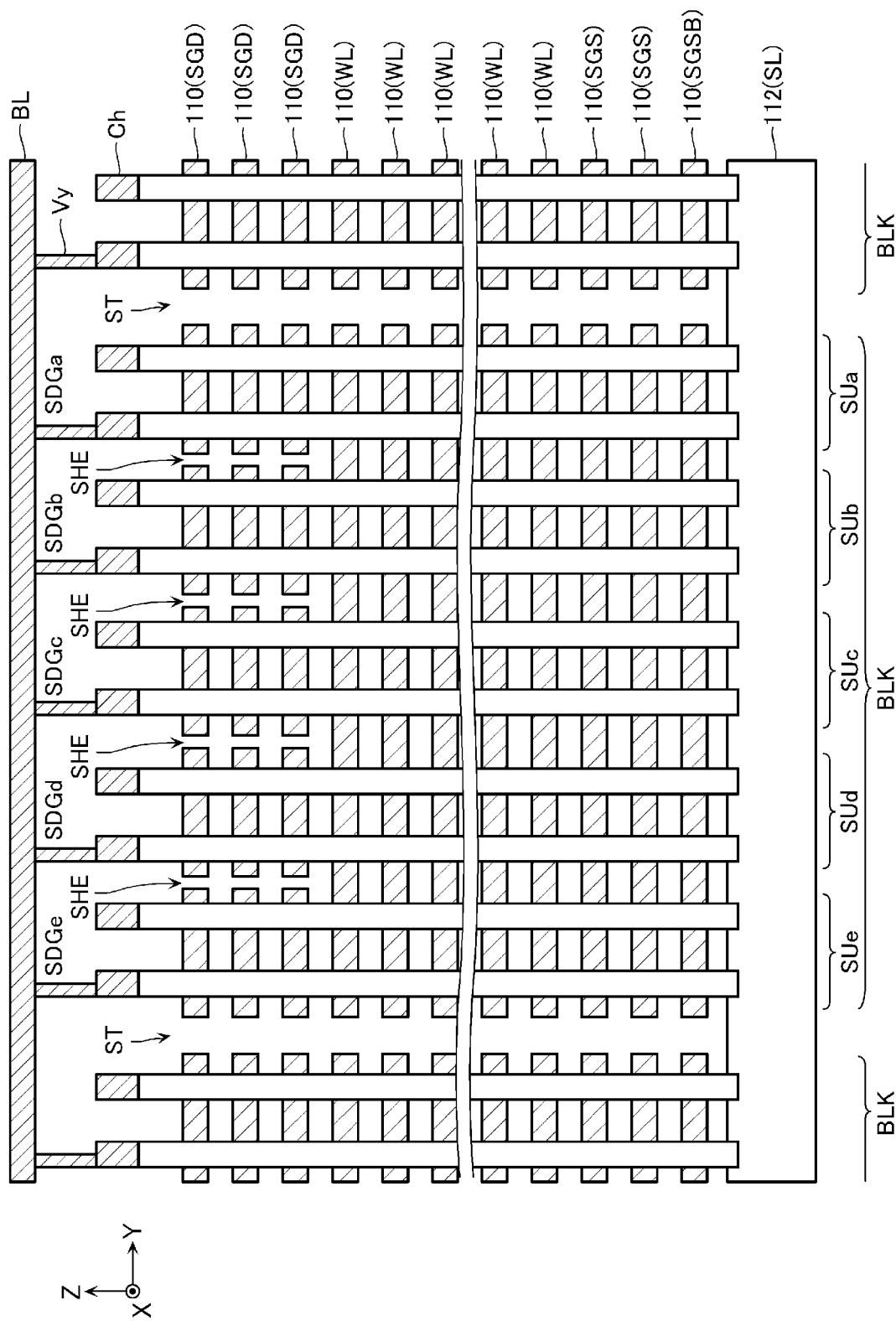
FIG. 11 is a schematic cross-sectional view of a structure illustrated in FIG. 10 cut along line C-C'.
Figure 12:
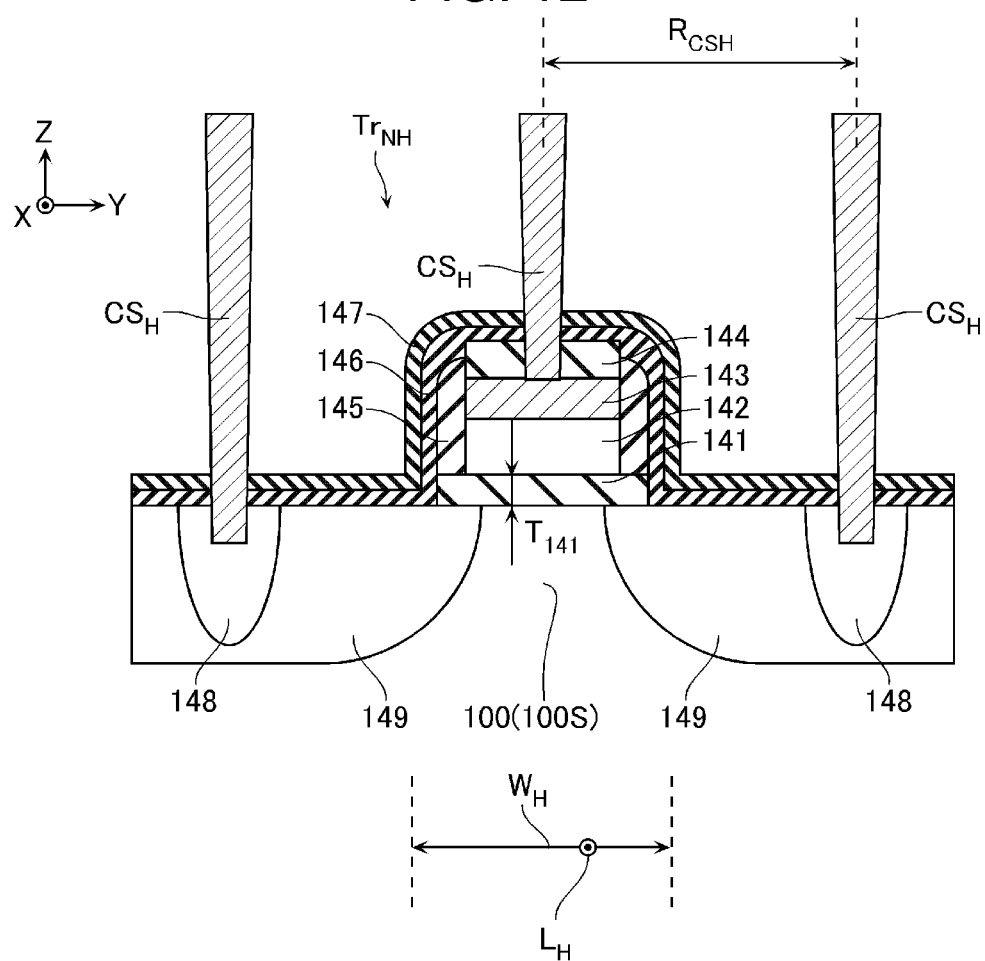
FIG. 12 is a schematic cross-sectional view illustrating a configuration of an N-type high voltage transistor.
Figure 13:
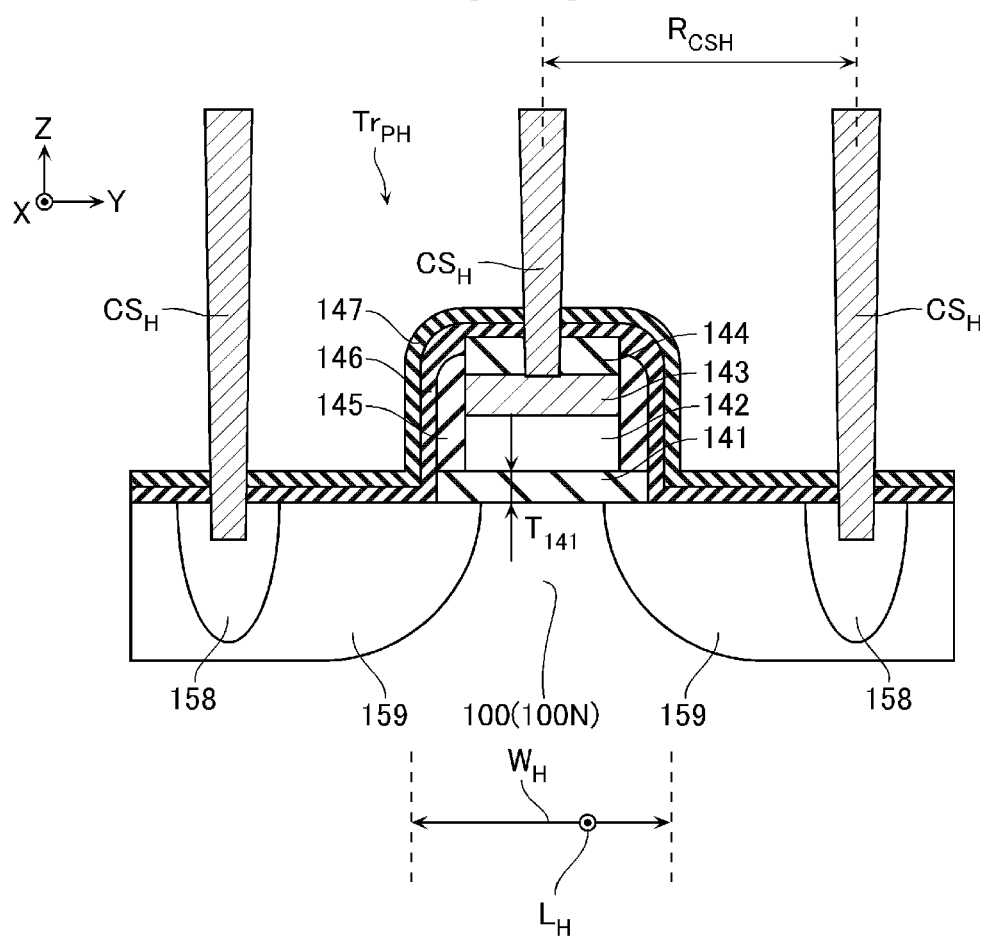
FIG. 13 is a schematic cross-sectional view illustrating a configuration of a P-type high voltage transistor.
Figure 14:
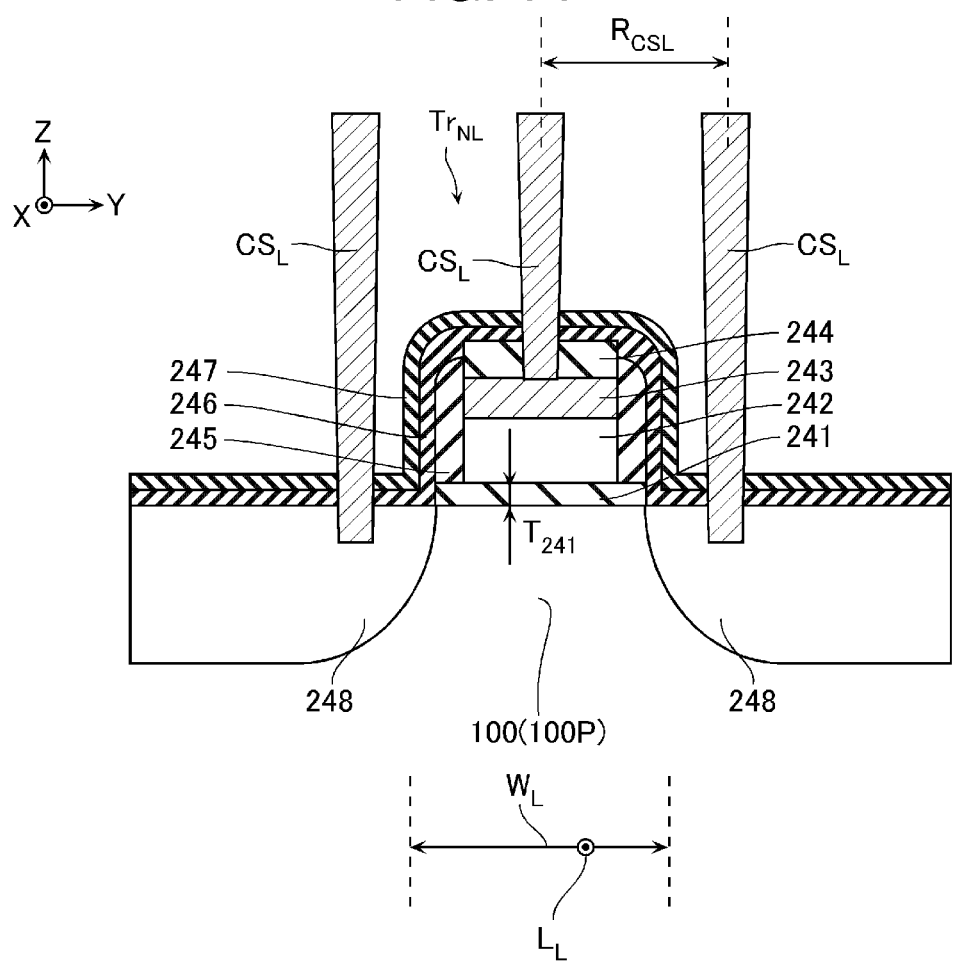
FIG. 14 is a schematic cross-sectional view illustrating a configuration of an N-type low voltage transistor.
Figure 15:
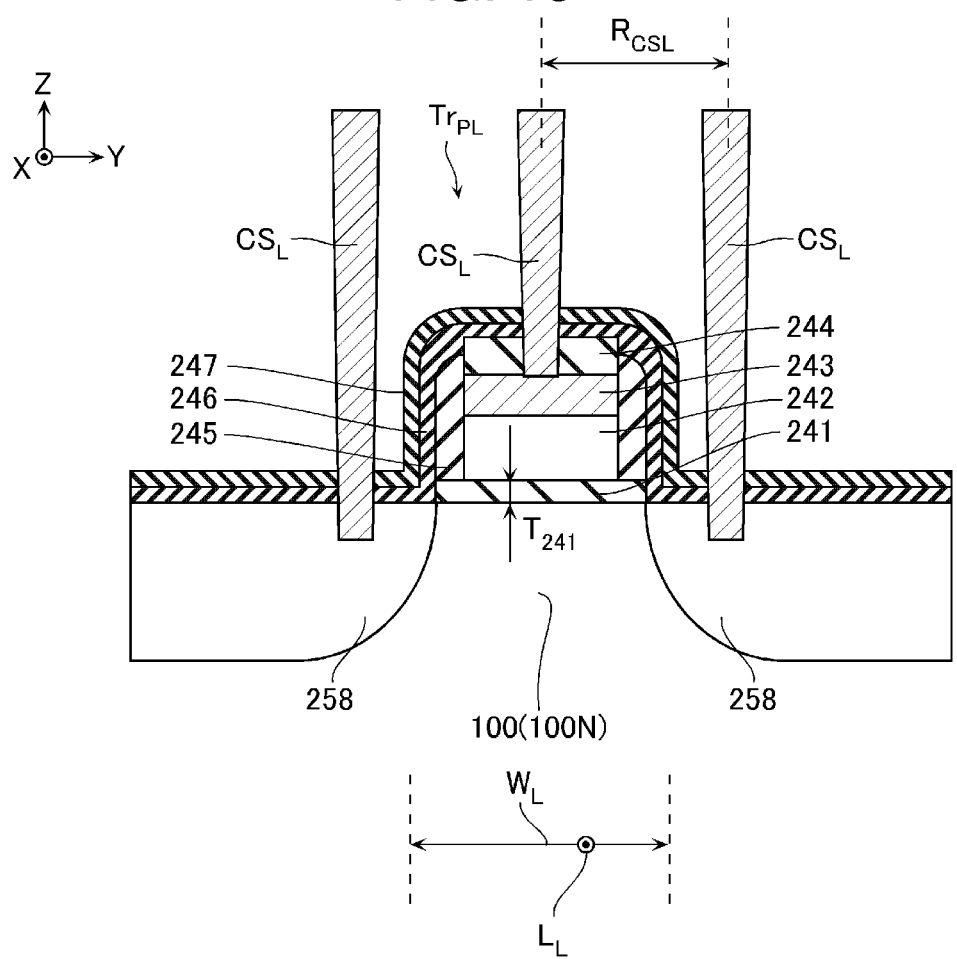
FIG. 15 is a schematic cross-sectional view illustrating a configuration of a P-type low voltage transistor.
Figure 16:
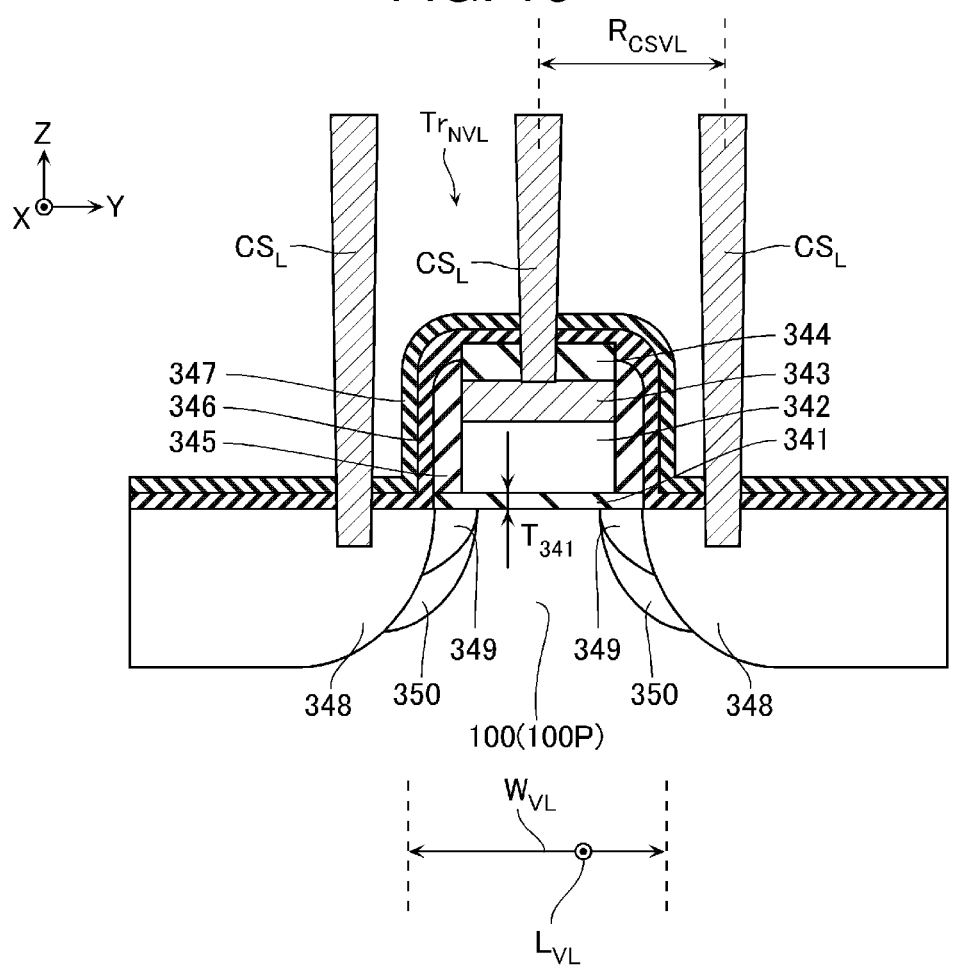
FIG. 16 is a schematic cross-sectional view illustrating a configuration of an N-type ultra-low voltage transistor.

Next, configuration examples of the semiconductor storage device according to the present embodiment will be described with reference to FIGS. 8 to 11. FIG. 8 is a schematic perspective view illustrating a configuration of a part of the memory die MD. FIGS. 9 and 10 are schematic cross-sectional views illustrating configurations of a part of the memory die MD. FIG. 11 is a schematic cross-sectional view of a structure illustrated in FIG. 10 cut along line C-C' and viewed in a direction of arrow. FIG. 12 is a schematic cross-sectional view illustrating a configuration of an N-type high voltage transistor $Tr_{NH}$. FIG. 13 is a schematic cross-sectional view illustrating a configuration of a P-type high voltage transistor $Tr_{PH}$. FIG. 14 is a schematic cross-sectional view illustrating a configuration of an N-type low voltage transistor $Tr_{NL}$. FIG. 15 is a schematic cross-sectional view illustrating a configuration of a P-type low voltage transistor $Tr_{PL}$. FIG. 16 is a schematic cross-sectional view illustrating a configuration of an N-type ultra-low voltage transistor $Tr_{NVL}$. FIG. 17 is a schematic cross-sectional view illustrating a configuration of a P-type ultra-low voltage transistor $Tr_{PVL}$. FIGS. 8 to 17 illustrate schematic configurations, and specific configurations thereof may be changed as appropriate. In FIGS. 8 to 17, a part of the configuration is omitted.

As illustrated in FIG. 8, the memory die MD includes a semiconductor substrate 100, a transistor layer $L_{TR}$ provided on the semiconductor substrate 100, and a memory cell array layer $L_{MCA}$ provided above the transistor layer $L_{TR}$.

Structure of Memory Cell Array Layer $L_{MCA}$

The memory cell array layer $L_{MCA}$ includes a plurality of memory blocks BLK located in the Y direction. An inter-block insulating layer ST such as silicon oxide ($SiO_2$) is provided between two memory blocks BLK adjacent in the Y direction, as illustrated in FIGS. 8 and 10, for example. A plurality of string units SU are provided between two inter-block insulating layers ST adjacent in the Y direction. An inter-string unit insulating layer SHE such as silicon oxide ($SiO_2$) is provided between two string units SU adjacent in the Y direction.

In the following description, as illustrated in FIGS. 10 and 11, the plurality of string units SU in the memory block BLK may be respectively referred to as string units SUa, SUb, SUc, SUd, and Sue.

The memory block BLK includes, for example, as illustrated in FIG. 8, a plurality of conductive layers 110 and a plurality of insulating layers 101 alternately located in a Z direction, a plurality of semiconductor pillars 120 extending in the Z direction, and a plurality of gate insulating films 130 respectively provided between the plurality of conductive layers 110 and the plurality of semiconductor pillars 120.

The conductive layer 110 is a substantially plate-shaped conductive layer extending in the X direction. The conductive layer 110 may include a layered film or the like including a barrier conductive film such as titanium nitride (TiN) and a metal film such as tungsten (W). Also, the conductive layer 110 may contain, for example, polycrystalline silicon containing impurities such as phosphorus (P) or boron (B). The insulating layer 101 such as silicon oxide ($SiO_2$) is provided between the plurality of conductive layers 110 located in the Z direction.

Further, among the plurality of conductive layers 110, two or more conductive layers 110 positioned at bottom layers function as, for example, as illustrated in FIG. 11, the source-side select gate lines SGS and SGSB (FIG. 5) and gate electrodes of a plurality of source-side select transistors STS and STSB connected to the source-side select gate lines SGS and SGSB. These plurality of conductive layers 110 are electrically independent for each memory block BLK.

Further, a plurality of conductive layers 110 positioned above above-described these plurality of conductive layers 110 function as the word lines WL (FIG. 5) and gate electrodes of a plurality of memory cells MC (FIG. 5) connected to the word lines WL. These plurality of conductive layers 110 are electrically independent for each memory block BLK.

In addition, one or more conductive layers 110 positioned above the plurality of conductive layers 110 described above function as the drain-side select gate lines SGD and gate electrodes of a plurality of drain-side select transistors STD (FIG. 5) connected to the drain-side select gate lines SGD. These plurality of conductive layers 110 have smaller widths in the Y direction than the other conductive layers 110.

A semiconductor layer 112 is provided below the conductive layer 110. The semiconductor layer 112 may contain, for example, polycrystalline silicon containing impurities such as phosphorus (P) or boron (B). The insulating layer 101 such as silicon oxide ($SiO_2$) is provided between the semiconductor layer 112 and the conductive layer 110.

The semiconductor layer 112 functions as the source line SL (FIG. 5). For example, the source line SL is commonly provided for all memory blocks BLK in the memory cell array MCA.

The semiconductor pillars 120 are located in a predetermined pattern in the X direction and the Y direction, as illustrated in FIGS. 8 and 10, for example. The semiconductor pillars 120 function as channel regions of the plurality of memory cells MC and the select transistors (STD, STS, and STSB) in one memory string MS (FIG. 5). The semiconductor pillar 120 is, for example, a semiconductor layer such as polycrystalline silicon (Si). For example, as illustrated in FIG. 8, the semiconductor pillar 120 has a substantially cylindrical shape with a bottom, and an insulating layer 125 such as silicon oxide is provided in a central portion. In addition, an outer peripheral surface of the semiconductor pillar 120 is surrounded by the conductive layer 110 and faces the conductive layer 110.

An impurity region 121 containing an N-type impurity such as phosphorus (P) is provided at an upper end portion of the semiconductor pillar 120. The impurity region 121 is connected to the bit line BL via a contact Ch and a contact Vy. A lower end portion of the semiconductor pillar 120 is connected to the semiconductor layer 112. The semiconductor pillars 120 respectively function as channel regions of the plurality of memory cells MC and the select transistors (STD, STS, and STSB) in one memory string MS (FIG. 5).

The gate insulating film 130 has a substantially cylindrical shape with a bottom that covers an outer peripheral surface of the semiconductor pillar 120. The gate insulating film 130 includes, for example, a tunnel insulating film 131, a charge storage film 132, and a block insulating film 133 which are stacked between the semiconductor pillar 120 and the conductive layer 110, as illustrated in FIG. 9. The tunnel insulating film 131 and the block insulating film 133 are, for example, insulating films such as silicon oxide ($SiO_2$). The charge storage film 132 is a film that can store charges, and is, for example, silicon nitride (SiN). The tunnel insulating film 131, the charge storage film 132, and the block insulating film 133 have a substantially cylindrical shape, and extend in the Z direction along the outer peripheral surface of the semiconductor pillar 120 excluding a contact portion between the semiconductor pillar 120 and the semiconductor layer 112. That is, the gate insulating film 130 has the same configuration at a height position corresponding to the memory cell MC and at a height position corresponding to the drain-side select transistor STD.

The gate insulating film 130 may include a floating gate made of, for example, polycrystalline silicon containing N-type or P-type impurities.

As illustrated in FIG. 8, a plurality of contacts CC are provided at end portions of the plurality of conductive layers 110 in the X direction. The plurality of conductive layers 110 are connected to the peripheral circuit PC via these plurality of contacts CC. These plurality of contacts CC extend in the Z direction and are connected to the conductive layer 110 at lower ends thereof. The contact CC may include, for example, a layered film including a barrier conductive film such as titanium nitride (TiN) and a metal film such as tungsten (W).

Structure of Semiconductor Substrate 100 and Transistor Layer $L_{TR}$

The semiconductor substrate 100 is, for example, a semiconductor substrate made of P-type silicon (Si) containing P-type impurities such as boron (B). A part of a surface of the semiconductor substrate 100 is provided with an N-type well implanted with N-type impurities such as phosphorus (P). A part of the surface of the semiconductor substrate 100 is provided with a P-type well implanted with P-type impurities such as boron (B). In addition, a part of the surface of the semiconductor substrate 100 is provided with a semiconductor substrate region where neither the N-type well nor the P-type well is provided. A part of the surface of the semiconductor substrate 100 is provided with an insulating region 1001.

A plurality of transistors Tr forming the peripheral circuit PC are provided in the transistor layer $L_{TR}$. A source region, a drain region and a channel region of the transistor Tr are provided on the surface of the semiconductor substrate 100. A gate electrode gc of the transistor Tr is provided in the transistor layer $L_{TR}$. Contacts CS are provided in the source region, the drain region and the gate electrode gc of the plurality of transistors Tr. The plurality of contacts CS are connected to other transistors Tr, components in the memory cell array layer $L_{MCA}$, and the like via wirings D0, D1, and D2 in the transistor layer $L_{TR}$.

As the transistors Tr, for example, N-type high voltage transistors $Tr_{NH}$, P-type high voltage transistors $Tr_{PH}$, N-type low voltage transistors $Tr_{NL}$, P-type low voltage transistors $Tr_{PL}$, N-type ultra-low voltage transistors $Tr_{NVL}$ and P-type ultra-low voltage transistors $Tr_{PVL}$ are provided.

Structure of N-type High Voltage Transistor $Tr_{NH}$

The N-type high voltage transistor $Tr_{NH}$ is provided in a semiconductor substrate region 100S of the semiconductor substrate 100 as illustrated in FIG. 12, for example. The N-type high voltage transistor $Tr_{NH}$ includes a part of the semiconductor substrate region 100S, a gate insulating layer 141 such as silicon oxide ($SiO_2$) provided on the surface of the semiconductor substrate 100, a gate electrode member 142 such as polycrystalline silicon (Si) provided on an upper surface of the gate insulating layer 141, a gate electrode member 143 such as tungsten (W) provided on an upper surface of the gate electrode member 142, a cap insulating layer 144 such as silicon oxide ($SiO_2$) or silicon nitride ($Si_3N_4$) provided on an upper surface of the gate electrode member 143, and a side wall insulating layer 145 such as silicon oxide ($SiO_2$) or silicon nitride ($Si_3N_4$) provided on side surfaces of the gate electrode member 142, the gate electrode member 143, and the cap insulating layer 144 in the X or Y direction. The gate electrode member 142 contains, for example, N-type impurities such as phosphorus (P) or arsenic (As), or P-type impurities such as boron (B).

In the illustrated example, a thickness $T_{141}$ matches a thickness of the gate insulating layer 141 in the Z direction.

Also, the N-type high voltage transistor $Tr_{NH}$ includes a liner insulating layer 146 such as silicon oxide ($SiO_2$) and a liner insulating layer 147 such as silicon nitride ($Si_3N_4$) which are stacked on the surface of the substrate 100, a side surface of the gate insulating layer 141 in the X or Y direction, a side surface of the sidewall insulating layer 145 in the X or Y direction, and an upper surface of the cap insulating layer 144.

Also, three contacts $CS_H$ extending in the Z direction are connected to the N-type high voltage transistor $Tr_{NH}$. The contact $CS_H$ may include, for example, a layered film of a barrier conductive film such as titanium nitride (TiN) and a metal film such as tungsten (W). One of the three contact $CS_H$ is connected to an upper surface of the gate electrode member 143 through the liner insulating layer 147, the liner insulating layer 146 and the cap insulating layer 144, and functions as a part of the gate electrode of the N-type high voltage transistor $Tr_{NH}$. Remaining two of the three contacts $CS_H$ are connected to the surface of the semiconductor substrate 100 through the liner insulating layer 147 and the liner insulating layer 146, and function as a source electrode or a drain electrode of the N-type high voltage transistor $Tr_{NH}$.

In the illustrated example, a distance $R_{CSH}$ matches a distance in the X or Y direction from a central axis of the contact $CS_H$ functioning as a part of the gate electrode to a central axis of the contact $CS_H$ functioning as a part of the drain electrode. Also, the distance $R_{CSH}$ matches a distance in the X or Y direction from the central axis of the contact $CS_H$ functioning as the part of the gate electrode to a central axis of the contact $CS_H$ functioning as a part of the source electrode.

The N-type high voltage transistor $Tr_{NH}$ uses the surface of the semiconductor substrate 100 facing the gate electrode member 142 as a channel region. Further, a high impurity concentration region 148 is provided on the surface of the semiconductor substrate 100 at a connection portion with the contact $CS_H$. A low impurity concentration region 149 is provided on the surface of the semiconductor substrate 100 in a region (region not facing the gate electrode member 142) between the channel region and the high impurity concentration region 148. The high impurity concentration region 148 and the low impurity concentration region 149 contain, for example, N-type impurities such as phosphorus (P) or arsenic (As). An impurity concentration of the N-type impurities in the high impurity concentration region 148 is higher than an impurity concentration of the N-type impurities in the low impurity concentration region 149.

A length (gate length) in the Y direction of the gate electrode of the N-type high voltage transistor $Tr_{NH}$ is $W_H$, and a width (gate width) in the X direction of the gate electrode is $L_H$.

Structure of P-type High Voltage Transistor $Tr_{PH}$

The P-type high voltage transistor $Tr_{PH}$ is basically configured similarly to the N-type high voltage transistor $Tr_{PH}$, as illustrated in FIG. 13, for example. However, the P-type high voltage transistor Tr PH is provided not in the semiconductor substrate region 100S but in an N-type well region 100N. Also, instead of the high impurity concentration region 148, a high impurity concentration region 158 is provided on the surface of the semiconductor substrate 100 at a connection portion with the contact $CS_H$. Instead of the low impurity concentration region 149, a low impurity concentration region 159 is provided on the surface of the semiconductor substrate 100 in a region (region not facing the gate electrode member 142) between the channel region and the high impurity concentration region 158. The high impurity concentration region 158 and the low impurity concentration region 159 contain P-type impurities such as boron (B). An impurity concentration of the P-type impurities in the high impurity concentration region 158 is higher than an impurity concentration of the P-type impurities in the low impurity concentration region 159.

A length in the Y direction and a width in the X direction of the gate electrode of the P-type high voltage transistor $Tr_{PH}$ are the same or substantially the same as the length in the Y direction and the width in the X direction of the gate electrode of the N-type high voltage transistor $Tr_{NH}$.

Structure of N-type Low Voltage Transistor $Tr_{NL}$

The N-type low voltage transistor $Tr_{NL}$ is provided in a P-type well region 100P of the semiconductor substrate 100, as illustrated in FIG. 14, for example. The N-type low voltage transistor $Tr_{NL}$ includes a part of the P-type well region 100P, a gate insulating layer 241 such as silicon oxide ($SiO_2$) provided on the surface of the semiconductor substrate 100, a gate electrode member 242 such as polycrystalline silicon (Si) provided on an upper surface of the gate insulating layer 241, a gate electrode member 243 such as tungsten (W) provided on an upper surface of the gate electrode member 242, a cap insulating layer 244 such as silicon nitride ($Si_3N_4$) provided on an upper surface of the gate electrode member 243, and a side wall insulating layer 245 such as silicon nitride ($Si_3N_4$) provided on side surfaces of the gate electrode member 242, the gate electrode member 243, and the cap insulating layer 244 in the X direction or the Y direction.

In the illustrated example, a thickness $T_{241}$ matches a thickness of the gate insulating layer 241 in the Z direction. The thickness $T_{241}$ is smaller than the thickness $T_{141}$ (FIG. 12).

Also, the N-type low voltage transistor $Tr_{NL}$ includes a liner insulating layer 246 such as silicon oxide ($SiO_2$) and a liner insulating layer 247 such as silicon nitride ($Si_3N_4$) which are stacked on the surface of the semiconductor substrate 100, a side surface of the gate insulating layer 241 in the X or Y direction, a side surface of the sidewall insulating layer 245 in the X or Y direction, and an upper surface of the cap insulating layer 244.

Also, three contacts $CS_L$ extending in the Z direction are connected to the N-type low voltage transistor $Tr_{NL}$. The contact $CS_L$ may include, for example, a layered film of a barrier conductive film such as titanium nitride (TiN) and a metal film such as tungsten (W). One of the three contacts $CS_L$ is connected to an upper surface of the gate electrode member 243 through the liner insulating layer 247, the liner insulating layer 246, and the cap insulating layer 244, and functions as a part of the gate electrode of the N-type low voltage transistor $Tr_{NL}$. Remaining two of the three contacts $CS_L$ are connected to the surface of the semiconductor substrate 100 through the liner insulating layer 247 and the liner insulating layer 246, and function as a source electrode or a drain electrode of the N-type low voltage transistor $Tr_{NL}$.

In the illustrated example, a distance $R_{CSL}$ matches a distance in the X or Y direction from a central axis of the contact $CS_L$ functioning as a part of the gate electrode to a central axis of the contact $CS_L$ functioning as a part of the drain electrode. The distance $R_{CSL}$ matches a distance in the X or Y direction from the central axis of the contact $CS_L$ functioning as the part of the gate electrode to a central axis of the contact $CS_L$ functioning as a part of the source electrode. The distance $R_{CSL}$ is smaller than the distance $R_{CSH}$ (FIG. 12).

In addition, the N-type low voltage transistor $Tr_{NL}$ uses a part of the surface of the semiconductor substrate 100 facing the gate electrode member 242 as a channel region. A high impurity concentration region 248 is provided on the surface of the semiconductor substrate 100 in a region from a connection portion with the contact $CS_L$ to a surface facing the gate electrode member 242. The high impurity concentration region 248 contains, for example, N-type impurities such as phosphorus (P) or arsenic (As).

A length in the Y direction of the gate electrode of the N-type low voltage transistor $Tr_{NL}$ is $W_L$, and a width in the X direction of the gate electrode is $L_L$. The length $W_L$ in the Y direction of the gate electrode is smaller than the length $W_H$ (FIG. 12) in the Y direction of the gate electrode, and the width $L_L$ in the X direction of the gate electrode is smaller than the width $L_H$ in the X direction of the gate electrode.

Structure of P-type Low Voltage Transistor $Tr_{PL}$

The P-type low voltage transistor $Tr_{PL}$ is basically configured similarly to the N-type low voltage transistor $Tr_{NL}$, as illustrated in FIG. 15, for example. However, the P-type low voltage transistor $Tr_{PL}$ is provided not in the P-type well region 100P but in the N-type well region 100N. Instead of the high impurity concentration region 248, a high impurity concentration region 258 is provided in a region of the surface of the semiconductor substrate 100 from a connection portion with the contact $CS_L$ to a surface facing the gate electrode member 242. The high impurity concentration region 258 contains, for example, P-type impurities such as boron (B).

A length in the Y direction and a width in the X direction of the gate electrode of the P-type low voltage transistor $Tr_{PL}$ are the same or substantially the same as the length in the Y direction and the width in the X direction of the gate electrode of the N-type low voltage transistor $Tr_{NL}$.

Structure of N-type Ultra-Low Voltage Transistor $Tr_{NVL}$

The N-type ultra-low voltage transistor $Tr_{NVL}$ is basically configured similarly to the N-type low voltage transistor $Tr_{NL}$ illustrated in FIG. 14, as illustrated in FIG. 16, for example. A gate insulating layer 341, a gate electrode member 342, a gate electrode member 343, a cap insulating layer 344, and a side wall insulating layer 345 in the N-type ultra-low voltage transistor $Tr_{NVL}$ respectively correspond to the gate insulating layer 241, the gate electrode member 242, the gate electrode member 243, the cap insulating layer 244, and the side wall insulating layer 245 in the N-type low voltage transistor $Tr_{NL}$. A liner insulating layer 346 and a liner insulating layer 347 in the N-type ultra-low voltage transistor $Tr_{NVL}$ respectively correspond to the liner insulating layer 246 and the liner insulating layer 247 in the N-type low voltage transistor $Tr_{NL}$.

However, in the N-type ultra-low voltage transistor $Tr_{NVL}$, a high impurity concentration region 348 is provided in a region of the surface of the semiconductor substrate 100 from a connection portion with the contact $CS_L$ to a surface facing the gate electrode member 342. A first low impurity concentration region 349 is provided between the high impurity concentration region 348 and the channel region, in a partial region of the surface of the semiconductor substrate 100 facing the gate electrode member 342. A second low impurity concentration region 350 is provided in a region near the surface of the semiconductor substrate 100, which is closer to a back side of the semiconductor substrate 100 than the first low impurity concentration region 349. The high impurity concentration region 348 and the first low impurity concentration region 349 contain, for example, N-type impurities such as phosphorus (P) or arsenic (As). An impurity concentration in the first low impurity concentration region 349 is lower than that in the high impurity concentration region 348. The second low impurity concentration region 350 contains, for example, P-type impurities such as boron (B). The second low impurity concentration region 350 may be omitted.

In the illustrated example, a thickness $T_{341}$ matches a thickness of the gate insulating layer 341 in the Z direction. The thickness $T_{341}$ is smaller than the thickness $T_{241}$ (FIG. 14).

In the illustrated example, a distance $R_{CSVL}$ matches a distance in the X or Y direction from a central axis of the contact $CS_L$ functioning as a part of the gate electrode to a central axis of the contact $CS_L$ functioning as a part of the drain electrode. Also, the distance $R_{CSVL}$ matches a distance in the X or Y direction from the central axis of the contact $CS_L$ functioning as the part of the gate electrode to a central axis of the contact $CS_L$ functioning as a part of the source electrode. The distance $R_{CVSL}$ is smaller than the distance $R_{CSL}$ (FIG. 14).

A length in the Y direction of the gate electrode of the N-type ultra-low voltage transistor $Tr_{NVL}$ is $W_{VL}$, and a width in the X direction of the gate electrode is $L_{VL}$. The length $W_{VL}$ in the Y direction of the gate electrode is smaller than the length $W_L$ (FIG. 14) in the Y direction of the gate electrode, and the width $L_{VL}$ in the X direction of the gate electrode is smaller than the width $L_L$ in the X direction of the gate electrode.

Structure of P-type Ultra-Low Voltage Transistor $Tr_{PVL}$

The P-type ultra-low voltage transistor $Tr_{PVL}$ is basically configured similarly to the N-type ultra-low voltage transistor $Tr_{NVL}$, as illustrated in FIG. 17, for example. However, the P-type ultra-low voltage transistor $Tr_{PVL}$ is provided not in the P-type well region 100P but in the N-type well region 100N. Instead of the high impurity concentration region 348, a high impurity concentration region 358 is provided in a region of the surface of the semiconductor substrate 100 from a connection portion with the contact $CS_L$ to a surface facing the gate electrode member 342. Instead of the first low impurity concentration region 349, a first low impurity concentration region 359 is provided between the high impurity concentration region 358 and the channel region, in a partial region of the surface of the semiconductor substrate 100 facing the gate electrode member 342. Instead of the second low impurity concentration region 350, a second low impurity concentration region 360 is provided in a region near the surface of the semiconductor substrate 100, which is closer to a back side of the semiconductor substrate 100 than the first low impurity concentration region 359. The high impurity concentration region 358 and the first low impurity concentration region 359 contain, for example, P-type impurities such as boron (B). An impurity concentration in the first low impurity concentration region 359 is lower than that in the high impurity concentration region 358. The second low impurity concentration region 360 contains N-type impurities such as phosphorus (P) or arsenic (As). The second low impurity concentration region 360 may be omitted.

A length in the Y direction and a width in the X direction of the gate electrode of the P-type ultra-low voltage transistor $Tr_{PVL}$ are the same or substantially the same as the length in the Y direction and the width in the X direction of the gate electrode of the N-type ultra-low voltage transistor $Tr_{NVL}$.

The ultra-low voltage transistors $Tr_{NVL}$ and $Tr_{PVL}$ (FIGS. 16 and 17) have at least one of a smaller gate insulating layer (241 and 341) thickness, a smaller gate length, and a lower impurity concentration in the well region than the low voltage transistors $Tr_{NL}$ and $Tr_{PL}$ (FIGS. 14 and 15).

Operation

Program Operation

Figure 18:
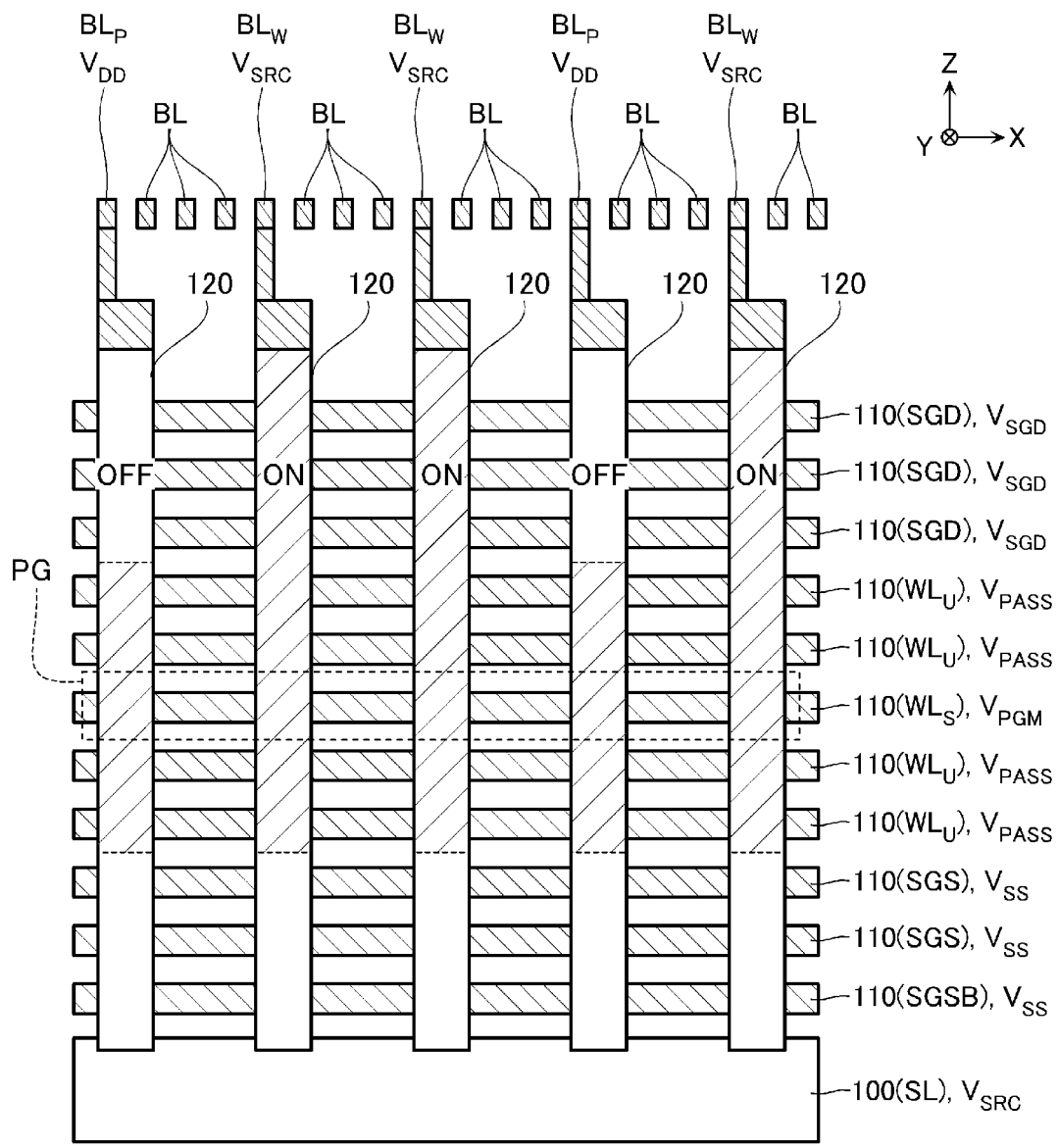
FIG. 18 is a schematic cross-sectional view of a part of the memory die for illustrating a program operation.

Next, a program operation for the memory cell MC will be described. FIG. 18 is a schematic cross-sectional view for illustrating the program operation. In the following description, the word lines WL as an operation target may be referred to as selected word lines $WL_S$, and the other word lines WL may be referred to as non-selected word lines $WL_U$. Further, in the following description, an example of executing a read operation on the memory cells MC (hereinafter, sometimes referred to as "selected memory cell MC" and referred to the other memory cells MC as "non-selected memory cell MC") connected to the selected word lines $WL_S$ among the plurality of memory cells MC in the string unit SU as an operation target will be described. In the following description, such a configuration including a plurality of selected memory cells MC may be referred to as a selected page portion PG.

In the program operation, the voltage $V_{SRC}$ is supplied to a bit line BL (hereinafter, referred to as a selected bit line $BL_W$) connected to the selected memory cell MC (hereinafter, referred to as a write memory cell MC) that is programmed. Further, the voltage $V_{DD}$ higher than the voltage $V_{SRC}$ is supplied to a bit line BL (hereinafter, referred to as a non-selected bit line $BL_P$) connected to the selected memory cell MC (hereinafter, referred to as a inhibited memory cell MC) that is not programmed. A voltage $V_{SGD}$ is also supplied to the drain-side select gate line SGD. For example, "L" is latched in the latch circuit SDL (FIG. 7) corresponding to the selected bit line $BL_W$, and "H" is latched in the latch circuit SDL (FIG. 7) corresponding to the non-selected bit line $BL_P$. Also, states of the signal lines STB, XXL, BLC, BLS, HLL, and BLX are respectively set to be "L, L, H, H, L, H".

The voltage $V_{SGD}$ is greater than the voltage $V_{SRC}$. Further, a voltage difference between the voltage $V_{SGD}$ and the voltage $V_{SRC}$ is greater than a threshold voltage when the drain-side select transistor STD functions as an NMOS transistor. Therefore, an electron channel is formed in the channel region of the drain-side select transistor STD connected to the selected bit line $BL_W$, and the voltage $V_{SRC}$ is transferred. Meanwhile, a voltage difference between the voltage $V_{SGD}$ and the voltage $V_{DD}$ is smaller than a threshold voltage when the drain-side select transistor STD functions as an NMOS transistor. Therefore, the drain-side select transistor STD connected to the non-selected bit line $BL_P$ goes into an OFF state.

Also, in the program operation, the voltage $V_{SRC}$ is supplied to the source line SL, and the ground voltage Vss is supplied to the source-side select gate lines SGS and SGSB. As a result, the source-side select transistors STS and STSB go into an OFF state.

In the program operation, a write pass voltage $V_{PASS}$ is supplied to the non-selected word line $WL_U$. A voltage difference between the write pass voltage $V_{PASS}$ and the voltage $V_{SRC}$ is greater than a threshold voltage when the memory cell MC functions as an NMOS transistor regardless of the data recorded in the memory cell MC. Therefore, an electron channel is formed in the channel region of the non-selected memory cell MC, and the voltage $V_{SRC}$ is transferred to the write memory cell MC.

Also, in the program operation, a program voltage $V_{PGM}$ is supplied to the selected word line $WL_S$. The program voltage $V_{PGM}$ is greater than the write pass voltage $V_{PASS}$.

Here, the voltage $V_{SRC}$ is supplied to the channel of the semiconductor pillar 120 (memory string MS) connected to the selected bit line $BL_W$. A relatively large electric field is generated between such a semiconductor pillar 120 and the selected word line $WL_S$. This causes electrons in the channel of the semiconductor pillar 120 to tunnel through the tunnel insulating film 131 (FIG. 9) into the charge storage film 132 (FIG. 9). This increases a threshold voltage of the write memory cell MC.

The channel of the semiconductor pillar 120 connected to the non-selected bit line $BL_P$ is in an electrically floating state, and the voltage of this channel is raised (boosted) to about the write pass voltage $V_{PASS}$ due to capacitive coupling with the non-selected word line $WL_U$. Between such a semiconductor pillar 120 and the selected word line $WL_S$, only an electric field smaller than the electric field described above is generated. Therefore, electrons in the channel of the semiconductor pillar 120 do not tunnel into the charge storage film 132 (FIG. 9). Therefore, a threshold voltage of the inhibited memory cell MC does not increase.

Adjustment of Threshold Voltage of Drain-side Select Transistor STD

As described above, selection of write/inhibition of the memory cell MC is executed by ON/OFF of the drain-side select transistor STD. However, the threshold voltage of the drain-side select transistor STD varies when the memory die MD is manufactured. Therefore, the ON/OFF of the drain-side select transistor STD may not be executed as expected. Therefore, the threshold voltage of the drain-side select transistor STD is adjusted before shipment of the memory die MD. In the following description, adjustment of the threshold voltage of the drain-side select transistor STD may be referred to as program operation for the drain-side select gate line SGD.

Selected Bit Line $BL_W$ and Non-selected Bit Line $BL_P$

Figure 19:
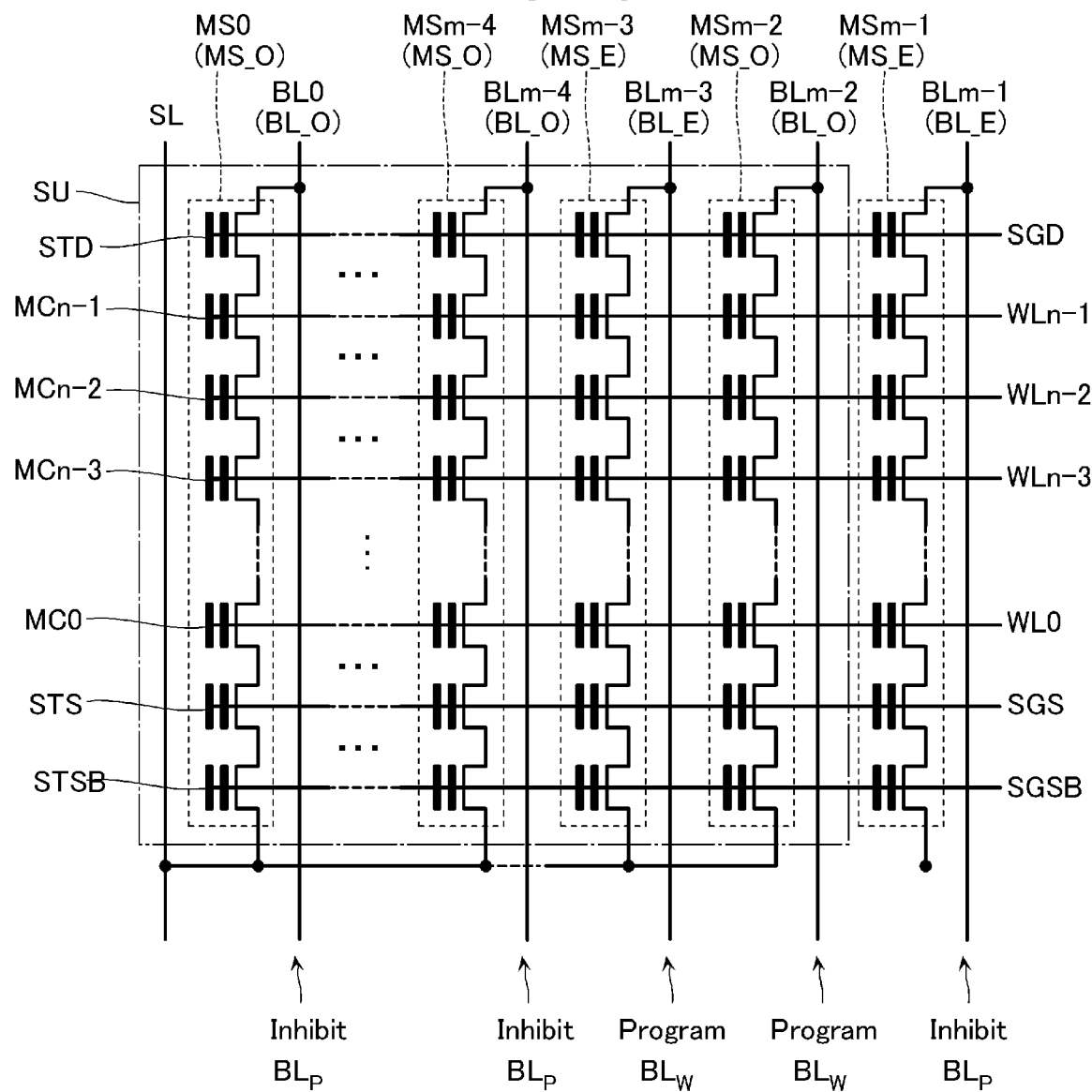
FIG. 19 is a schematic circuit diagram illustrating a configuration of a string unit in FIG. 5.

Next, a program operation for the drain-side select gate line SGD according to the present embodiment will be described. First, with reference to FIG. 19, the selected bit line $BL_W$ on which the program operation is performed and the non-selected bit line $BL_P$ for which the program operation is inhibited will be described. FIG. 19 is a schematic circuit diagram illustrating a configuration of the string unit SU in FIG. 5. The memory block BLK on which the program operation is performed may be referred to as a selected memory block BLK. Also, the memory block BLK for which the program operation is inhibited may be referred to as a non-selected memory block BLK.

The string unit SU according to the present embodiment is connected to n word lines WL0 to WLn-1 as illustrated in FIG. 19. n is an integer of 1 or more. The n word lines WL0 to WLn-1 are first to nth word lines WL counted in a direction from the source-side select gate line SGS to the drain-side select gate line SGD. Also, the n word lines WL0 to WLn-1 are respectively connected to the gate electrodes of first to nth memory cells MC0 to MCn-1 in the memory string MS.

The string unit SU according to the present embodiment is connected to m bit lines BL0 to BLm-1 as illustrated in FIG. 19. m is an integer of 1 or more. The m bit lines BL0 to BLm-1 are respectively connected to first to mth memory strings MS0 to MSm-1 in the string unit SU.

Odd-numbered bit lines BL0, BL2, . . . , BLm-4, and BLm-2 of the m bit lines BL0 to BLm-1 may be referred to as bit lines BL_O. Odd-numbered memory strings MS0, MS2, . . . , MSm-4, and MSm-2 connected to the odd-numbered bit lines BL0, BL2, . . . , BLm-4, and BLm-2 may be referred to as memory strings MS_O.

Even-numbered bit lines BL1, BL3, . . . , BLm-3, and BLm-1 of the m bit lines BL0 to BLm-1, may be referred to as bit lines BL_E. Even-numbered memory strings MS1, MS3, . . . , MSm-3, and MSm-1 connected to the even-numbered bit lines BL1, BL3, . . . , BLm-3, and BLm-1 may be referred to as memory strings MS_E.

For example, as illustrated in FIG. 19, it is assumed that the even-numbered bit line BLm-3 (BL_E) is the selected bit line $BL_W$ and the even-numbered bit line BLm-1 (BL_E) is the non-selected bit line $BL_P$. Although not illustrated in FIG. 19, it is assumed that the even-numbered bit line BLm-5 (BL_E) is also the non-selected bit line $BL_P$. When the even-numbered bit line BLm-3 (BL_E) is subjected to a program operation, two odd-numbered bit lines BLm-4 (BL_O) and BLm-2 (BL_O) adjacent to the bit line BLm-3 (BL_E) are inhibited from the program operation.

It is also assumed that the odd-numbered bit line BLm-2 (BL_O) is the selected bit line $BL_W$ and the odd-numbered bit line BLm-4 (BL_O) is the non-selected bit line $BL_P$. When the odd-numbered bit line BLm-2 (BL_O) is subjected to a program operation, two even-numbered bit lines BLm-3 (BL_E) and BLm-1 (BL_E) adjacent to the bit line BLm-2 (BL_O) are inhibited from the program operation.

In the present embodiment, after the program operation of the drain-side select transistor STD connected to the even-numbered bit line BLm-3 (BL_E) is performed, the program operation of the drain-side select transistor STD connected to the odd-numbered bit line BLm-2 (BL_O) is performed. However, after the program operation of the drain-side select transistor STD connected to the odd-numbered bit line BLm-2 (BL_O) is performed, the program operation of the drain-side select transistor STD connected to the even-numbered bit line BLm-3 (BL_E) may be performed.

Program Operation for Drain-Side Select Gate Line SGD

Figure 20:
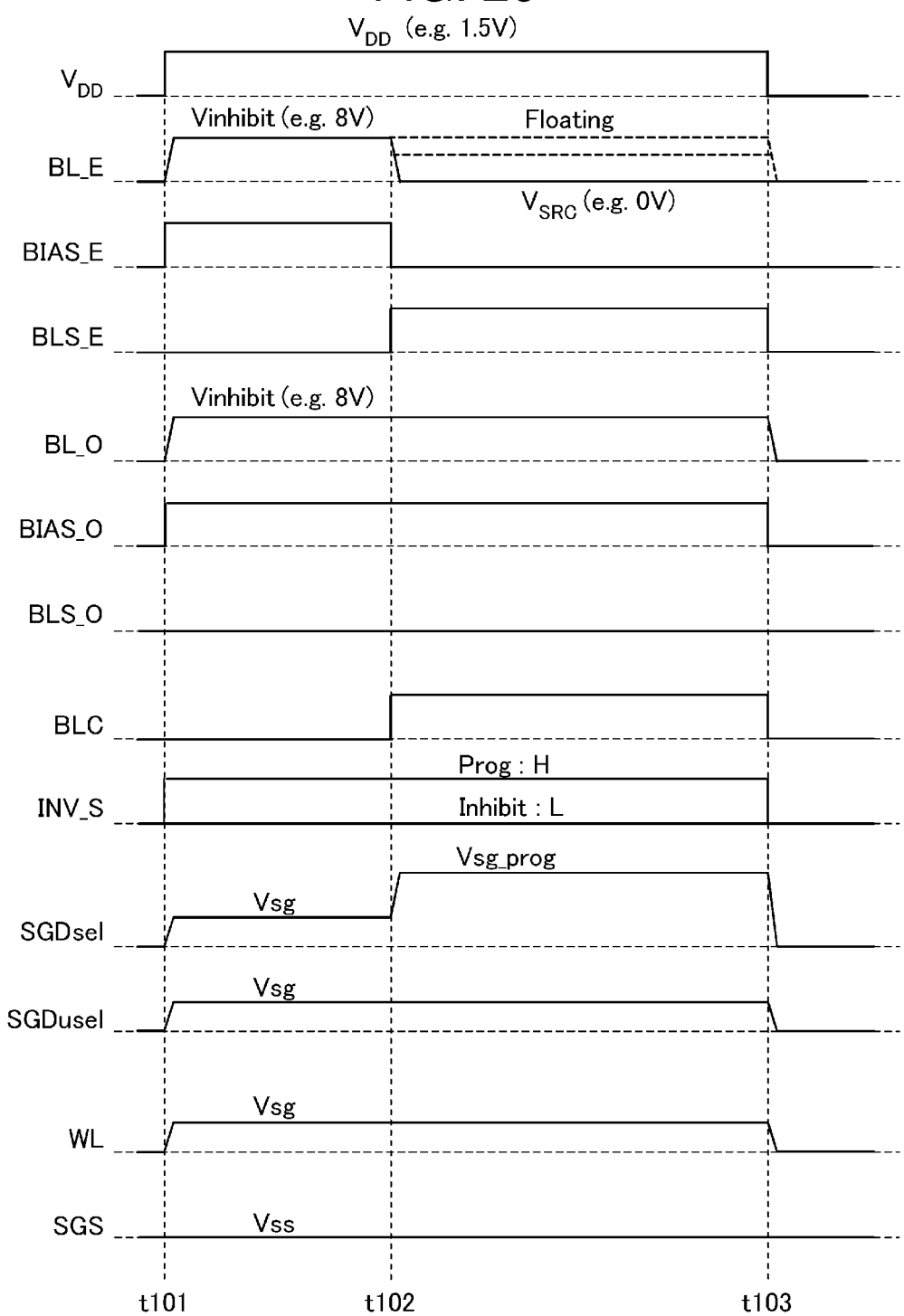
FIG. 20 is a schematic waveform diagram for illustrating a program operation for a drain-side select gate line according to a first embodiment.

Next, the program operation for the drain-side select gate line SGD will be described. FIG. 20 is a schematic waveform diagram for illustrating the program operation for the drain-side select gate line SGD according to the first embodiment. FIGS. 21 to 26 are schematic circuit diagrams of the sense amplifier unit SAU for illustrating the program operation for the drain-side select gate line SGD according to the first embodiment.

Figure 21:
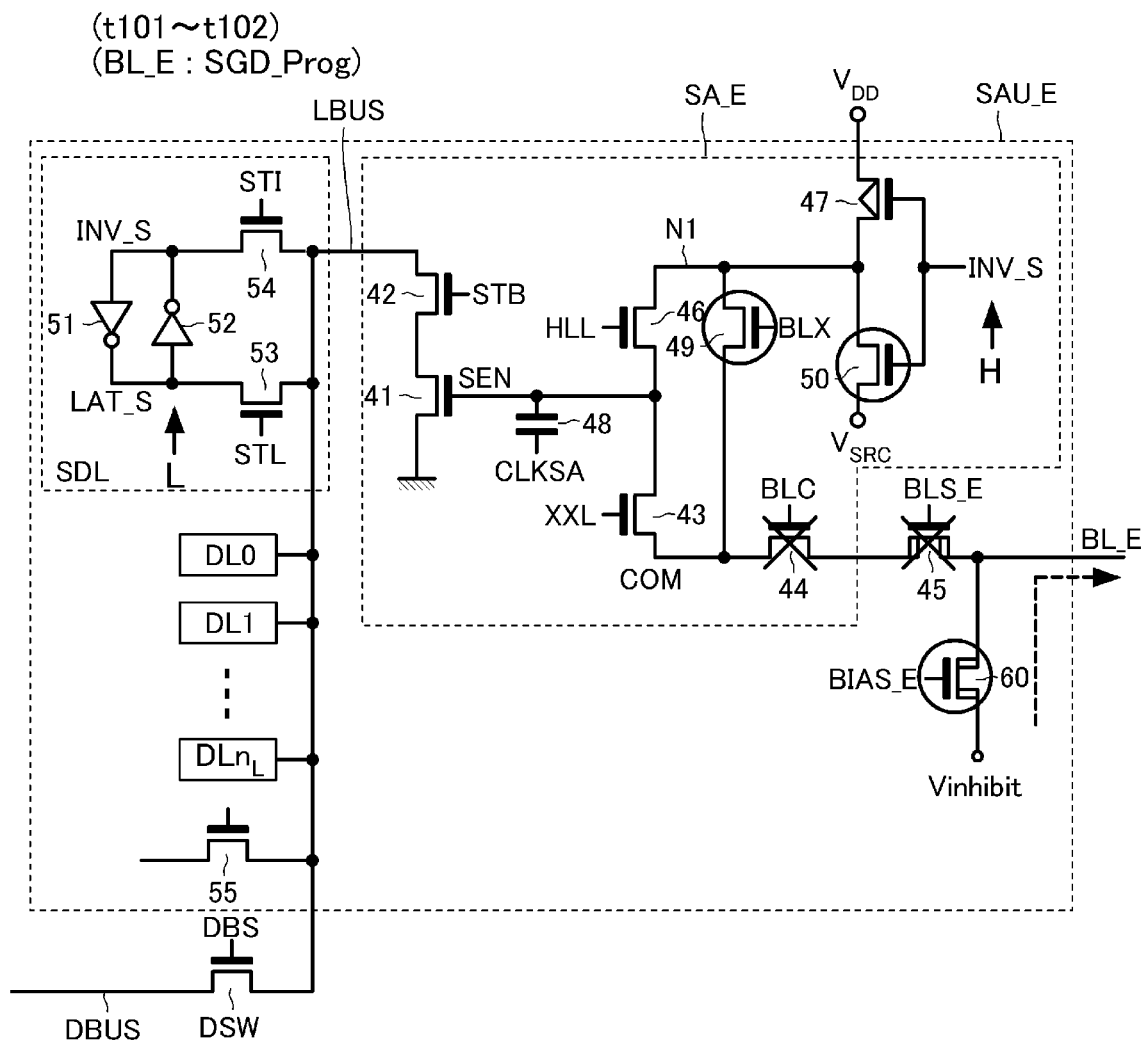
FIGS. 21-26 are schematic circuit diagrams of the sense amplifier unit that illustrate the program operation for the drain-side select gate line according to the first embodiment.
Figure 22:
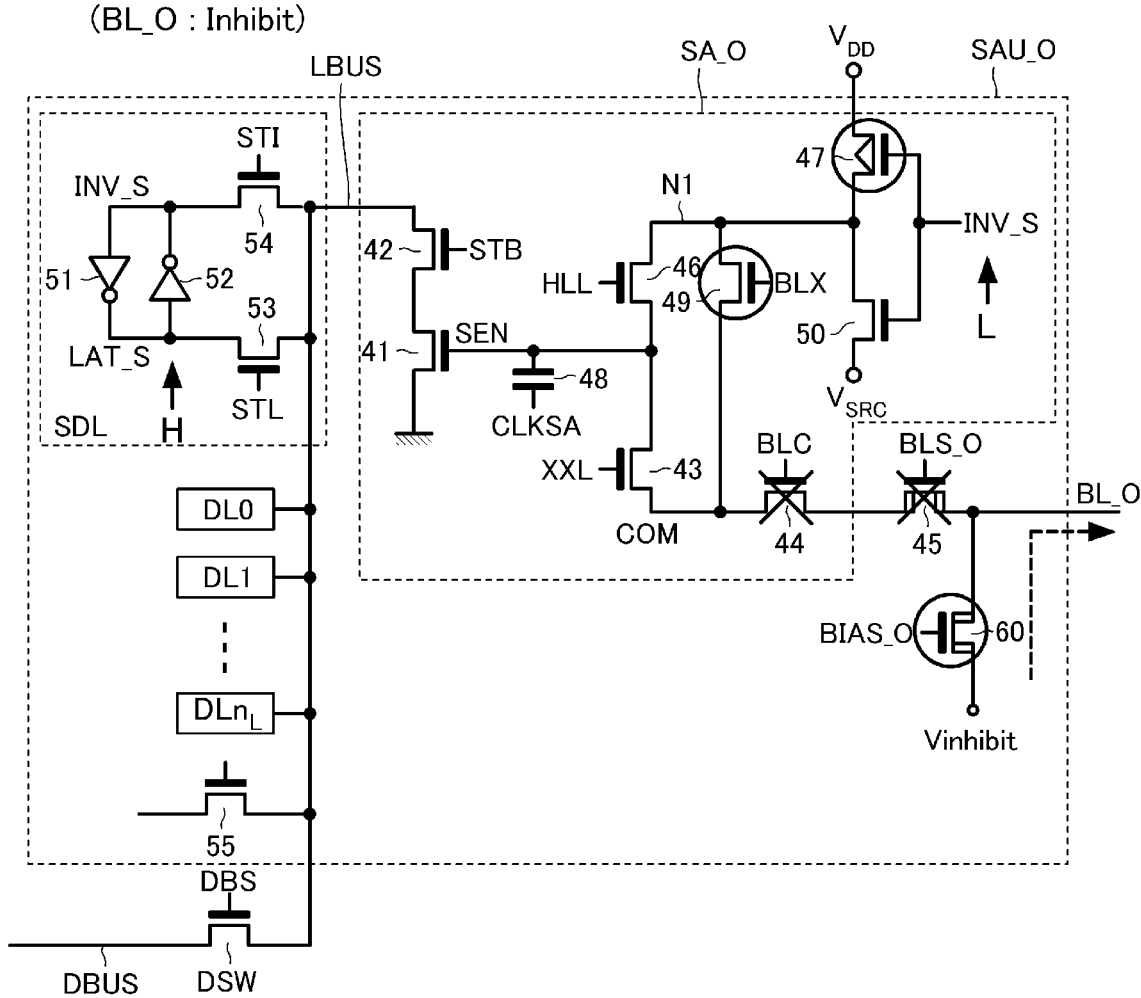
Figure 23:
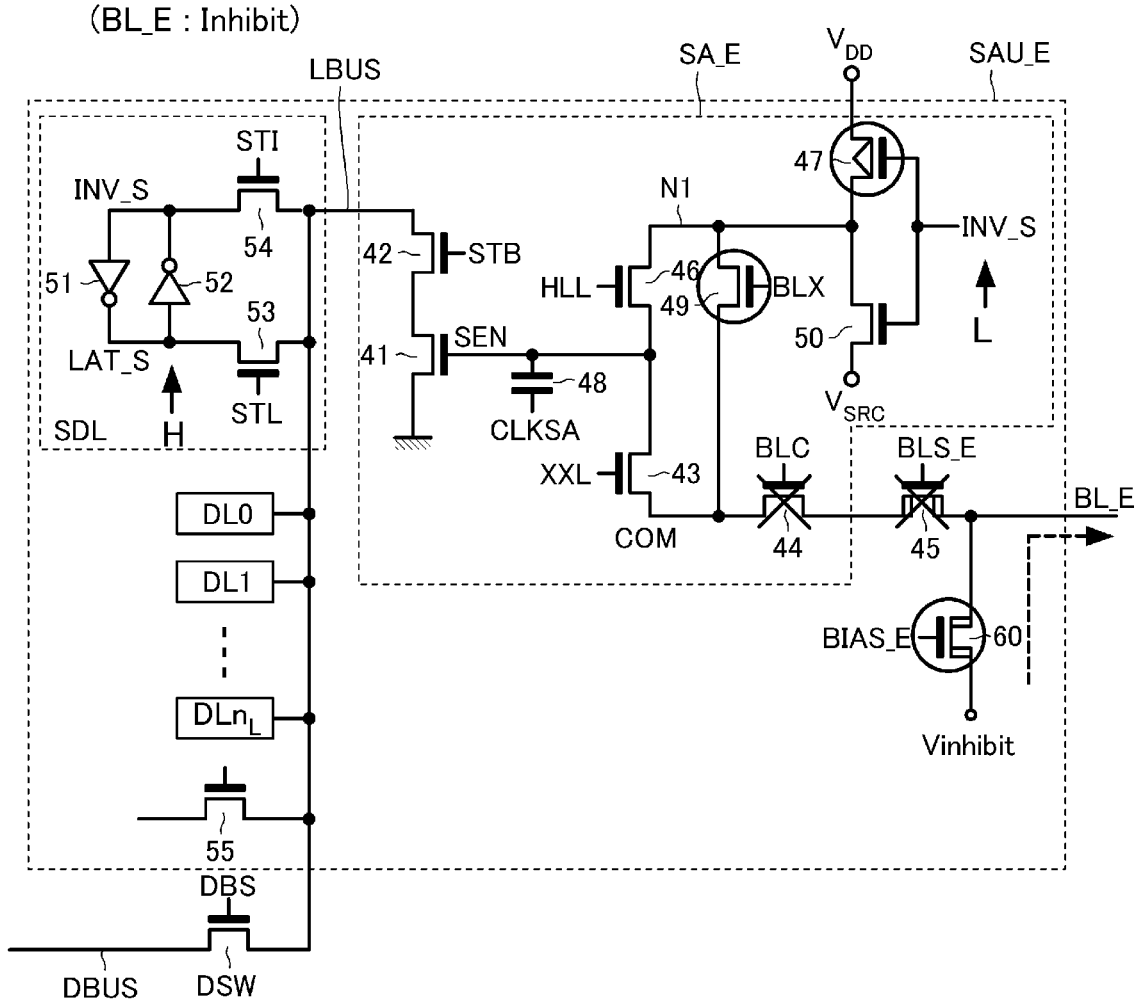
Figure 24:
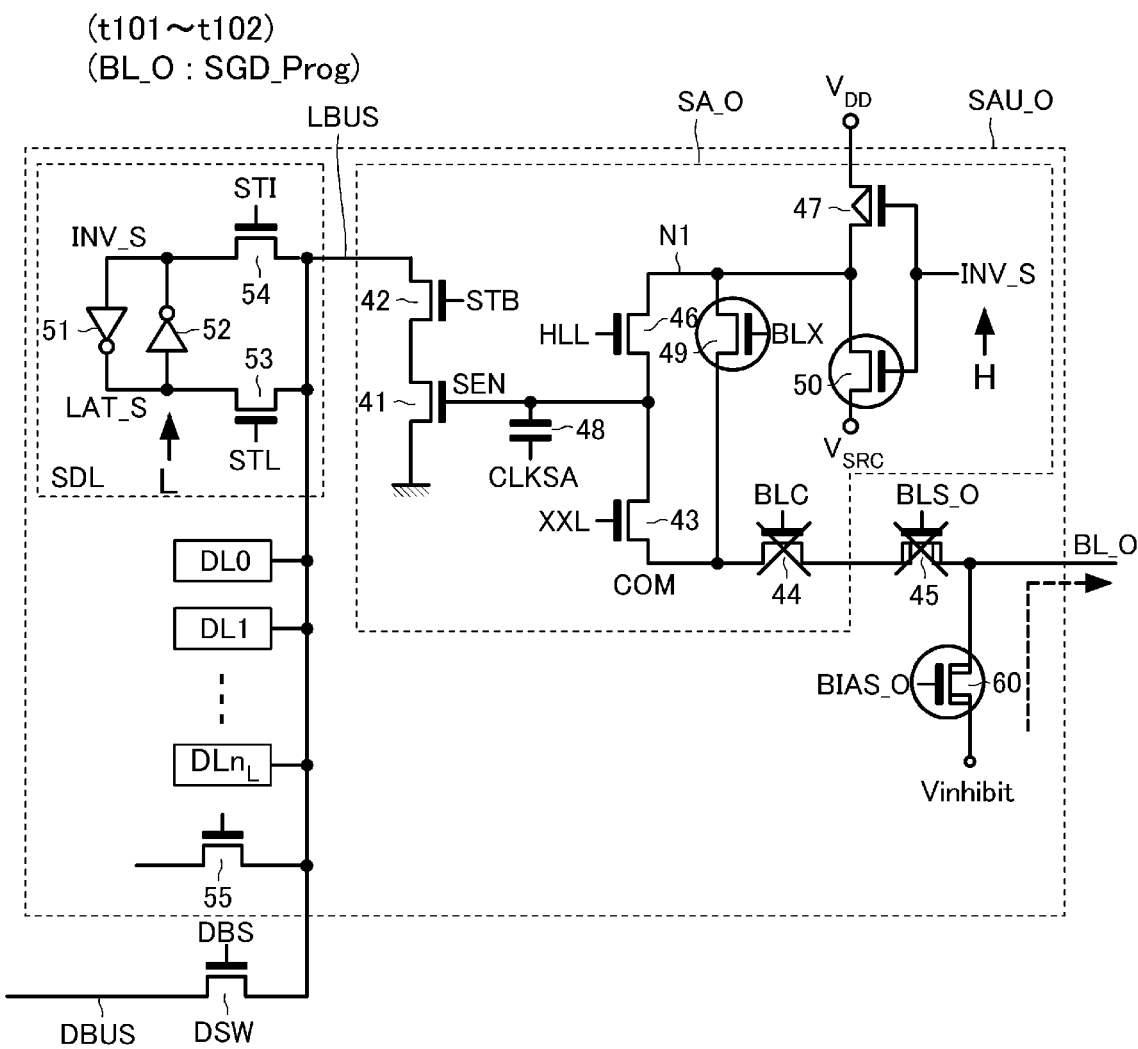

FIG. 21 is a schematic circuit diagram of the sense amplifier unit SAU_E connected to the bit line BL_E (BLm-3) as a program operation target at timings t101 to t102 in FIG. 20. FIG. 22 is a schematic circuit diagram of the sense amplifier unit SAU_O connected to the bit line BL_O (BLm-4) for which the program operation is inhibited at the timings t101 to t102 in FIG. FIG. 23 is a schematic circuit diagram of the sense amplifier unit SAU_E connected to the bit line BL_E (BLm-1) for which the program operation is inhibited at the timings t101 to t102 in FIG. 20. FIG. 24 is a schematic circuit diagram of the sense amplifier unit SAU_O connected to the bit line BL_O (BLm-2) as a program operation target at the timings t101 to t102 in FIG. 20.

Figure 25:
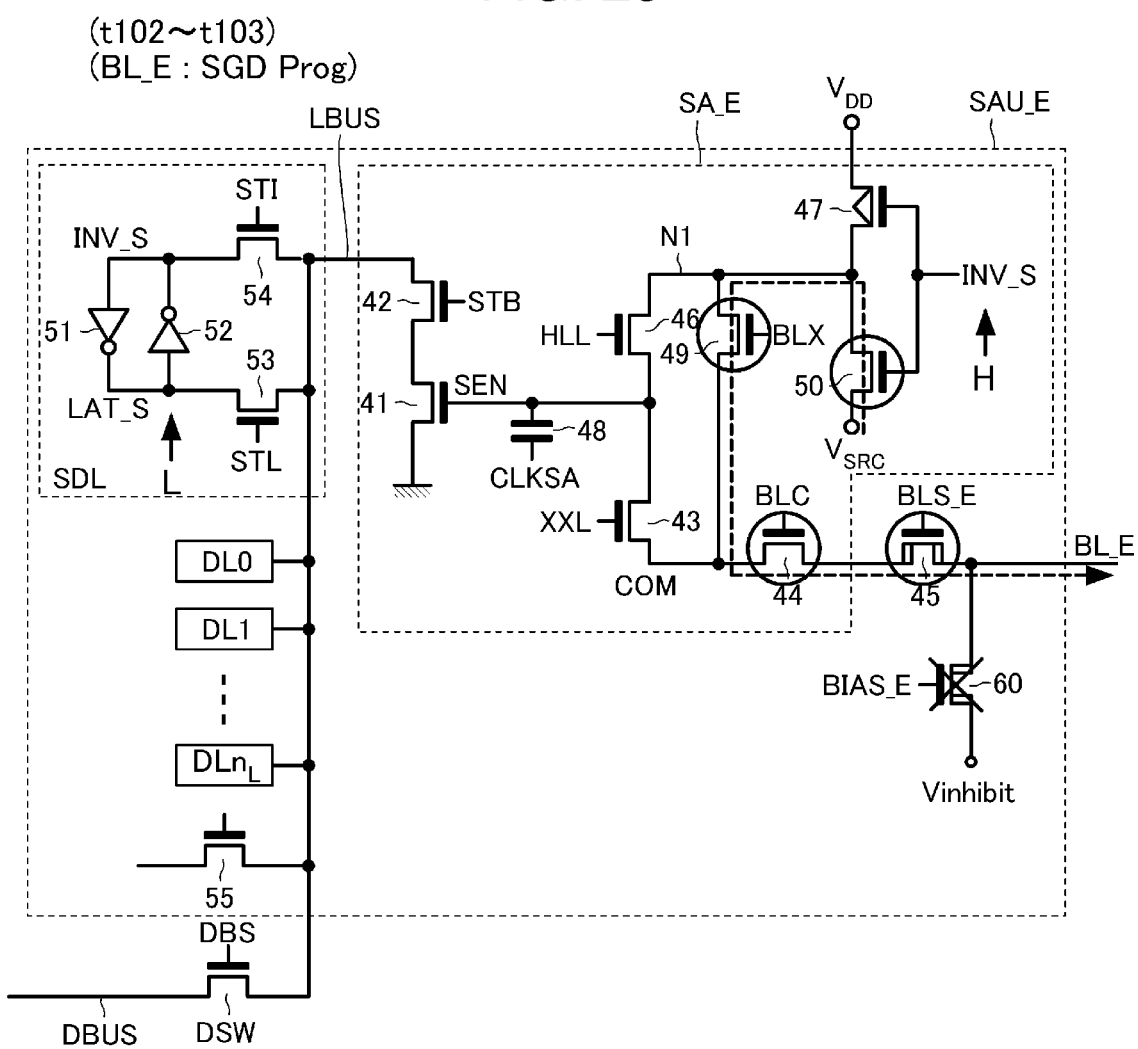
Figure 26:
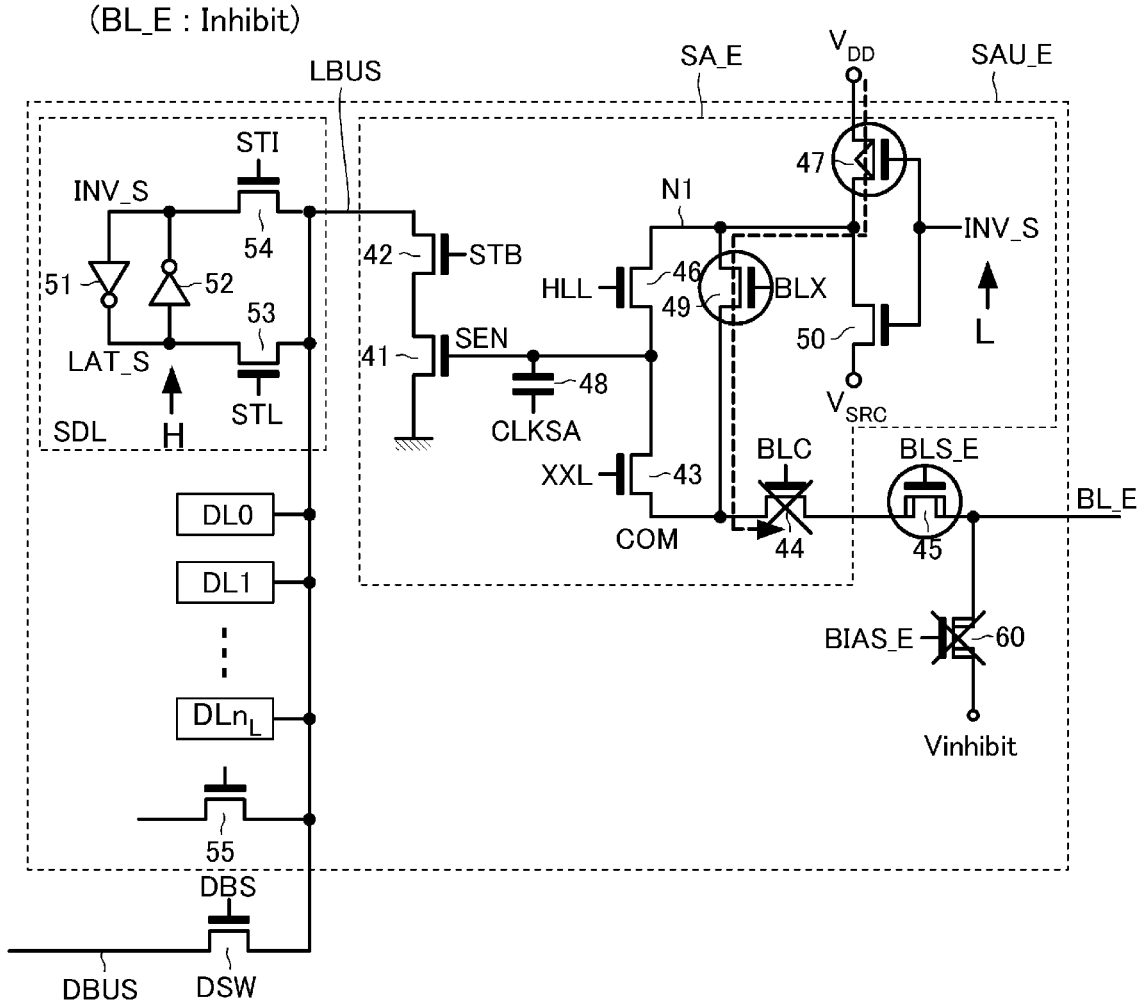

FIG. 25 is a schematic circuit diagram of the sense amplifier unit SAU_E connected to the bit line BL_E (BLm-3) as a program operation target at timings t102 to t103 in FIG. 20. FIG. 26 is a schematic circuit diagram of the sense amplifier unit SAU_E connected to the bit line BL_E (BLm-1) for which the program operation is inhibited at the timings t102 to t103 in FIG.

A schematic circuit diagram of the sense amplifier unit SAU_O connected to the bit line BL_O (BLm-4) for which the program operation is inhibited at the timings t102 to t103 is similar to FIG. 22. Also, a schematic circuit diagram of the sense amplifier unit SAU_O connected to the bit line BL_O (BLm-2) as a program operation target at the timings t101 to t102 is similar to FIG. 24. Therefore, these figures are omitted.

At the timings t101 to t103 in FIG. 20, the voltage $V_{DD}$ is supplied from the voltage generation circuit VG (FIG. 4) to a voltage input terminal of the sense amplifier unit SAU. The voltage $V_{DD}$ is, for example, 1.5 V.

Also, at the timing t101, by changing the signal line BIAS_E of the sense amplifier unit SAU_E corresponding to the bit line BL_E (BLm-3 and BLm-1) from the "L" level to the "H" level, the high breakdown voltage transistor 60 goes into an ON state as illustrated in FIGS. 21 and 23. The ON state of the high breakdown voltage transistor 60 continues during a period from the timing t101 to the timing t102. In addition, "O" in the drawing indicates that the state is in an ON state. Also, at the timing t101, the signal line BLS_E is at the "L" level, and the high breakdown voltage transistor 45 is in an OFF state as illustrated in FIGS. 21 and 23. The OFF state of the high breakdown voltage transistor 45 continues during the period from the timing t101 to the timing t102. In addition, "X" in the drawing indicates an OFF state. At the timings t101 to t102, the high breakdown voltage transistor 60 goes into an ON state, thereby conducting the bit line BL_E (BLm-3 and BLm-1) and the voltage supply line. As a result, the voltage Vinhibit from the voltage generation circuit VG is supplied to the bit line BL_E (BLm-3 and BLm-1) at the timings t101 to t102. The voltage Vinhibit is, for example, 8 V.

Thus, the bit lines BLm-3 and BLm-1 are charged by the voltage Vinhibit supplied via the high breakdown voltage transistor 60.

In the sense amplifier unit SAU_E connected to the bit line BLm-3 in FIG. 21, "L" is latched in the latch circuit SDL, and the node INV_S is at "H". Meanwhile, in the sense amplifier unit SAU_E connected to the bit line BLm-1 in FIG. 23, "H" is latched in the latch circuit SDL, and the node INV_S is at "L".

Also, at the timing t101, by changing the signal line BIAS_O of the sense amplifier unit SAU_E corresponding to the bit line BL_O (BLm-4 and BLm-2) from the "L" level to the "H" level, the high breakdown voltage transistor 60 goes into the ON state as illustrated in FIGS. 22 and 24. The ON state of the high breakdown voltage transistor 60 continues during a period from the timing t101 to the timing t102. Further, at the timing t101, the signal line BLS_O is at the "L" level, and the high breakdown voltage transistor 45 is in an OFF state as illustrated in FIGS. 22 and 24. The OFF state of the high breakdown voltage transistor 45 continues during the period from the timing t101 to the timing t102. At the timings t101 to t102, the high breakdown voltage transistor 60 goes into the ON state, thereby conducting the bit line BL_O (BLm-4 and BLm-2) and the voltage supply line. As a result, the voltage Vinhibit from the voltage generation circuit VG is supplied to the bit line BL_O (BLm-4 and BLm-2) at the timings t101 to t102.

Thus, the bit lines BLm-4 and BLm-2 are charged by the voltage Vinhibit supplied via the high breakdown voltage transistor 60.

In the sense amplifier unit SAU_O connected to the bit line BLm-4 in FIG. 22, "H" is latched in the latch circuit SDL, and the node INV_S is at "L". Meanwhile, in the sense amplifier unit SAU_O connected to the bit line BLm-2 in FIG. 24, "L" is latched in the latch circuit SDL, and the node INV_S is at "H".

Further, as illustrated in FIG. 20, at the timings t101 to t102, the signal line BLC is at the "L" level and the clamp transistor 44 is in an OFF state.

Also, at the timings t101 to t102, the drain-side select gate line SGD (denoted as "SGDsel" in FIG. 20) of the selected memory block BLK is supplied with a voltage Vsg. The voltage Vsg is higher than the ground voltage Vss and lower than the write pass voltage $V_{PASS}$.

At the timings t101 to t102, the drain-side select gate line SGD (denoted as "SGDusel" in FIG. 20) of the non-selected memory block BLK and the word line WL are also supplied with the voltage Vsg. Further, the ground voltage Vss is supplied to the source-side select gate line SGS.

At the timing t102, by changing the signal line BIAS_E of the sense amplifier unit SAU_E corresponding to the bit line BL_E (BLm-3) from the "H" level to the "L" level, the high breakdown voltage transistor 60 goes into the OFF state as illustrated in FIG. 25. The OFF state of the high breakdown voltage transistor 60 continues during a period from the timing t102 to the timing t103. In addition, the high breakdown voltage transistor 45 goes into an ON state as illustrated in FIG. 25 by changing the signal line BLS_E from the "L" level to the "H" level. The ON state of the high breakdown voltage transistor 45 continues during the period from the timing t102 to the timing t103. At the timing t102, the signal line BLC changes from the "L" level to the "H" level.

Here, as illustrated in FIG. 25, "L" is latched in the latch circuit SDL corresponding to the bit line BLm-3, and the node INV_S is at "H", so the charging transistor 47 goes into an OFF state and the discharging transistor 50 goes into an ON state. Further, the charging transistor 49 is in an ON state. An "H" level voltage is applied to the gate electrode of the clamp transistor 44, and the voltage $V_{SRC}$ is applied to the source terminal of the clamp transistor 44 via the discharging transistor 50 and charging transistor 49. In this case, since the voltage between the gate electrode and the source terminal of the clamp transistor 44 is higher than a threshold voltage of the clamp transistor 44, the clamp transistor 44 goes into an ON state. As a result, the voltage supply line to which the voltage $V_{SRC}$ is supplied and the bit line BL_E (BLm-3) are conducted, and the voltage $V_{SRC}$ is supplied to the bit line BL_E (BLm-3). The voltage $V_{SRC}$ is, for example, 0 V.

At the timing t102, by changing the signal line BIAS_E of the sense amplifier unit SAU_E corresponding to the bit line BL_E (BLm-1) the "H" level to the "L" level, the high breakdown voltage transistor 60 goes into an OFF state as illustrated in FIG. 26. The OFF state of the high breakdown voltage transistor 60 continues during a period from the timing t102 to the timing t103. In addition, the high breakdown voltage transistor 45 goes into an "ON" state as illustrated in FIG. 26 by changing the signal line BLS_E from the "L" level to the "H" level. The ON state of the high breakdown voltage transistor 45 continues during the period from the timing t102 to the timing t103. At the timing t102, the signal line BLC changes from the "L" level to the "H" level.

Here, as illustrated in FIG. 26, "H" is latched in the latch circuit SDL corresponding to the bit line BLm-1, and the node INV_S is at "L", so the charging transistor 47 goes into the "ON" state and the discharging transistor 50 goes into the "OFF" state. The charging transistor 49 is in the ON state. Further, the voltage of signal line BLC at the "H" level is applied to the gate electrode of the clamp transistor 44, and the voltage $V_{DD}$ is applied to the source terminal/drain terminal of the clamp transistor 44 via the charging transistors 47 and 49. In this case, since the voltage between the gate electrode and the source terminal of the clamp transistor 44 is lower than the threshold voltage of the clamp transistor 44, the clamp transistor 44 goes into the OFF state. As a result, the bit line BL_E (BLm-1) is in a floating state. In this case, the voltage of the bit line BL_E (BLm-1) rises to a voltage between the voltage Vinhibit and the voltage $V_{SRC}$ due to capacitive coupling with the bit line BL_O (BLm-2) (FIG. 20).

Thus, since the bit line BL_E (BLm-1) is maintained at a high voltage, a voltage difference between the gate electrode of the drain-side select transistor STD connected to the bit line BL_O (BLm-1) and the semiconductor pillar 120 becomes smaller. As a result, the program operation for the drain-side select transistor STD is inhibited.

As illustrated in FIG. 20, at the timings t102 to t103, a program voltage Vsg_prog is supplied to the drain-side select gate line SGDsel of the selected memory block BLK. The program voltage Vsg_grog is higher than the voltage Vsg.

At the timings t102 to t103, the voltage Vsg is supplied to the drain-side select gate line SGDusel of the non-selected memory block BLK and the word line WL. Also, the ground voltage Vss is supplied to the source-side select gate line SGS.

Such control causes a large voltage difference between the semiconductor pillar 120 and the gate electrode of the drain-side select transistor STD connected to the selected bit line $BL_W$ (BLm-3) in the selected memory block BLK. As a result, the program operation for the drain-side select transistor STD is executed.

The bit lines BLm-4 and BLm-2 (BL_O) are supplied with the voltage Vinhibit via the high breakdown voltage transistor 60 over a period from the timing t101 to the timing t103 (see FIGS. 22 and 24). Accordingly, the bit lines BLm-4 and BLm-2 (BL_O) serve to shield the bit line BLm-3 (BL_E).

Comparative Example

Next, a semiconductor storage device according to a comparative example will be described.

In the semiconductor storage device according to the first embodiment, as described with reference to FIG. 6, of the signal lines BLS, the signal line BLS (signal line BLS_O) corresponding to the odd-numbered sense amplifier unit SAU_O and the signal line BLS (signal line BLS_E) corresponding to the even-numbered sense amplifier unit SAU_E are configured to be independently controllable. Similarly, of the signal lines BIAS, the signal lines BIAS (signal line BIAS_O) corresponding to the odd-numbered sense amplifier unit SAU_O and the signal lines BIAS (signal line BIAS_E) corresponding to the even-numbered sense amplifier unit SAU_E are configured to be independently controllable. Meanwhile, in the semiconductor storage device according to the comparative example, all the signal lines BLS are controlled in unison. Similarly, all the signal lines BIAS are controlled in unison.

Further, in the semiconductor storage device according to the first embodiment, the latch circuit SDL described with reference to FIG. 7 is configured with the ultra-low voltage transistors $Tr_{PVL}$ and $Tr_{NVL}$ described with reference to FIGS. 16 and 17. Meanwhile, in the semiconductor storage device according to the comparative example, the latch circuit SDL is configured with the low voltage transistors $Tr_{PL}$ and $Tr_{NL}$ described with reference to FIGS. 16 and 17.

Figure 27:
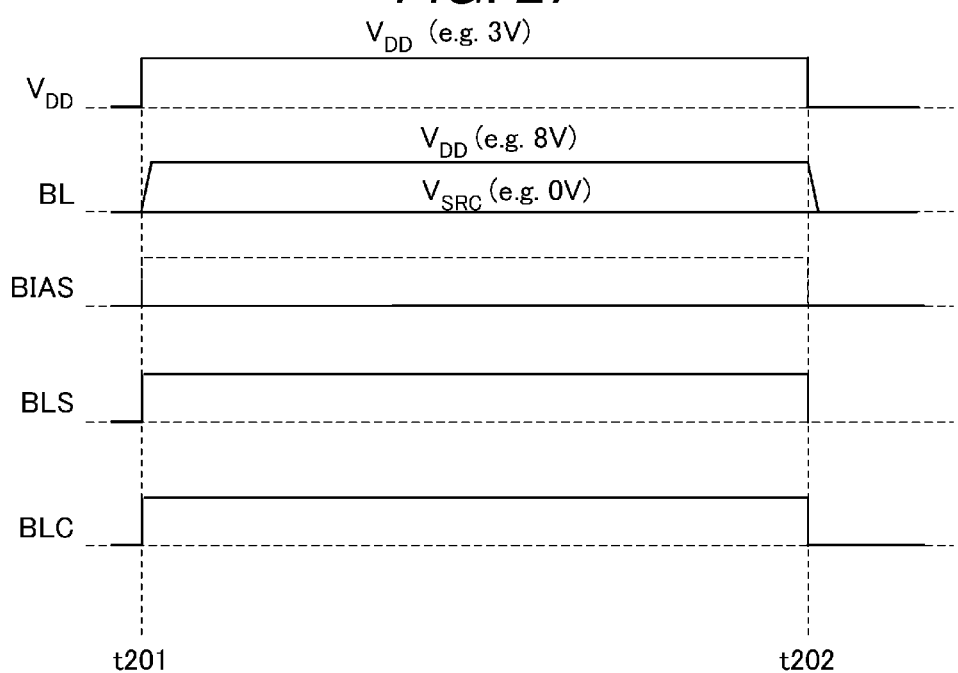
FIG. 27 is a schematic waveform diagram for illustrating a program operation for a drain-side select gate line according to a comparative example.
Figure 28:
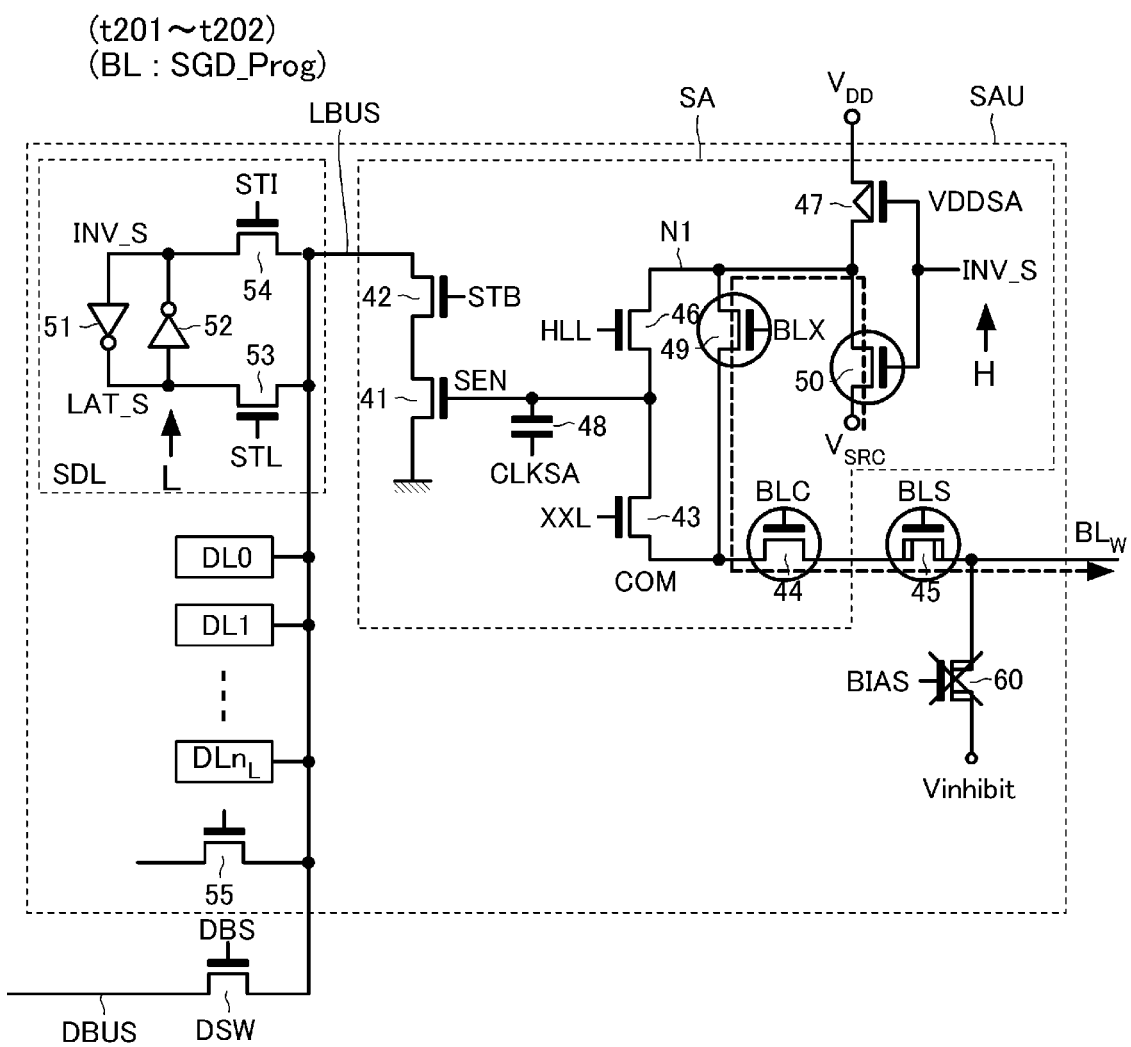
FIGS. 28-29 are schematic circuit diagrams of a sense amplifier unit that illustrate the program operation for the drain-side select gate line according to the comparative example.
Figure 29:
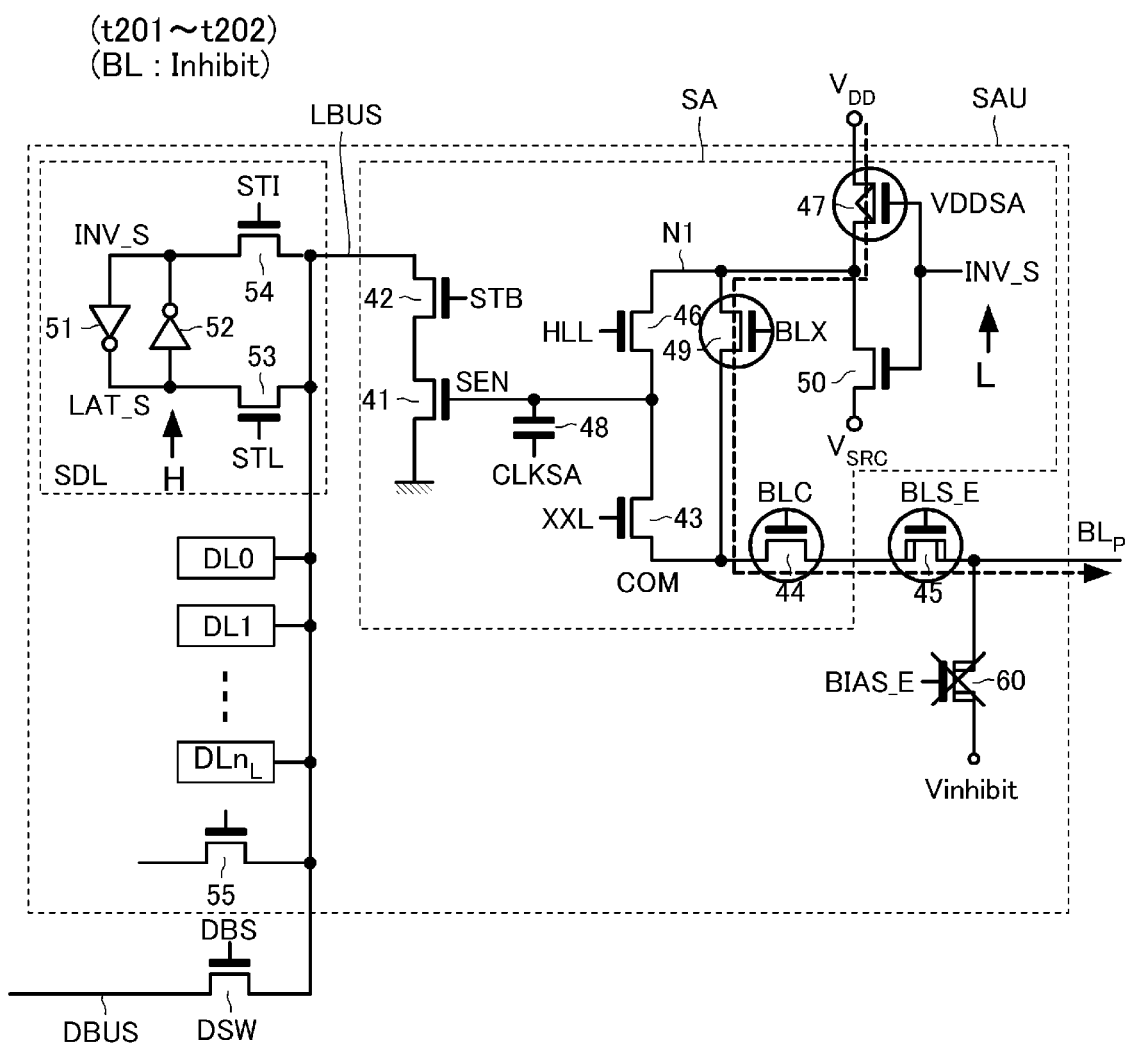

Next, a program operation for the drain-side select gate line SGD according to the comparative example will be described. FIG. 27 is a schematic waveform diagram for illustrating the program operation for the drain-side select gate line SGD according to the comparative example. FIGS. 28 and 29 are schematic circuit diagrams of the sense amplifier unit SAU for illustrating the program operation for the drain-side select gate line SGD according to the comparative example. The sense amplifier unit SAU in FIG. 28 is connected to the selected bit line $BL_W$. The sense amplifier unit SAU in FIG. 29 is connected to the non-selected bit line $BL_P$. The configuration of the sense amplifier unit SAU is basically the same as the configuration described with reference to FIG. 7.

At timings t201 to t202 in FIG. 27, the voltage $V_{DD}$ is supplied from the voltage generation circuit VG to a voltage input terminal of the sense amplifier unit SAU. The voltage $V_{DD}$ is, for example, 3 V.

Also, at the timing t201, the signal line BIAS of the sense amplifier unit SAU in FIG. 28 is at the "L" level, and the high breakdown voltage transistor 60 goes into the OFF state. In addition, the high breakdown voltage transistor 45 goes into the ON state by changing the signal line BLS from the "L" level to the "H" level. The clamp transistor 44 goes into the ON state by changing the signal line BLC from the "L" level to the "H" level. As illustrated in FIG. 28, "L" is latched in the latch circuit SDL corresponding to the selected bit line $BL_W$, and the node INV_S is at "H", and thus the charging transistor 47 goes into the OFF state and the discharging transistor 50 goes into the ON state. Further, the charging transistor 49 is in the ON state. Therefore, the voltage $V_{SRC}$ is supplied to the selected bit line $BL_W$ via the discharging transistor 50, the charging transistor 49, the clamp transistor 44, and the high breakdown voltage transistor 45.

Also, at the timing t201, the signal line BIAS of the sense amplifier unit SAU in FIG. 29 is at the "L" level, and the high breakdown voltage transistor 60 goes into the OFF state. In addition, the high breakdown voltage transistor 45 goes into the ON state by changing the signal line BLS from the "L" level to the "H" level. The clamp transistor 44 goes into the ON state by changing the signal line BLC from the "L" level to the "H" level. As illustrated in FIG. 29, "H" is latched in the latch circuit SDL corresponding to the non-selected bit line $BL_P$ and the node INV_S is at "L", and thus the charging transistor 47 goes into the ON state and the discharging transistor 50 goes into the OFF state. Further, the charging transistor 49 is in the ON state. Therefore, the voltage $V_{DD}$ is supplied to the non-selected bit line $BL_P$ via the charging transistor 47, the charging transistor 49, the clamp transistor 44, and the high breakdown voltage transistor 45.

Effect

As described with reference to FIG. 18, in the program operation for the memory cell MC, by supplying the voltage $V_{SRC}$ to the non-selected bit line and supplying the voltage $V_{SGD}$ to the drain-side select gate line SGD, the drain-side select transistor STD connected to the non-selected bit line $BL_P$ is in the OFF state (cut off). Further, by supplying the write pass voltage $V_{PASS}$ to the non-selected word line $WL_U$, the voltage of the channel of the semiconductor pillar 120 connected to the non-selected bit line $BL_P$ is raised (boosted) to about the write pass voltage $V_{PASS}$ to reduce the voltage difference from the program voltage $V_{PGM}$. This prevents fluctuations in the threshold voltage of the inhibited memory cells MC.

The drain-side select gate line SGD is provided above the word line WL. Therefore, in the program operation for the drain-side select gate line SGD, the drain-side select transistor STD connected to the non-selected bit line $BL_P$ cannot be cut off to raise (boost) the voltage of the channel of the semiconductor pillar 120.

Therefore, in the program operation for the drain-side select gate line SGD according to the comparative example, for example, by setting the voltage $V_{DD}$ to a relatively high voltage (for example, about 3 V), a high voltage can be supplied to the non-selected bit line $BL_P$. As a result, the voltage difference between the voltage $V_{DD}$ of the non-selected bit line $BL_P$ and the program voltage supplied to the drain-side select gate line SGD is reduced, and thus the state can be in a program inhibition state.

However, in the program operation for the drain-side select gate line SGD according to the comparative example, as described above, a relatively high voltage (for example, 3 V) is supplied as the voltage $V_{DD}$ to the source terminal of the charging transistor 47. Therefore, as described with reference to FIG. 28, in the sense amplifier circuit SA corresponding to the selected bit line $BL_W$, in order to cause the state of the charging transistor 47 to be in the OFF state, it is necessary to supply a relatively high voltage to the gate electrode of the charging transistor 47 as well. For this purpose, it is necessary to supply this relatively high voltage from the latch circuit SDL connected to the gate electrode of the charging transistor 47. Therefore, in order to perform the program operation for the drain-side select gate line SGD according to the comparative example, the latch circuit SDL of the sense amplifier unit SAU cannot be configured with the ultra-low voltage transistors $Tr_{NVL}$ and $Tr_{PVL}$ (FIGS. 16 and 17), and is configured with the low voltage transistors $Tr_{NL}$ and $Tr_{PL}$ (FIGS. 14 and 15).

Figure 30:
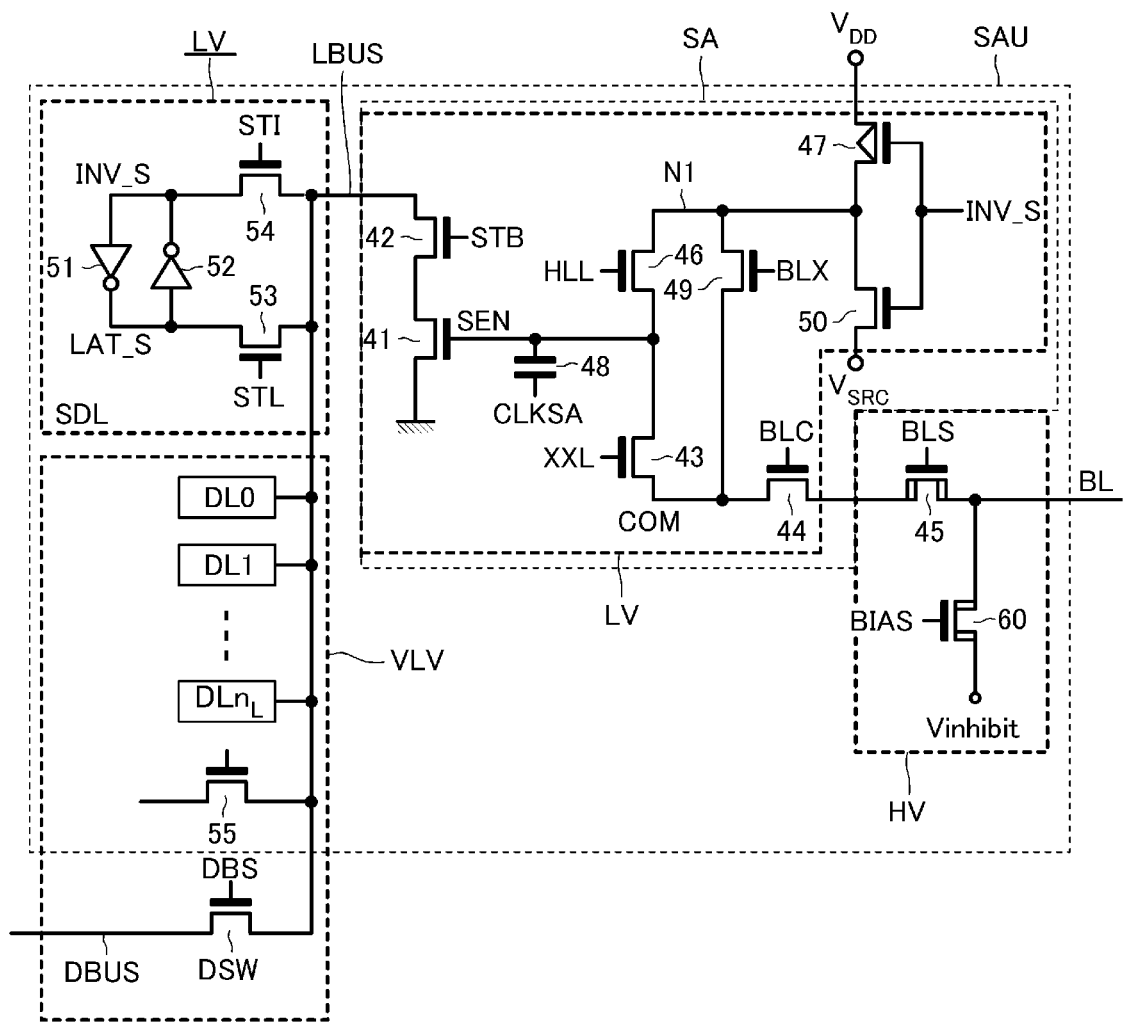
FIG. 30 is a schematic circuit diagram illustrating types of transistors forming the sense amplifier unit according to the comparative example.

For example, FIG. 30 is a schematic circuit diagram illustrating types of transistors forming the sense amplifier unit SAU according to the comparative example. As illustrated in FIG. the latch circuit SDL is configured with the low voltage transistors $Tr_{NL}$ and $Tr_{PL}$ (FIGS. 14 and 15). The latch circuits DL0 to $DLn_L$ other than the latch circuit SDL are configured with the ultra-low voltage transistors $Tr_{NVL}$ and $Tr_{PVL}$ (FIGS. 16 and 17). The sense amplifier circuit SA is configured with the low voltage transistors $Tr_{NL}$ and $Tr_{PL}$ (FIGS. 14 and 15). The high breakdown voltage transistor 45 and the high breakdown voltage transistor 60 are configured with the high voltage transistors $Tr_{NH}$ and $Tr_{PH}$ (FIGS. 12 and 13).

Reducing an area of the peripheral circuit PC is desirable. In particular, the number of sense amplifier units SAU is very large because the sense amplifier units SAU are provided corresponding to bit lines BL. Since an area occupied by many sense amplifier units SAU is large, when the area of the sense amplifier unit SAU can be reduced even a little, the area of the sense amplifier module SAM can also be reduced.

Therefore, in the present embodiment, in the program operation for the drain-side select gate line SGD, as described with reference to FIGS. 21 and 22, the voltage Vinhibit from the voltage generation circuit VG is supplied to the non-selected bit line $BL_P$ via the high breakdown voltage transistor 60. Further, as described with reference to FIGS. 25 and 26, the voltage $V_{SRC}$ is supplied to the selected bit line $BL_W$ via the clamp transistor 44 and the non-selected bit line $BL_P$ cuts off the clamp transistor 44, in such a manner that a relatively high voltage is maintained. According to such a method, since it is not necessary to supply a relatively high voltage to the gate electrode of the charging transistor 47, the latch circuit SDL of the sense amplifier unit SAU can be configured with the ultra-low voltage transistors $Tr_{NVL}$ and $Tr_{PVL}$ (FIGS. 16 and 17). Therefore, the area of the sense amplifier unit SAU can be reduced.

Figure 31:
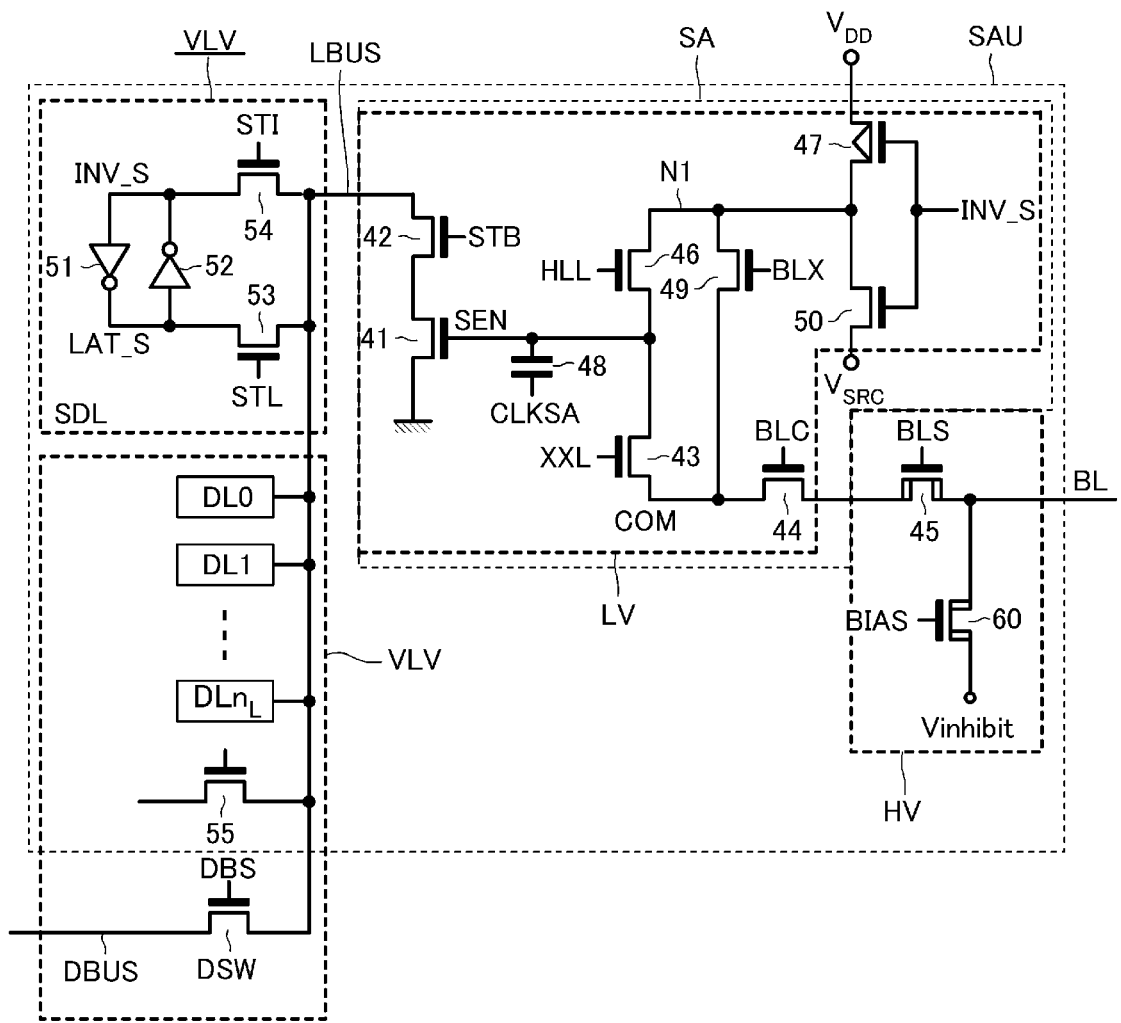
FIG. 31 is a schematic circuit diagram illustrating types of transistors forming the sense amplifier unit according to the first embodiment.

For example, FIG. 31 is a schematic circuit diagram illustrating types of transistors forming the sense amplifier unit SAU according to the first embodiment. As illustrated in FIG. 31, the latch circuit SDL is configured with the ultra-low voltage transistors $Tr_{NVL}$ and $Tr_{PVL}$ (FIGS. 16 and 17). The latch circuits DL0 to $DLn_L$ other than the latch circuit SDL are also configured with the ultra-low voltage transistors $Tr_{NVL}$ and $Tr_{PVL}$. The sense amplifier circuit SA is configured with the low voltage transistors $Tr_{NL}$ and $Tr_{PL}$ (FIGS. 14 and 15). The high breakdown voltage transistor 45 and the high breakdown voltage transistor 60 are configured with the high voltage transistors $Tr_{NH}$ and $Tr_{PH}$ (FIGS. 12 and 13). The configuration of the transistor illustrated in FIG. 31 is an example, and the configuration is not limited to such a configuration.

In addition, in the first embodiment, the non-selected bit line $BL_P$ is in the floating state in the program operation for the drain-side select transistor. Therefore, for example, when the selected bit line $BL_W$ and the non-selected bit line $BL_P$ in the floating state are adjacent to each other in the X direction, the voltage of the non-selected bit line $BL_P$ may drop due to capacitive coupling with the selected bit line $BL_W$. Therefore, in the first embodiment, as described with reference to FIG. 21, when executing the program operation on the drain-side select transistor corresponding to one of the bit line BL_O and the bit line BL_E, the other is supplied with a fixed voltage and used as a shield. According to such a method, it is possible to prevent fluctuations in the voltage of the non-selected bit line $BL_P$, suitably maintain the cut-off state of the clamp transistor 44, and prevent erroneous write.

Second Embodiment

In a program operation for a drain-side select gate line SGD according to a second embodiment, the program operation (FIG. 20: first embodiment) is executed with the even-numbered bit line BL_E as the selected bit line $BL_W$ and the non-selected bit line $BL_P$, and the program operation is executed with the odd-numbered bit line BL_O as the selected bit line $BL_W$ and the non-selected bit line $BL_P$, and then a verification operation is executed.

Figure 32:
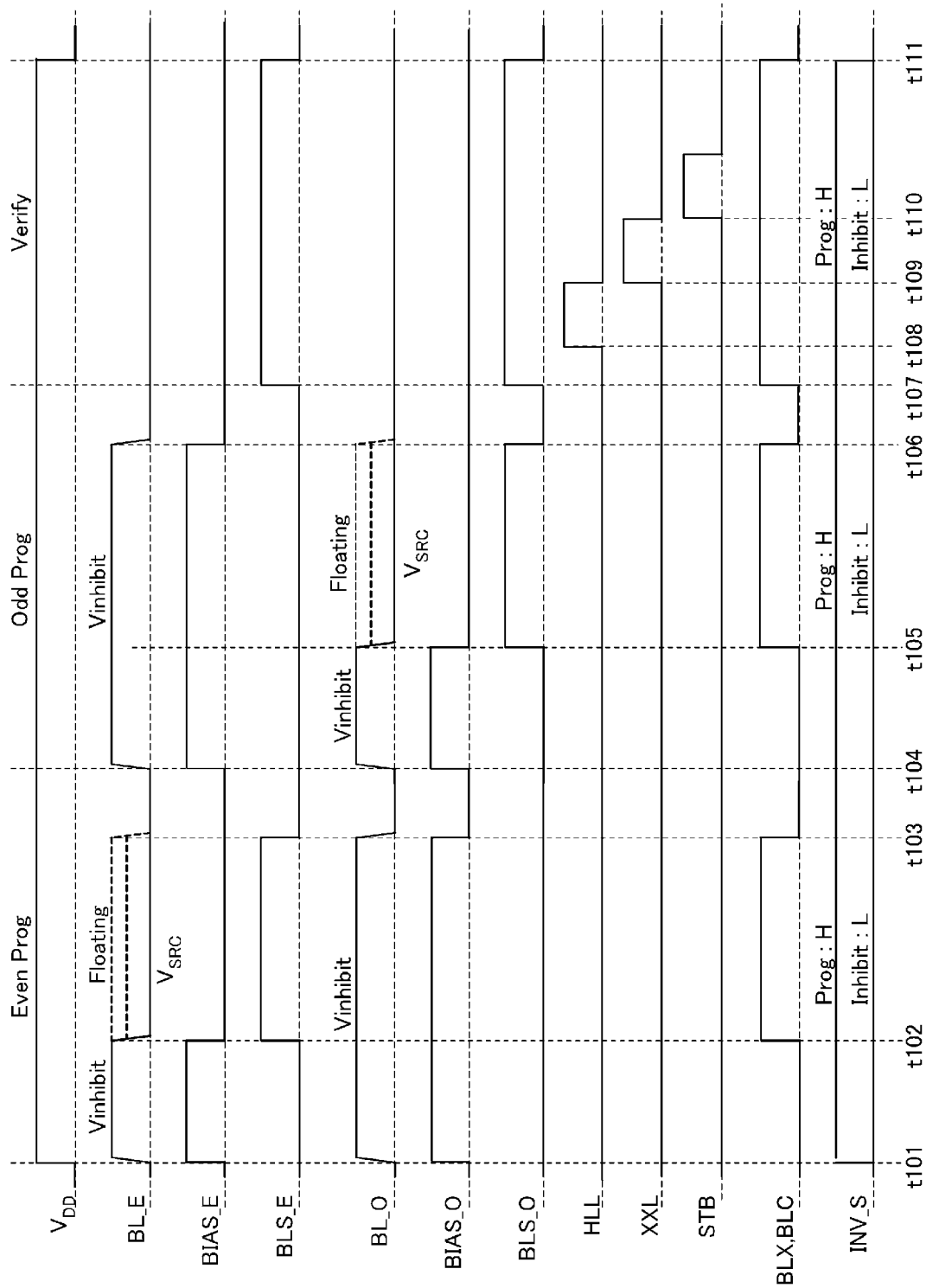
FIG. 32 is a schematic waveform diagram for illustrating a program operation and a verification operation for a drain-side select gate line according to a second embodiment.

FIG. 32 is a schematic waveform diagram for illustrating the program operation and a verification operation for the drain-side select gate line SGD according to the second embodiment. An operation (Even Prog) at timings t101 to t103 in FIG. 32 is the same as the operation at the timings t101 to t103 in FIG. 20. Therefore, redundant description is omitted.

An operation (Odd Prog) at timings t104 to t106 in FIG. 32 is an operation in which "Even" and "Odd" are interchanged in the operation at the timings t101 to t103 in FIG. 20. That is, in the operation at the timings t101 to t103 in FIG. 20, the bit line BLm-3 (BL_E) is set as the selected bit line $BL_W$, the bit line BLm-1 (BL_E) is set as the non-selected bit line $BL_P$, and the bit lines BLm-4 and BLm-2 (BL_O) are set as shields. On the other hand, in the operation at the timings t104 to t106 in FIG. 32, the bit line BLm-2 (BL_O) is set as the selected bit line $BL_W$, the bit line BLm-4 (BL_O) is set as the non-selected bit line BL P , and the bit lines BLm-3 and BLm-1 (BL_E) are set as shields (FIG. 19).

An operation at the timings t107 to t111 in FIG. 32 is the verification operation. At the timing t107, by changing the signal line BLS_E corresponding to the selected bit line $BL_W$ (BLm-3) from the "L" level to the "H" level, the high breakdown voltage transistor 45 goes into the ON state. In addition, the high breakdown voltage transistor 45 goes into the ON state by changing the signal line BLS_O corresponding to the selected bit line $BL_W$ (BLm-2) from the "L" level to the "H" level.

Although illustration is omitted, a verification voltage is supplied to the drain-side select gate line SGD during the timings t107 to t110 in FIG. 32. The verification voltage is a voltage for confirming whether the threshold voltage of the drain-side select gate line SGD reaches the target value. The verification voltage may be, for example, a voltage as large as the voltage Vsg (FIG. 20) or a voltage as large as the voltage $V_{SGD}$ (FIG. 18). The verification voltage is at least greater than the ground voltage Vss and the voltage $V_{SRC}$ and less than the program voltage Vsg_grog (FIG. 20).

At the timing t107, by changing the signal lines BLX and BLC corresponding to the selected bit line $BL_W$ (BLm-3 and BLm-2) from the "L" level to the "H" level, the charging transistor 49 and the clamp transistor 44 go into the ON state. In this case, since "L" is latched in the latch circuit SDL and the node INV_S is at "H", the voltage $V_{DD}$ is supplied to the selected bit line $BL_W$ for charging.

At the timing t108, by changing the signal line HLL corresponding to the selected bit line $BL_W$ (BLm-3 and BLm-2) from the "L" level to the "H" level, the charging transistor 46 goes into the ON state. In this case, the voltage $V_{DD}$ and the sense node SEN are electrically connected, and charge from voltage $V_{DD}$ is accumulated in the sense node SEN.

At the timing t109, by changing the signal line XXL corresponding to the selected bit line $BL_W$ (BLm-3 and BLm-2) from the "L" level to the "H" level, the discharging transistor 43 goes into the ON state. In this case, the sense node SEN and the selected bit line $BL_W$ are electrically connected. The sense transistor 41 goes into the ON state or the OFF state depending on whether the charge accumulated in the sense node SEN flows to the selected bit line $BL_W$, and the ON state/OFF state of the drain-side select transistor STD connected to the selected bit line $BL_W$ is determined.

Further, at the timing t110, by changing the signal line STB corresponding to the selected bit line $BL_W$ (BLm-3 and BLm-2) from the "L" level to the "H" level, the switch transistor 42 goes into the ON state. The charge in the wiring LBUS is discharged depending on whether the sense transistor 41 is in the ON state. Then, the state of the wiring LBUS is set in the latch circuit SDL.

According to such a method, after the program operation for the even-numbered selected bit line $BL_W$ and the program operation for the odd-numbered selected bit line $BL_W$ are completed, the verification operation for those selected bit lines $BL_W$ can be collectively performed. As a result, the program operation and the verification operation can be made more efficient.

Third Embodiment

Figure 33:
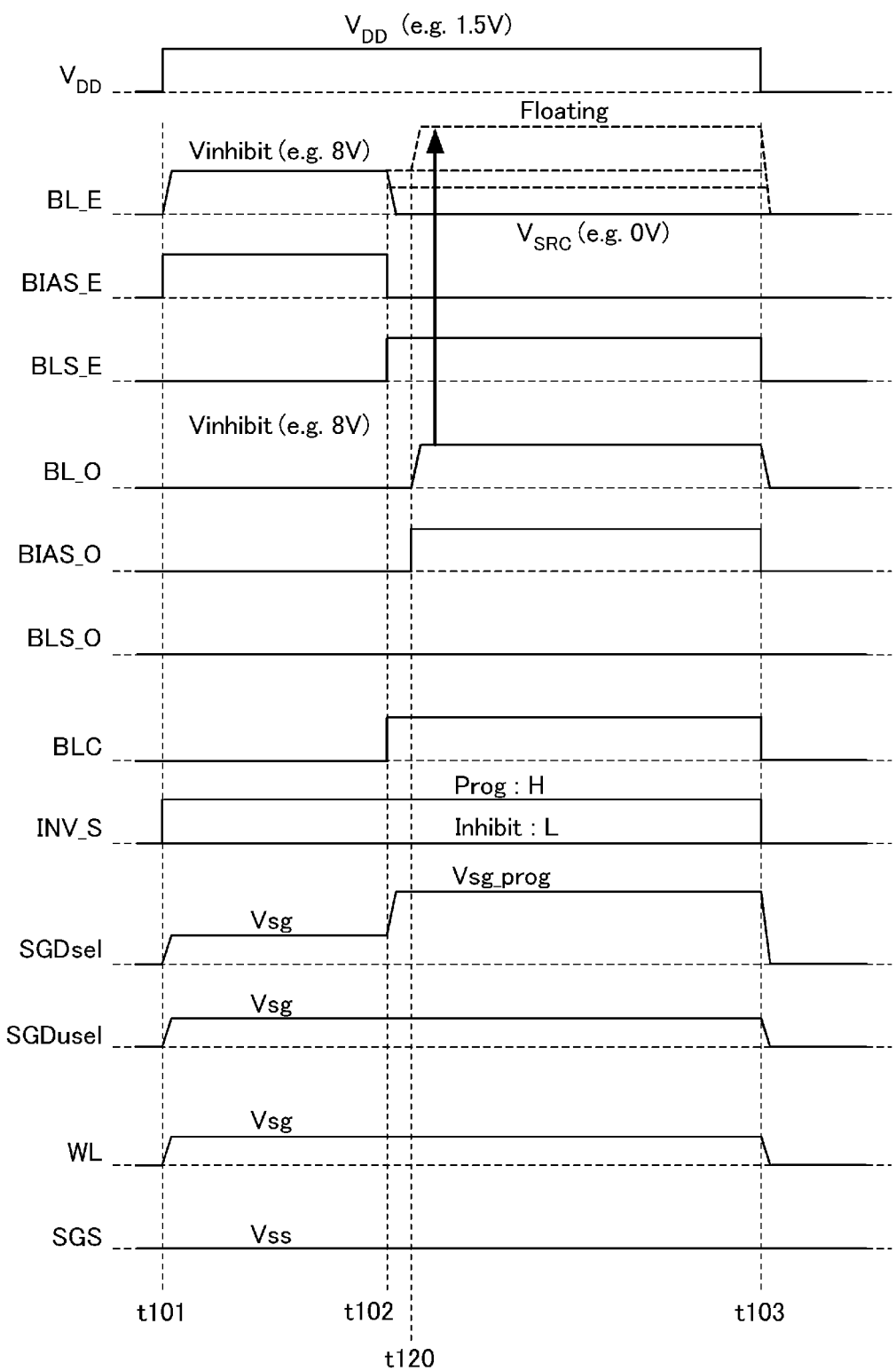
FIG. 33 is a schematic waveform diagram for illustrating a program operation for a drain-side select gate line according to a third embodiment.

FIG. 33 is a schematic waveform diagram for illustrating a program operation for a drain-side select gate line SGD according to a third embodiment. In the first embodiment described above, by changing the signal line BIAS_O from the "L" level to the "H" level at the timing t101 in FIG. 20, the voltage Vinhibit from the voltage generation circuit VG is supplied to the bit line BL_O to raise the voltage of the bit line BL_O to the voltage Vinhibit. In contrast, in the third embodiment, by changing the signal line BIAS_O from the "L" level to the "H" level at a timing t120 after the timing t102, the voltage Vinhibit from the voltage generation circuit VG is supplied to the bit line BL_O to raise the voltage of the bit line BL_O to the voltage Vinhibit. As a result, the voltage of the bit line BL_E (BLm-1) in the floating state rises due to capacitive coupling with the bit line BL_O. The operation at the timings t101 to t103 in FIG. 33 is the same as the operation at the timings t101 to t103 in FIG. 20, so redundant description will be omitted.

According to such a method, since the voltage of the bit line BL_E (BLm-1) in the floating state can be raised, erroneous write can be more reliably prevented by raising the channel voltage of the drain-side select transistor STD connected to the non-selected bit line BL P .

Other Embodiments

Hereinbefore, the semiconductor storage devices according to the embodiments are described above. However, the above descriptions are merely examples, and the configuration, method, and the like described above may be adjusted as appropriate.

For example, in the second embodiment, after the program operation for the even-numbered bit line BL_E is executed, the program operation for the odd-numbered bit line BL_O is executed. However, after the program operation for the odd-numbered bit line BL_O is executed, the program operation for the even-numbered bit line BL_E may be executed.

In addition, in the first to third embodiments, the sequencer SQC simultaneously switches the ON state/OFF state of the transistor by switching signals to a plurality of signal lines at the timing t101 to the timing t111. However, the sequencer SQC may switch the ON state/OFF state of the transistor at different timings by switching the signals to the plurality of signal lines at different timings. For example, the timing at which the high breakdown voltage transistor 60 switches from the ON state to the OFF state may be shifted from the timing at which the high breakdown voltage transistor 45 switches from the OFF state to the ON state.

In each of the embodiments described above, a NAND flash memory with a three-dimensional structure is illustrated, and the embodiments of the present disclosure can also be applied to a NAND flash memory that does not have a three-dimensional structure.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a first memory string that includes a first select transistor and a plurality of first memory cell transistors connected in series;
   a first bit line that is connected to the first memory string;
   a select gate line that is connected to a gate electrode of the first select transistor;
   a plurality of word lines that are respectively connected to gate electrodes of the plurality of first memory cell transistors;
   a first sense amplifier unit that is connected to the first bit line;
   a control circuit configured to execute a program operation; and
   a voltage generation circuit configured to generate a voltage, wherein
   the first sense amplifier unit includes:
      a first sense amplifier circuit,
      a first transistor having a first end connected to the first bit line and a second end connected to the first sense amplifier circuit, and
      a second transistor having a first end connected to a node between the first end of the first transistor and the first bit line and a second end connected to the voltage generation circuit,
   in a first period of the program operation carried out on the select transistors connected to the select gate line,
      in a state where a voltage for causing the first transistor to be in an OFF state is supplied to a gate electrode of the first transistor and a voltage for causing the second transistor to be in an ON state is supplied to a gate electrode of the second transistor, a voltage of the first bit line is set as a first voltage and a voltage of the select gate line is set as a second voltage, and
   in a second period of the program operation carried out on the select transistors connected to the select gate line, that is after the first period,
      in a state where a voltage for causing the first transistor to be in an ON state is supplied to the gate electrode of the first transistor and a voltage for causing the second transistor to be in an OFF state is supplied to the gate electrode of the second transistor, a voltage of the first bit line is set as a third voltage that is less than the first voltage and a voltage of the select gate line is set as a fourth voltage that is greater than the second voltage.

2. The semiconductor storage device according to claim 1, wherein
   the first sense amplifier circuit includes:
      a first sense transistor that includes a gate electrode electrically connected to the first bit line via the first transistor,
      a first clamp transistor that is provided in a current path between the first sense transistor and the first transistor,
      a first switch transistor that is provided in a current path between the first sense transistor and the first clamp transistor, and
      a first inverter circuit that includes an output terminal electrically connected to a current path between the first clamp transistor and the first switch transistor, and
   the first sense amplifier unit includes a first latch circuit, which includes:
      second inverter circuit that includes an output terminal connected to an input terminal of the first inverter circuit,
      a third inverter circuit that includes an output terminal connected to an input terminal of the second inverter circuit, and an input terminal connected to an output terminal of the second inverter circuit, and
      a transistor having at least one of a gate oxide film thickness, a gate length, and an impurity concentration in a well region that is smaller than that of at least one of the first sense transistor, the first clamp transistor, and the first switch transistor.

3. The semiconductor storage device according to claim 1, comprising
   a second memory string that includes a second select transistor and a plurality of second memory cell transistors connected in series;
   a third memory string that includes a third select transistor and a plurality of third memory cell transistors connected in series;
   a second bit line that is connected to the second memory string;
   a third bit line that is connected to the third memory string;
   a second sense amplifier unit that is connected to the second bit line; and
   a third sense amplifier unit that is connected to the third bit line, wherein
   the select gate line is connected to a gate electrode of the second select transistor and a gate electrode of the third select transistor,
   the plurality of word lines are respectively connected to gate electrodes of the plurality of second memory cell transistors and to gate electrodes of the plurality of third memory cell transistors,
   the first bit line is provided between the second bit line and the third bit line,
   the second sense amplifier unit includes:
      a second sense amplifier circuit,
      a third transistor having a first end connected to the second bit line and a second end connected to the second sense amplifier circuit, and
      a fourth transistor having a first end connected to a node between the first end of the third transistor and the second bit line and a second end connected to the voltage generation circuit,
   the third sense amplifier unit includes:
      a third sense amplifier circuit,
      a fifth transistor having a first end connected to the third bit line and a second end connected to the third sense amplifier circuit, and
      a sixth transistor having a first end connected to a node between the first end of the fifth transistor and the third bit line and a second end connected to the voltage generation circuit, in the first period and the second period,
in a state where a voltage for causing the third transistor to be in an OFF state is supplied to a gate electrode of the third transistor and a voltage for causing the fourth transistor to be in an ON state is supplied to a gate electrode of the fourth transistor, a voltage of the second bit line is set as the first voltage, and
in a state where a voltage for causing the fifth transistor to be in an OFF state is supplied to a gate electrode of the fifth transistor and a voltage for causing the sixth transistor to be in an ON state is supplied to a gate electrode of the sixth transistor, a voltage of the third bit line is set as the first voltage.

4. The semiconductor storage device according to claim 3, wherein
in a third period of the program operation carried out on the select transistors connected to the select gate line, that is after the second period,
in a state where a voltage for causing the first transistor to be in the OFF state is supplied to the gate electrode of the first transistor and a voltage for causing the second transistor to be in the ON state is supplied to the gate electrode of the second transistor, the voltage of the first bit line is set as the first voltage,
in a state where a voltage for causing the third transistor to be in the OFF state is supplied to the gate electrode of the third transistor and a voltage for causing the fourth transistor to be in the ON state is supplied to the gate electrode of the fourth transistor, the voltage of the second bit line is set as the first voltage, and
the second voltage is supplied to the select gate line, and
in a fourth period of the program operation carried out on the select transistors connected to the select gate line, that is after the third period,
in a state where a voltage for causing the first transistor to be in the OFF state is supplied to the gate electrode of the first transistor and a voltage for causing the second transistor to be in the ON state is supplied to the gate electrode of the second transistor, the voltage of the first bit line is set as the first voltage,
in a state where a voltage for causing the third transistor to be in the ON state is supplied to the gate electrode of the third transistor and a voltage for causing the fourth transistor to be in the OFF state is supplied to the gate electrode of the fourth transistor, the voltage of the second bit line is set as the third voltage, and
the fourth voltage is supplied to the select gate line.

5. The semiconductor storage device according to claim 4, wherein
the first sense amplifier circuit includes:
a first sense transistor that includes a gate electrode electrically connected to the first bit line via the first transistor, and
a first switch transistor that is provided in a current path between the first sense transistor and the first transistor,
the second sense amplifier circuit includes:
a second sense transistor that includes a gate electrode electrically connected to the second bit line via the third transistor, and
a second switch transistor that is provided in a current path between the second sense transistor and the second transistor,
the third sense amplifier circuit includes:
a third sense transistor that includes a gate electrode electrically connected to the third bit line via the fifth transistor, and
a third switch transistor that is provided in a current path between the third sense transistor and the third transistor, and
in a fifth period of the program operation carried out on the select transistors connected to the select gate line, that is after the fourth period,
a verification voltage less than the fourth voltage is supplied to the select gate line, and
voltages for causing the first switch transistor, the second switch transistor, and the third switch transistor to be in ON states are respectively supplied to a gate electrode of the first switch transistor, a gate electrode of the second switch transistor, and a gate electrode of the third switch transistor.

6. The semiconductor storage device according to claim 4, wherein
in the third period, the voltage of the third bit line is set as the first voltage, and
in the second period, the voltage of the third bit line is greater than the third voltage.

7. The semiconductor storage device according to claim 4, wherein
after end of the third period and before start of the fourth period, a voltage of the gate electrode of the third transistor is switched from a voltage for causing the third transistor to be in the OFF state to a voltage for causing the third transistor to be in the ON state.

8. The semiconductor storage device according to claim 3, comprising:
a fourth memory string that includes a fourth select transistor and a plurality of fourth memory cell transistors connected in series;
a fourth bit line that is connected to the fourth memory string; and
a fourth sense amplifier unit that is connected to the fourth bit line, wherein
the select gate line is connected to a gate electrode of the fourth select transistor,
the plurality of word lines are respectively connected to gate electrodes of the plurality of fourth memory cell transistors,
the second bit line or the third bit line is provided between the first bit line and the fourth bit line,
the fourth sense amplifier unit includes:
a fourth sense amplifier circuit,
a seventh transistor having a gate electrode in common with the first transistor, a first end connected to the fourth bit line and a second end connected to the fourth sense amplifier circuit, and
an eighth transistor having a gate electrode in common with the second transistor, a first end connected to a node between the first end of the seventh transistor and the fourth bit line and a second end connected to the voltage generation circuit,
in the first period, a voltage of the fourth bit line is set as the first voltage, and
in the second period, a voltage of the fourth bit line is greater than the third voltage.

9. The semiconductor storage device according to claim 8, wherein
each of the first, second, third, and fourth sense amplifier units includes a latch circuit, and
during the second period, a voltage that is supplied to the second end of the first transistor is lower than a voltage supplied to the second end of the seventh transistor, and data stored in the latch circuit of the first sense amplifier unit has a first value, which is low or high, that is different from a second value of data stored in the latch circuit of the fourth sense amplifier unit.

10. The semiconductor storage device according to claim 9, wherein
in the second period, the voltage of the fourth bit line is greater than the first voltage.

11. The semiconductor storage device according to claim 1, wherein
after end of the first period and before start of the second period, a voltage of the gate electrode of the first transistor is switched from a voltage for causing the first transistor to be in the OFF state to a voltage for causing the first transistor to be in the ON state.

12. A program operation method for a first select transistor, a second select transistor, and a third select transistor, in a semiconductor storage device including a first memory string that includes the first select transistor and a plurality of first memory cell transistors connected in series, a second memory string that includes the second select transistor and a plurality of second memory cell transistors connected in series, a third memory string that includes the third select transistor and a plurality of third memory cell transistors connected in series, a first bit line, a second bit line, and a third bit line respectively connected to the first memory string, the second memory string, and the third memory string, a first sense amplifier circuit, a second sense amplifier circuit, and a third sense amplifier circuit respectively connected to the first bit line, the second bit line, and the third bit line, and a select gate line connected in common to gate electrodes of the first select transistor, the second select transistor, and the third select transistor, wherein the first bit line is provided between the second bit line and the third bit line, said program operation method comprising:
in a first period, supplying a first voltage to the first bit line, the second bit line, and the third bit line, through a first voltage supply line, and a second voltage to the select gate line,
in a second period after the first period, supplying a third voltage less than the first voltage to the first bit line through a second voltage supply line connected to the first sense amplifier circuit, the first voltage to the second bit line and the third bit line via the first voltage supply line, and a fourth voltage greater than the second voltage to the select gate line.

13. The program operation method according to claim 12, wherein
the first, second, and third sense amplifier circuits are connected to the first, second, and third bit lines via first, second, and third transistors, respectively, and are each connected to the first voltage supply line via fourth, fifth, and sixth transistors, respectively,
in the first period, each of the first, second, and third transistors is turned OFF and each of the fourth, fifth, and sixth transistors is turned ON, and
in the second period, each of the first, fifth, and sixth transistors is turned ON and each of the second, third, and fourth transistors is turned OFF.

14. The program operation method according to claim 13, wherein
in a third period after the second period, each of the first, second, and third transistors is turned OFF and each of the fourth, fifth, and sixth transistors is turned ON, and
in a fourth period after the third period, each of the first, fifth, and sixth transistors is turned OFF and each of the second, third, and fourth transistors is turned ON.

15. The program operation method according to claim 14, wherein
the semiconductor storage device further includes first, second, and third latch circuits corresponding to first, second, and third sense amplifier circuits, respectively,
during the second period, the third voltage is supplied to the first bit line as a result of data having a first value, which is low or high, being stored in the first latch circuit, and
during the fourth period, the third voltage is supplied to the second bit line if the data stored in the second latch circuit has the first value and to the third bit line if the data stored in the third latch circuit has the first value, and the second bit line and the third bit line are placed in an electrically floating state if the data stored in their respective one of the second and third latch circuits has a second value that is different from the first value.

16. The program operation method according to claim 13, further comprising:
after end of the first period and before start of the second period, switching a voltage applied to the gate electrode of the first transistor from one that causes the first transistor to be in the OFF state to another that causes the first transistor to be in the ON state.

17. A semiconductor storage device, comprising:
a first memory string that includes a first select transistor and a plurality of first memory cell transistors connected in series;
a second memory string that includes a second select transistor and a plurality of second memory cell transistors connected in series;
a third memory string that includes a third select transistor and a plurality of third memory cell transistors connected in series;
a fourth memory string that includes a fourth select transistor and a plurality of fourth memory cell transistors connected in series;
a first bit line, a second bit line, a third bit line, and a fourth bit line respectively connected to the first memory string, the second memory string, the third memory string, and the fourth memory string;
a first sense amplifier unit, a second sense amplifier unit, a third sense amplifier unit, and a fourth sense amplifier unit respectively connected to the first bit line, the second bit line, the third bit line, and the fourth bit line;
a plurality of signal lines connected to the first sense amplifier unit, the second sense amplifier unit, the third sense amplifier unit, and the fourth sense amplifier unit; and
a voltage generation circuit configured to generate a voltage, wherein
the first bit line is provided between the second bit line and the third bit line, and the second bit line or the third bit line is provided between the first bit line and the fourth bit line,
each of the first sense amplifier unit, the second sense amplifier unit, the third sense amplifier unit, and the fourth sense amplifier unit includes:
a sense amplifier circuit,
a first transistor having a first end connected to a corresponding one of the first bit line, the second bit line, the third bit line, and the fourth bit line and a second end connected to the sense amplifier circuit, and a second transistor having a first end connected to the first end of the first transistor and a second end connected to the voltage generation circuit, and the plurality of signal lines includes:
- a first signal line that electrically connects a gate electrode of the first transistor in the first sense amplifier unit to a gate electrode of the first transistor in the fourth sense amplifier unit,
- a second signal line that electrically connects a gate electrode of the first transistor in the second sense amplifier unit to a gate electrode of the first transistor in the third sense amplifier unit,
- a third signal line that electrically connects a gate electrode of the second transistor in the first sense amplifier unit to a gate electrode of the second transistor in the fourth sense amplifier unit, and
- a fourth signal line that electrically connects a gate electrode of the second transistor in the second sense amplifier unit to a gate electrode of the second transistor in the third sense amplifier unit.

18. The semiconductor storage device according to claim 17, further comprising a control circuit that independently controls voltages supplied to the first signal line and the second signal line, and independently controls voltages supplied to the third signal line and the fourth signal line.

19. The semiconductor storage device according to claim 18, wherein the voltage generation circuit supplies a first power supply voltage to the first, second, third, and fourth sense amplifier circuits, and a second power supply voltage that is larger than the first power supply voltage to the second end of the second transistor in each of the first, second, third, and fourth sense amplifier units.

20. The semiconductor storage device according to claim 17, wherein
- each of the first, second, third, and fourth sense amplifier units includes a latch circuit, and
- during program operation carried out on each of the first, second, third, and fourth select transistors, a low voltage is supplied to the second end of the first transistor when data stored in the latch circuit has a first value, which is low or high, and a high voltage is supplied to the second end of the first transistor when data stored in the latch circuit has a second value that is different from the first value.

* * * * *